(12) United States Patent
Valicek et al.

(10) Patent No.: US 9,073,175 B2
(45) Date of Patent: Jul. 7, 2015

(54) METHOD FOR THE DESIGN OF A TECHNOLOGY FOR THE ABRASIVE WATERJET CUTTING OF MATERIALS

(75) Inventors: Jan Valicek, Bystrice pod Lopenikem (CZ); Alois Borovicka, Partizanske (SK); Sergej Hloch, Presov (SK); Petr Hlavacek, Polesovice (CZ)

(73) Assignee: INSTITUTE OF GEONICS AS CR, V.V.I., Ostrava (CZ)

(*) Notice: Subject to any disclaimer, the term of this patent is extended or adjusted under 35 U.S.C. 154(b) by 654 days.

(21) Appl. No.: 13/177,439

(22) Filed: Jul. 6, 2011

(65) Prior Publication Data

US 2012/0022839 A1 Jan. 26, 2012

(30) Foreign Application Priority Data

Jul. 23, 2010 (CZ) .................... PV 2010-571

(51) Int. Cl.
| | |
|---|---|
| G06G 7/48 | (2006.01) |
| G06G 7/56 | (2006.01) |
| B24C 1/04 | (2006.01) |
| G06F 17/50 | (2006.01) |
| G06F 17/13 | (2006.01) |

(52) U.S. Cl.
CPC ............. *B24C 1/045* (2013.01); *G06F 17/50* (2013.01); *G06F 17/13* (2013.01); *G06F 17/5009* (2013.01)

(58) Field of Classification Search
CPC ........ G06F 17/5009; G06F 17/50; G06F 17/13
USPC .......................................................... 703/2, 5
See application file for complete search history.

(56) References Cited

U.S. PATENT DOCUMENTS 6,120,351 A * 9/2000 Zeng ............................... 451/28

OTHER PUBLICATIONS

Andreas W. Momber, NPL, "Principles of Abrasive Water Jet Machining", 1998.*
A. W. Momber, NPL, "Test parameter analysis in abrasive water jet cutting of rocklike materials", 1997.*

* cited by examiner

*Primary Examiner* — Omar Fernandez Rivas
*Assistant Examiner* — Angel Calle
(74) *Attorney, Agent, or Firm* — Notaro, Michalos & Zaccaria P.C.

(57) ABSTRACT

Method for abrasive waterjet cutting of materials determines a constant of cuttability using an abrasive waterjet Kawj, according to version A, where three deformation parameters are measured on a test cut/sample, version B, where two deformation parameters are measured, version C where one parameter is measured, or a version D where the design is carried out by calculating Kawj according to Young's modulus or according to an ultrasonic wave speed of the cut material. This constant is subsequently input to an algorithm. The result of a calculation using the algorithm acquires sufficient numerical and graphical data to an optimum setting of parameters and are generally valid for all engineering materials, and further of data on cut quality, limit depth of cuts and economical parameters, and also on mechanical properties of the cut material with regard to classification of the material into cuttability class.

2 Claims, 10 Drawing Sheets

Figure 1:
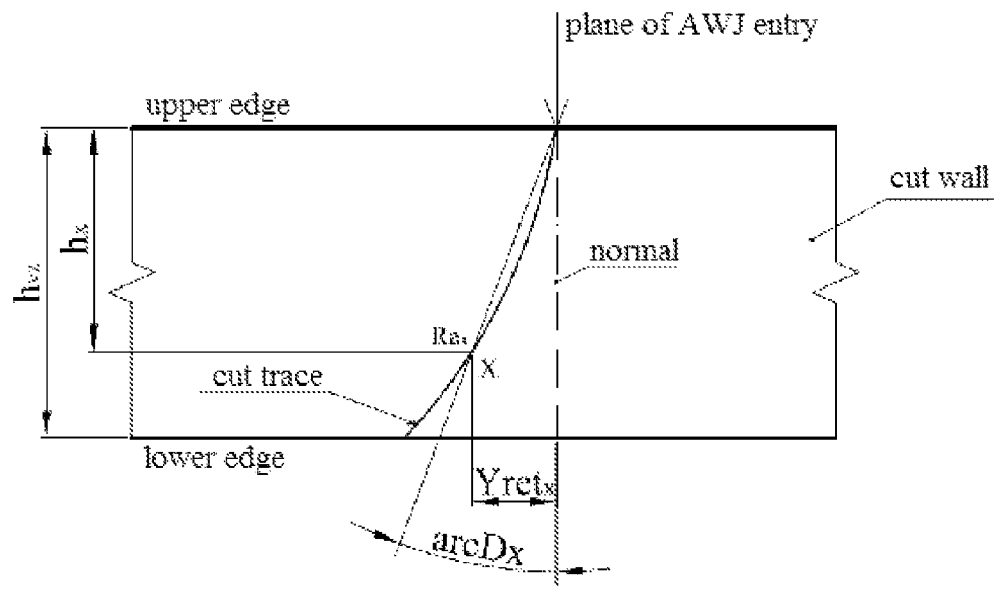

METHOD FOR THE DESIGN OF A TECHNOLOGY FOR THE ABRASIVE WATERJET CUTTING OF MATERIALS

TECHNICAL FIELD

The subject matter of the invention applies to a method for the design of technology parameters for the abrasive waterjet cutting of materials.

THE STATE OF THE ART

The existing methods of designing the main technology parameters of a technological procedure for the abrasive waterjet cutting of materials are based merely on subjective experience of technologists. For this technology, any exact calculation method easily and quickly applicable to practice has not been developed yet. As technological tools some programs are already available; however being based neither on the specifically measured technology parameters of cuttability of a material being just machined using the abrasive waterjet, nor on the technical condition of the system being just used, they are only of a general indicative nature. They concern a very limited number of technology parameters and deal with the technological properties of the cut material insufficiently. And even proper mechanical properties of each material, which enter into technological calculations, exhibit such significant differences that tabular values of these parameters should be regarded as indicative as well. Of theoretical solutions, it is calculations according to Hashish (HASHISH, M. Prediction models for AWJ machining operation. In 7th American Water Jet Conference, 1993, p. 205-216. ISBN 1-880342-02-2.), Zeng (ZENG, J., KIM, T. Parameter prediction and cost analysis in abrasive waterjet cutting operations, In 7th American Water Jet Conference, 1993, p. 175-189. ISBN 1-880342-02-2.), Wang (WANG, J. A new model for predicting the depth of cut in abrasive waterjet contouring of alumina ceramics. *Journal of materials processing technology*, 2009, p. 2314-2320. ISSN 0924-0136) that fulfil best the practical requirements of technologists. These solutions are however difficult to apply to practice, because they require many theoretical, in practice not measurable preconditions and constants, and moreover, they are applicable only to specific groups of materials and do not hold true generally for the whole range of engineering materials. In practice the optimum technology parameters of an abrasive waterjet cutting system are then subjectively estimated by the technologist according to the achieved depth of cut and the visual condition of cut wall surface of the sample; especially different traverse speeds of cutting head, pump pressure, abrasive mass flow rate, abrasive size and kind being tested or estimated.

Major shortcomings of the present-day state are a test method not developed yet, which could be used in unambiguous testing the cut material for the basic technology property of the cut material, i.e. the cuttability of the material using an abrasive waterjet, in advance, further a method not developed yet, which could be used in practice and research for the determination of optimum technology parameters (traverse speed of the cutting head, pump pressure, amount, size and kind of abrasive material, and others) according to the pre-determined cuttability of a specific material using an abrasive waterjet (AWJ), and on the basis of the above-presented causes a still missing uniform technological classification of engineering materials according to deformation parameters as well as according to optimum technology parameters, because for the creation of such classification, a proposal for a suitable generalizing criterion which would technically characterise unambiguously the cut material is still missing.

THE ESSENCE OF THE INVENTION

The shortcomings are removed by a solution that is the subject matter of this invention in the following way: for each material, the constant of cuttability of the material using an abrasive waterjet Kawj [µm] is determined in advance by measuring either: A) three deformation parameters of the sample of the material: selected cut depth $h_x$ [mm], local roughness $Ra_x$ [µm] at the depth $h_x$ and local deviation of the cut trace from the normal plane $Yret_x$ at the depth $h_x$ or B) merely two deformation parameters of the sample of the material, namely: reference depth $h_{et}$ [mm] and deviation of the cut trace from the normal plane $Yret_x$ [mm] at the reference depth $h_{et}$ [mm] in the cut done in the material at the optimum traverse speed $Vpopt_{et}$ [mm/min] for this material determined in advance or C) one parameter of the sample of the material, i.e. either the longitudinal ultrasonic wave speed $V_{LUZ}$ [m/s] or Young's modulus Emat [MPa], when the constant of cuttability of the material using an abrasive waterjet Kawj is calculated from relevant parameters or D) the constant is determined directly by calculation on the basis of knowledge of longitudinal ultrasonic wave speed $V_{LUZ}$ [m/s] or Young's modulus Emat for the cut material; the constant Kawj is subsequently put as input value to Algorithm 1 for the abrasive waterjet cutting technology (see Algorithm 1 at the end of this specification).

In the abrasive waterjet cutting technology Algorithm 1 is a new system of equations, which are connected with each other in such a way that the result of calculation is a comprehensive mathematical-physical model, which describes numerically as well as graphically the process of material cutting using an abrasive waterjet. By this Algorithm 1, basic optimized input discrete values for the setting of abrasive waterjet cutting technology (e.g. traverse speed of the cutting head for the given material Vpopt [mm/min], pump pressure Pv [MPa], abrasive mass flow rate $m_a$ [g/min]) can be obtained. The discrete values provided by Algorithm 1 are those that are obtained from the continuous behaviours of individual functions defined in the system of equations on a certain discrete space-time level. For the selection of discrete optimized technology parameters, the depth level of neutral plane $h_o$ for the given cut material is used as a basis, providing that in this plane of balanced stress state the optimum parameters of cutting can be determined. Then the technologist can compare these discrete data with discrete data from another selected level of depth $h_x$ different from $h_o$, e.g. at the maximum depth of cut required by the customer, and can thus derive labour intensity, performance and labour price. In addition to these discrete data, the calculation produces simultaneously graphical records of continuous course of cutting and changes in the main material and also technology parameters with time depending on the depth $h_x$ and on other input technology and material parameters (e.g. cut wall roughness $Ra_x=f(h_x, Vpopt, Pv, m_a, Yret_x, Emat)$, local deviation of the cut trace from the normal plane $Yret_x=f(h_x, Vpopt, Pv, m_a, Emat, Ra_x)$, $h_x=f(Vpopt, Pv, m_a, Yret_x, Emat, Ra_x)$). The submitted Algorithm 1 has general validity for all engineering materials.

The result of calculation according to Algorithm 1, after putting into the input value of Kawj determined by means of the above-presented methods A), B), C), D), is the very quick acquiring of, from the technological point of view, a sufficient number of numerical and graphical data on both the mechanical properties of cut material and engineering-technological and economical parameters of abrasive waterjet cutting. Technological calculation according to Algorithm 1 can be employed for the cutting of all engineering materials used in industries (e.g. non-ferrous metals and their alloys, steels, ceramics, wood, construction materials, rocks, leather, plastics, etc.), see classification of materials by kinds into classes of cuttability of them using an abrasive waterjet Tcut 1-6 in FIG. 5; according to the subject matter of the invention the condition that the strength of abrasive material SIGda is higher than that of cut material SIGdm is valid generally. For all the mentioned materials, after the determination of constants of cuttability of the materials using an abrasive waterjet Kawj [µm] as input parameter for Algorithm 1, discrete and time behaviour values, analogical to those given below in tables and in graphs constructed here for selected 6 materials presented in the framework of implementation of the invention, will be obtained by calculation.

Kawj [µm] is a new technology-length parameter that increases with the plasticity of the cut material, and that is determined either from three deformation parameters according to $Kawj = Ra_x * h_x / Yret_x$, [µm] or from deformation parameters according to $Emat_x = (10^24 * Yret_x / (Yret_{et} * Kawj_{et}^2))^0.25$, [MPa], $Kawj_x = 10^12 / Emat_x^2$, [µm] or from the longitudinal ultrasonic wave speed $V_{LUZ}$ [m/s] according to $Kawj_x = (10^4 / V_{LUZ})^6$, [µm] or from Young's modulus Emat of the cut material according to $Kawj_x = 10^12 / Emat^2$, [µm]. From the physical point of view, it is a complex parameter, connected with both mechanical properties and technology parameters. These relations are explicitly expressed by newly derived relations in Algorithm 1 for the abrasive waterjet cutting technology (Algorithm 1). This piece of data on the cut material is the sole and sufficient input parameter for new Algorithm 1 for the technology of abrasive waterjet cutting of materials. Other 11 input values (parameters) for Algorithm 1, which are already part of it, are parameters given technologically, constant (retardation of trace in the neutral plane $h_o$/theor. given const./$Yret_o$ [mm], roughness of trace in the neutral plane $h_o$/theor. given const./$Ra_o$ [µm], water density Rov [g/cm³], ratio of nozzle diameters Dvo/Dabro=Kdvdao [1]) and parameters chosen by the technologist, adjustable (total mass flow rate of AWJ Roj [g/cm³], abrasive density Roa [g/cm³], selected/required cut depth $h_x$ [mm], selected diameter of abrasive nozzle da [mm], diameter of abrasive grain dazr [mm], volume fraction of abrasive material in the AWJ stream lambda [1], price of electrical energy Ckwhod [CZK/kWh]—adjustable according to topical requirements). The selected parameters are then specified and optimized by calculation on the basis of the specifically identified constant of cuttability of materials using an abrasive waterjet Kawj [µm] so that the subjectively selected piece of data, e.g. ratio of diameters of nozzles Dv/Dabr Kdvdao=0.329 [1] pre-set by the manufacturer (Table 2, Table 3—line 8), will follow from the calculation as optimized parameter Kdvda in the framework of the whole cutting technology for the specific material, the cuttability of which is defined, according to the design, by the determined constant of cuttability of the material using an abrasive waterjet, and is given in Table 2, Table 3 in line 27 for materials presented here. Given and selected technology parameters entering into Algorithm 1 are specified in Table 5; there also specific values used for the example presented below are stated, but they can be used generally as auxiliary ones, because they are modified by re-calculation to the specified condition of cutting technology according to the determined value of Kawj. It follows from the above-mentioned facts that Algorithm 1 is generally valid for all engineering materials; in addition to the main input parameter Kawj, it is necessary to define only the parameters that are given and invariable, and thus are always input data: retardation of trace in the neutral plane $h_o$/theor. given const./$Yret_o$=1 [mm], roughness of trace in the neutral plane $h_o$/theor. given const./$Ra_o$=3.7 [µm], water density Rov=1 [g/cm³], total density of AWJ Roj [g/cm³], abrasive density Roa [g/cm³], selected/required cut depth $h_x$ [mm], selected diameter of abrasive nozzle da [mm], diameter of abrasive grain dazr [mm], volume fraction of abrasive in AWJ stream lambda [1], price of electrical energy Ckwhod [CZK/kWh], input ratio of nozzle diameters Dvo/Dabro=Kdvdao=0.329 [1]. The setting of technology according to the specific parameter Kawj of the cut material should respect, for the purpose of optimization of the whole technology, parameters specified by calculation, such as optimized ratio of nozzle diameters Dv/Dabr=Kdvda=f(dazr), where dazr is the optimized diameter of abrasive grain according to the input value of Kawj of the given material; Algorithm 1 will quantify it and will perform the final optimization of ratio Kdvda. The optimized diameter of grain dazr diminishes with increasing material strength. A technologist will set the ratio of nozzles for his/her material according to the specified/optimized calculation of Dv/Dabr=Kdvda=f(dazr).

An important analytical factor is the determination of geometric parameters and position of equilibrium/neutral plane ($Ra_o$, $h_o$) in the cut produced by abrasive waterjet cutting. Generally it is a case of the depth level in cuts, where tensile stresses and compressive stresses will be equalized. For $h<h_o$ the tensile stress predominates; surface roughness is relatively low. For $h>h_o$ the compressive stress increases and the roughness of cut surface grows. We have found that in the course of cutting using an abrasive waterjet tool, the tensile stress $\sigma_{tah}$ and the compressive stress $\sigma_{tlak}$ are always equalized at values of roughness $Ra_o$=3.7 µm and retardation $Yret_o \sim \sigma_{tah}/\sigma_{tlak}$=1 independently of the material, but at adequate depths of neutral plane $h_o$ that are different for different materials. Then the depth of neutral plane in the cut $h_o$ must be adequate to these values, and the equation of mechanical equilibrium at the depth level of neutral plane $h_o$ is defined as $Ra_o * h_o / Yret_o - Kawj_o = 0$, and at the general depth level $Ra_x * h_x / Yret_x - Kawj_x = 0$; $Kawj_o = Kawj_x = Kawj \sim 10^12 / Emat^2$ for the given material is a constant within the whole depth of cut, and the depth of neutral plane $h_o = Kawj/Ra_o$ [mm].

So prepared Algorithm 1 for the technology of abrasive waterjet cutting of materials, which generally applies to the methods A, B, C, D, is programmed into a programmable technology calculator or PC. Calculation will be performed after putting into a single searched input value of Kawj and other 11 given values–input parameters (retardation of trace in the neutral plane $h_o$/theor. given const./$Yret_o$ [mm], roughness of trace in the neutral plane $h_o$/theor. given const./$Ra_o$ [µm], water density Roy [g/cm³], total density of AWJ stream Roj [g/cm³], abrasive density Roa [g/cm³], selected/required depth of cut $h_x$ [mm], selected diameter of abrasive nozzle da [mm], diameter of abrasive grain dazr [mm], volume fraction of abrasive material in the AWJ stream lambda [1], price of electrical energy Ckwhod [CZK/kWh], and the ratio of nozzle diameters Dvo/Dabro=Kdvdao=const [1] that is the same for all materials automatically without any technologist's intervention. For instance, the current price of electrical energy, price of water, price of abrasive material, water density, and theoretically given constants $Ra_o$ and $Yret_o$ cannot be influenced by technologists. On the contrary, by Algorithm 1 the technologist can in advance model-calculate e.g. achieved depth of the cut, cut wall roughness, overall performance and labour price for the cut material, if he/she decides to use e.g. olivine, glass or another cheaper abrasive material defined in Algorithm 1 by density and price (from which other parameters follow, such as abrasive mass flow rate and weight fraction of abrasive material in the flow), instead of garnet as expensive abrasive material. In Table 5 it can be seen which of 11 presented input parameters are values that hold true permanently and generally and which ones are values that must be updated. As a consequence, if we change these input values, the result of calculation according to Algorithm 1 will change adequately.

Outputs are all required data on the material, technology and technical behaviour of the whole cut in numerical and graphical form on a display of programmable technology calculator or on a PC. After the start of Algorithm 1 for the technology of abrasive waterjet cutting of materials, the technologist will obtain, on the display in about one minute, altogether 110 technological data in numerical (tabular) form and 90 graphs, which from the technical point of view, describe in a predictive way the space-time behaviour of the whole cut, including the optimum traverse speed, pump pressure, amount of abrasive material, final quality of cut, optimum depth and achievable depth of cut, cost analysis and overall economics of operation of the abrasive waterjet cutting system for a specific material. Because Kawj is the length parameter and increases with the growing plasticity of the cut material, the time of automatic calculation may be extended at the constant density of sampling to even 2-3 minutes. For instance, for common steels, Kawj moves in the range of 18-40 [µm], whereas for Al alloys it ranges from 200 to 700 [µm] depending on chemical composition and mechanical plasticity, and for Pb alloys, Kawj exceeds 1000 [µm]. That is why it is suitable with less powerful computers to diminish the density of sampling (position 14 in basic version of Algorithm 1 for the selection of density of sampling at the cut depth h; sampling step can be taken for a common PC e.g. in the orders from 10-4 to 10-3 mm for high-strength steels, 10-2 for medium-strength materials, such as copper, aluminium, 10-1 for soft materials, such as lead, wood, rocks, plastics). The whole calculation can be performed by means of programmable technology calculator or PC; interactive input and modelling the process by the technologist himself/herself being possible.

Furthermore, the subject matter of the invention solves the problem of nonexistence of uniform technological classification of engineering materials according to the parameter of cuttability Kawj; this generalizing criterion enables the classification of materials into 6 classes of cuttability using an abrasive waterjet Tcut. The class of cuttability of materials using an abrasive waterjet is determined on the basis of parameter Kawj or according to Emat=f(Kawj) by equations (1) and (2). To the classes of cuttability of materials using an abrasive waterjet, Algorithm 1 for the technology for abrasive waterjet cutting of materials then assigns optimized technology parameters of the relevant system by means of calculation. A cuttability class consists of a group of materials of similar mechanical properties from the point of view of abrasive waterjet cutting. The cuttability classes divide materials generally according to Young's modulus Emat along the x-axis and include all kinds of engineering materials, see diagram in FIG. 5. Young's modulus Emat can be, according to the subject matter of proposal for the invention, verified or determined simultaneously with the constant Kawj. Within individual classes, detailization into subclasses is carried out automatically after starting Algorithm 1, and the whole set of parameters calculated by Algorithm 1 characterises the given subclass. For example, for steel ČSN 17 251, automatic classification into the cuttability class Tcut=5 and into the detailed subclass Tcut=5.2232, if detailization into subclasses is done to 4 decimal places, follows from a graph in FIG. 5 and Table 2, column No. 14. The classification of the cut material according to technological classification is then automatically carried out by Algorithm 1 on the basis of equations given below:

$$T\text{cut}=\log(10\char`\^6/Kawj\char`\^0.5),[-] \qquad (1)$$

$$T\text{cut}=\log(Emat).[-] \qquad (2)$$

Testing the material for the input technology parameter Kawj can be executed by simple calculation either according to deformation parameters of the cut wall of test sample or according to verified parameters Emat or $V_{LUZ}$, as already mentioned above, using the following four methods.

A: we measure 3 deformation parameters of the sample of material, namely the selected depth of cut $h_x$ [mm], local roughness $Ra_x$ [µm] at the depth $h_x$ and deviation of the cut trace from the normal plane $Yret_x$ at the depth $h_x$.

B: if we know $Kawj_{et}$ of reference material or $Emat_{et}$ or $V_{LUZet}$, we measure merely 2 deformation parameters of the sample of material, namely the reference depth $h_{et}$ [mm] identical for all tested materials and deviation of the cut trace from the normal plane $Yret_x$ [mm] of tested material at the reference depth $h_{et}$.

C: in the uncut sample of material either the longitudinal ultrasonic wave speed $V_{LUZ}$ [m/s] or Young's modulus Emat is measured, and on the basis of one of these parameters input data for Algorithm 1 for the technology for the abrasive waterjet cutting of materials will be determined.

D: if verified Young's modulus Emat or the longitudinal ultrasonic wave speed $V_{LUZ}$ of the cut material is available, we can determine the input parameter Kawj for Algorithm 1 for the technology for the abrasive waterjet cutting of materials by calculation, i.e. without measurement and without any special instrument equipment.

The depth $h_x$ should be measured merely in the methods A and B. The methods A to D can be in principle divided into direct and indirect ones. To the direct methods, the methods A and B belong, because they require the direct execution of the cut, obtaining of test sample and direct measurement of roughness $Ra_x$ and length measurement of depth $h_x$ and also deviation of the cut trace from the normal plane $Yret_x$. The methods C and D can be designated as indirect because they do not require the execution of the test cut.

The principle of the subject matter of the invention according to the version A consists in the selection of depth $h_x$ [mm] on the check cut wall with well visible traces after the cutting tool. At this depth $h_x$, local roughness $Ra_x$ [µm] and deviation of the cut trace from the normal plane $Yret_x$ [mm] are measured. From these data, the constant of cuttability of the material using an abrasive waterjet Kawj is calculated according to relation (3). This constant will be put as input value into Algorithm 1. And additionally also Young's modulus Emat is calculated according to relation (4) as a direct function Emat=f(Kawj):

$$Kawj_x = Ra_x * h_x / Yret_x [\mu m] \qquad (3)$$

$$Emat_x = 10\char`\^6/Kawj_x\char`\^0.5.[MPa] \qquad (4)$$

Then the optimized traverse speed for the cutting of various materials and for the execution of other test cuts is determined as follows:

$$Vpopt=(10\char`\^-3*Ra_o)\char`\^0.5*10\char`\^6/Emat\char`\^0.5,[\text{mm/min}] \qquad (5)$$

where $Ra_o$ is the roughness of cut trace at the depth $h_o$, i.e. in the neutral plane, $Ra_o=3.7$ [µm].

The advantage of implementation of the invention according to the version A consists in the fact that all 3 most important variables are measured, from the physical point of view, directly. The disadvantage is especially the necessity of measuring roughness $Ra_x$ at the depth of cut $h_x$; the measurement is carried out either by a roughness meter developed by the inventors or is taken on the basis of a contract.

The principle of the invention according to the version B consists in the fact that one complete reference measurement according to the version A for one reference material will be made on the check cut wall at the selected reference depth $h_{et}$ [mm] or $Kawj_{et}$ and other parameters of the reference material will be determined according to the verified values of $Emat_{et}$ or $V_{LUZet}$, and at the same, i.e. reference traverse speed $Vpopt_{et}$ [mm/min] check samples will be cut from the other materials; the reference depth $h_{et}$ [mm] being constant for all the materials. Merely the deviation of the cut trace from the normal plane $Yret_x$ [mm] will be measured at the depth $h_{et}$ and thus there will not be a need to measure roughness $Ra_x$ [µm] at the depth $h_{et}$ [mm] The parameters $Kawj_x$ [µm] and $Emat_x$ [MPa] are determined from the deviation of the cut trace from the normal plane $Yret_x$ [mm], reference deviation $Yret_{et}$ [mm], parameter $Kawj_{et}$ [µm].

The procedure and relations for the determination of input parameter for Algorithm 1 are as follows:
 a) we shall select a reference depth $h_{et}$ [mm] (e.g. $h_{et}$=8 mm),
 b) we shall measure a deviation of the cut trace from the normal plane $Yret_x$ [mm] on the test cut of an unknown material at the depth $h_{et}$,
 c) we shall select a reference material, e.g. steel ČSN 17 251 with the known deviation $Yret_{et}$=0.644 mm at the depth $h_{et}$. Using the known, pre-determined parameter $Kawj_{et}$=35.77 µm, according to the version A, or Young's modulus $Emat_{et}$ or $V_{LUZet}$ verified on the basis of a contract or at the laboratory, we shall determine $Kawj_{et}$ by means of modified relation (7) as $Kawj_{et}$=10^12/$Emat_{et}$^2 [µm] or by means of relation (10) as $Kawj_{et}$=(10^4/$V_{LUZet}$) ^6, [µm],
 d) after substituting into relation (6) we shall calculate $Emat_x$ [MPa] for the unknown material,
 e) after substituting into relation (7) we shall calculate $Kawj_x$ of the unknown material and use it as input data for starting Algorithm 1,
 f) after substituting with advantage into relation (8) we shall calculate the value of roughness $Ra_x$ [µm], as check value at the depth $h_{et}$ in the test cut of the unknown material,
 g) after substituting with advantage into relation (3) we shall perform a check of $Kawj_x$ of the unknown material.

$h_{et}$=8mm, $$Emat_x=(10^24*Yret_x/(Yret_{et}*Kawj_{et}^2))^0.25,[MPa] \quad (6)$$

$$Kawj_x=10^12/Emat_x^2,[\mu m] \quad (7)$$

$$Ra_x=Yret_x*Kawj_x/h_{et}[\mu m] \quad (8)$$

$$Kawj_x=Ra_x*h_{et}/Yret_x,[\mu m] \quad (3)$$

The advantage of implementation of the invention according to the version B consists in the fact that there is no need to measure directly roughness $Ra_x$ at the depth of cut $h_{et}$, because this operation is replaced by comparative reference calculation. There is a need for the knowledge of Young's modulus $Emat_{et}$ [MPa], strength $SIG_{met}$ [MPa] of material and other reference values of $Ra_{et}$ and also of $Yret_{et}$ for $h_{et}$ merely for one, i.e. reference material, which is determined only once and then can be used always for comparison with other cut engineering materials.

The principle of subject matter of the invention according to the version C consists in the fact that measurement of deformation parameters on the cut wall is not required and also a need for the preparation of a check sample does not exist, because ultrasonic nondestructive radiation is applied to an uncut sample to determine the longitudinal ultrasonic wave speed $V_{LUZ}$ [m/s]; the parameters Kawj [µm] and Emat [MPa] are functions derived from the speed $V_{LUZ}$ [m/s] on the basis of initial functional relation (13) and functional relation (10) or (9) or $Emat_x$ is determined from which Kawj and also $V_{LUZ}$ are determined further.

Algorithm 1 thus will evaluate additionally also the check values of Emat and $V_{LUZ}$ for the given material.

The procedure and relations for the determination of input parameter for Algorithm 1 are given below:
 a) an unknown material to be cut is measured to obtain $V_{LUZx}$ or $Emat_x$ is determined,
 b) we shall substitute it into relation (10) or (7) and calculate the parameter $Kawj_x$ of the unknown material and use this as input value to start Algorithm 1,
 c) with advantage we shall substitute it into relation (9) and calculate Young's modulus $Emat_x$ [MPa] for the unknown material or into relation (13) to calculate $V_{LUZx}$ [m/s],
 d) with advantage we shall carry out a check in the sense of relation (4) or (14) by substituting into analogical equations (7) and (4) or (10) and (14)

$$Emat_x=10^-6*V_{LUZ}^3,[MPa] \quad (9)$$

$$Kawj_x=(10^4/V_{LUZ})^6,[\mu m] \quad (10)$$

$$Kawj_x=10^12/Emat_x^2,[\mu m] \quad (7)$$

$$Emat_x=10^6/Kawj_x^0.5,[MPa] \quad (4)$$

$$V_{LUZ}=10^4/Kawjx^{(1/6)},[m/s] \quad (14)$$

$$V_{LUZ}=(Emat*10^6)^{(1/3)}.[m/s] \quad (13)$$

The advantage of implementation of the invention according to the version C consists in the fact that there is no need to perform test cuts and to carry out all direct measurements of deformation parameters of surface $Ra_x$, $h_x$ and $Yret_x$ for the determination of constant of cuttability of material using an abrasive waterjet Kawj, which leads to the lowest labour intensity and costs of testing because an alternate measurement by the desk-top ultrasonic device is very quick, simple and cheap, and also consists in the fact that there is no need to have knowledge of mechanical properties of the material (Emat, $SIG_m$). Verification works show that the results of this testing are sufficiently accurate although it is a case of physically indirect determination of inputs to Algorithm 1.

The principle of the invention according to the version D consists in the fact that in the case of verified knowledge of Young's modulus Emat or $V_{LUZ}$ of the cut material we shall determine the input parameter Kawj for Algorithm 1 by calculation, it means without any measurements and without any special instrument equipment. Algorithm 1 will also evaluate additionally the check value of $V_{LUZ}$ or Emat for the given material.

The procedure and relations for the determination of input parameter for Algorithm 1 are given below:
 a) we shall substitute the verified value of Young's modulus $Emat_x$ or $V_{LUZx}$ for the cut material into relation (7) or (10) and shall calculate the parameter $Kawj_x$ of the cut material and shall use it as input value to start Algorithm 1,
 b) for the purpose of checking we can calculate roughness $Ra_x$ [µm] at any selected depth $h_x$ [mm], and also deviation of the cut trace from the normal plane Yret$_x$ [mm], and can verify back the input technology parameter Kawj and the validity of Emat=f(Kawj) according to equations (11), (12), (3) and (4).

$$Kawj_x = 10^2/Emat_x{}^2, [\mu m] \quad (7)$$

$$Ra_x = (-10)*(1-Kawj_x/(Kawj_x-h_x)), [\mu m] \quad (11)$$

$$Yret_x = Ra_x * h_x/Kawj_x, [\mu m] \quad (12)$$

$$Kawj_x = Ra_x * h_x/Yret_x, [\mu m] \quad (3)$$

$$Emat_x = 10^6/Kawj_x{}^{0.5}, [MPa] \quad (4)$$

$$V_{LUZ} = (Emat*10^6)^{(1/3)}, [m/s] \quad (13)$$

$$V_{LUZ} = 10^4/Kawjx^{(1/6)}, [m/s] \quad (14)$$

The advantages of implementation of the invention according to the version D consists in the facts that there is no need to prepare a test sample, to carry out any measurement and to have any special instrument equipment, and further that the labour intensity and costs of starting Algorithm 1 for the calculation of technology and material parameters to optimize the cutting technology are the lowest.

All relations that are used in the methods A, B, C and D for the determination of Kawj can be in the case of individual methods put with advantage as initial relations into new Algorithm 1, which according to the subject matter of the invention will calculate Kawj and also (Emat, V$_{LUZ}$), and subsequently thus all other technology parameters on the basis of input measured and known values.

As far as necessary equipment is concerned, for the implementation of the invention, in the versions A and B a micrometer ruler with the length measurement accuracy of +/−0.05 [mm] is sufficient; in the version A, local roughness Ra$_x$ is to be measured with the accuracy of +/−0.05 [μm] or this measurement is to be made on the basis of a contract. In the version C a need for a desk-top ultrasonic device with the accuracy of +/−1 [m/s] or for a device for the determination of material values (Emat) appears; or V$_{LUZ}$ [m/s] and Emat can be obtained on the basis of a contract, which is the version D. Computing machinery consists of a computer programmed with Algorithm 1 or a programmable technology calculator. Thus the solution according to the subject matter of the invention includes simple measuring procedures by the versions A, B, C, D for the determination of parameter Kawj of materials, the simple and quick calculation of technology parameters from one parameter Kawj (the calculation is uniformly valid for all the versions A, B, C, D), the automatic receiving of all required results for the setting of optimum technology regime for the cutting of any material from one parameter Kawj according to Algorithm 1, the generally valid measuring procedures and Algorithm 1 for all engineering materials. The subjective making of decisions in the stage of work planning is replaced by the complex-exact solution, the technologically satisfactory accuracy of measurement, the possibility of feedback check of correctness of setting the technology graphically, analytically and physically on samples. Furthermore, the solution enables the standardization of technological procedures/regimes according to Kawj and classes Tcut, the physical and mathematical modelling of technological process, the prediction of quantitative and qualitative parameters of technological process, the use of solution and application of results not only in practice, but also in basic and applied research, the comprehensive analytical description of mechanism of disintegration using an abrasive waterjet tool, the derivation of equations for control functions for the full-automatic on-line control of plants, the acquiring of much information on the mechanical properties of cut materials, which supplements or replaces very expensive and time-consuming additional laboratory measurements, the new method of calculation of dynamics of stress-deformation states of deformation tool-material systems, which is, among other matters, generalizable and applicable to many other industrial technologies.

AN OVERVIEW OF FIGURES IN DRAWINGS

Figure 2:
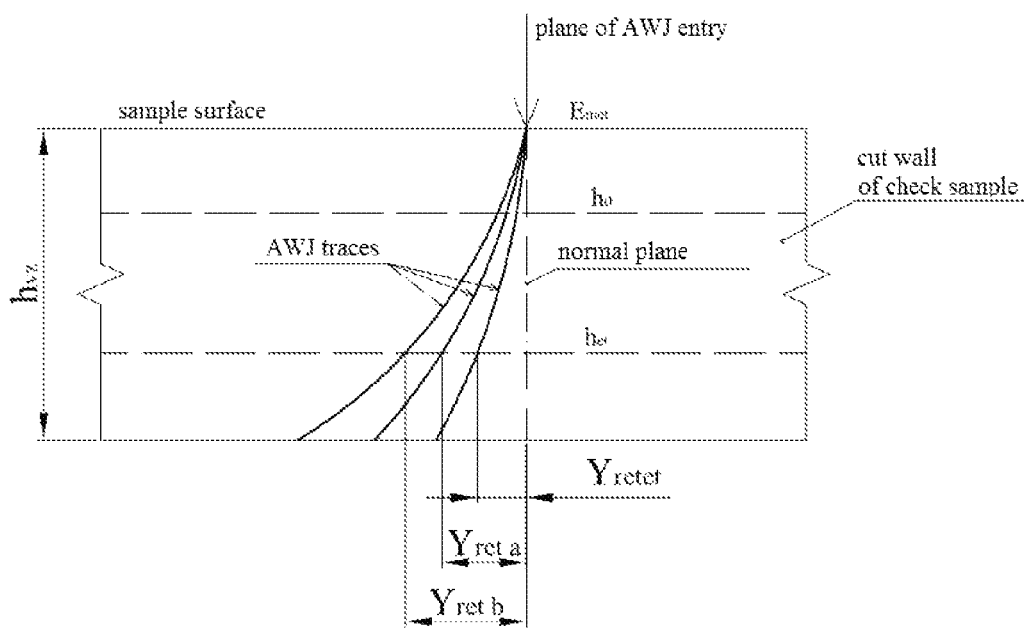
Figure 4:
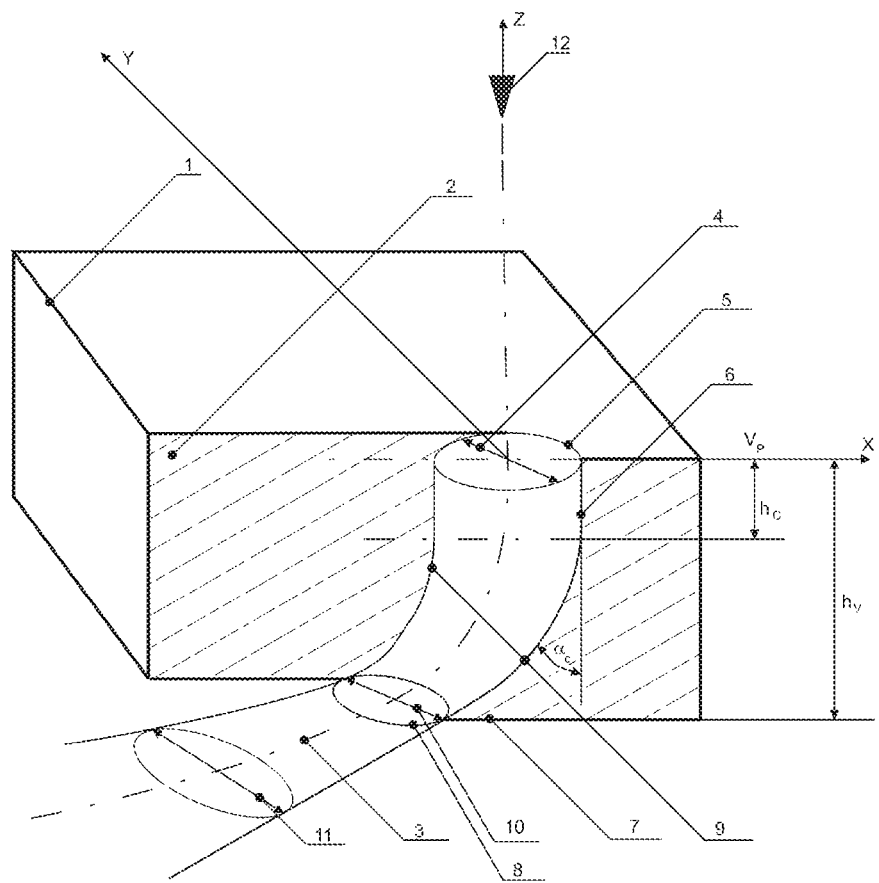
Figure 5:
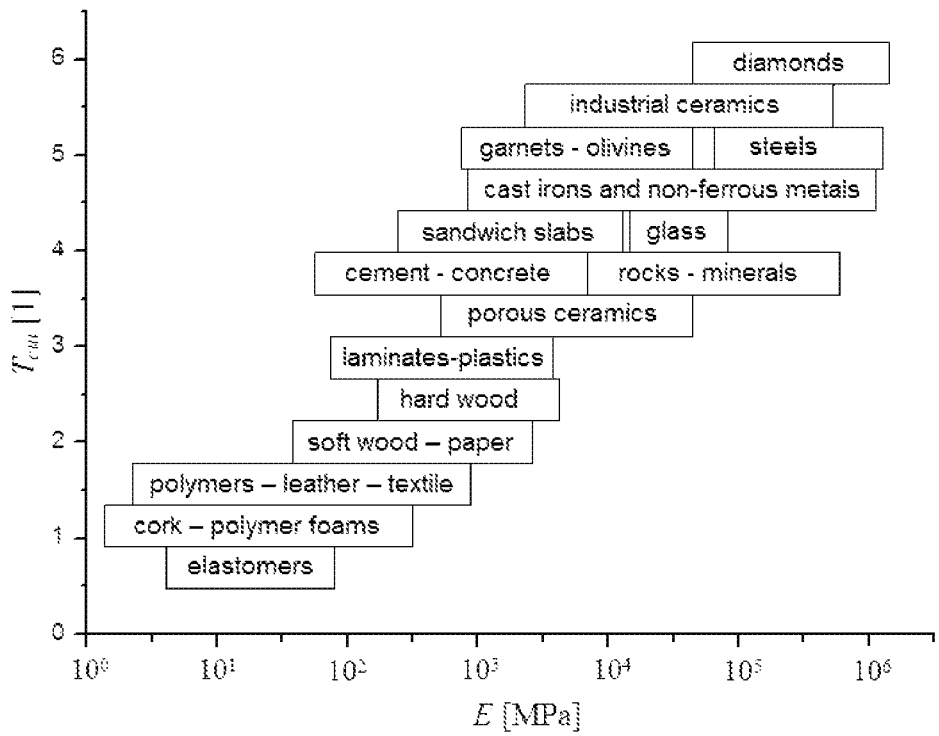
Figure 6:
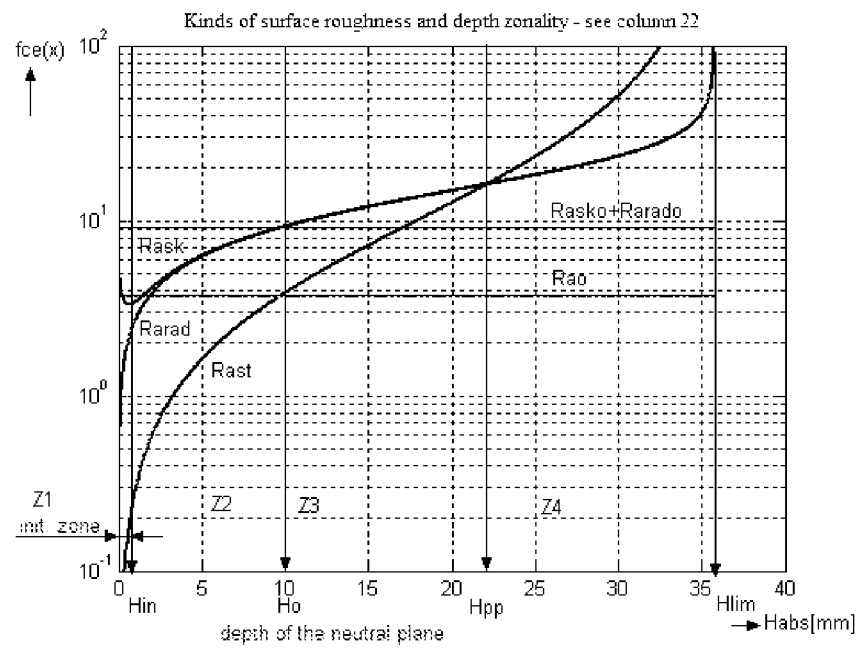

FIG. 1 Diagram for version A of invention implementation.
X—selected measuring point on the cut trace
h$_x$—depth of measuring point X (in cut) [mm],
hvz—sample thickness [mm],
Yret$_x$—deviation of cut trace from normal plane at point X [mm],
arcD$_x$—angle of deviation of cut trace at point X [deg],
Ra$_x$—roughness at point X [μm].
FIG. 2 Diagram for version B of invention implementation.
Emat=Emat$_{et}$-Young's modulus for the reference material [mm],
h$_o$—depth of neutral plane [mm],
h$_{et}$—depth of reference plane [mm],
h$_{vz}$—total cut depth, or sample height [mm],
Yret$_{et}$—deviation of cut trace from normal plane of reference material [mm],
Yret$_a$—deviation of cut trace from normal place of unknown tested material (a) [mm],
Yret$_b$—deviation of cut trace from normal plane of unknown tested material (b) [mm]
FIG. 3 Diagram for version C of invention implementation.
FIG. 4 Principle of abrasive waterjet cutting of materials and nomenclature designation of basic technology and geometric elements of AWJ.
  1—upper edge of sample,
  2—cut wall,
  3—AWJ symmetry axis,
  4—input diameter of AWJ stream at the top of cut,
  5—shape of kerf at the top of cut,
  6—cutting front, trace of cutting front,
  7—lower edge of sample,
  8—shape of kerf at the bottom of cut,
  9—curves of external streamlines in the plane of cut,
  10—exit diameter of AWJ stream at the bottom of cut,
  11—diameter of AWJ stream after leaving the lower edge of sample,
  12—AWJ exit nozzle,
  Vp—traverse direction,
  he—critical depth of cut,
  hv—depth of cutting through the sample (sample height).
FIG. 5 Diagram of classification of engineering materials into classes of cuttability of materials using an abrasive waterjet Tcut [-] on the basis of values calculated according to the subject matter of the invention as function of material constant Tcut=f(Kawj).
FIG. 6 Roughness kinds and distribution at the depth of cut—predicted behaviour depending on instantaneous depth of cut Habs=0-Hlim [mm] at technology given by Algorithm 1 according to the subject matter of proposal for the invention for material steel ČSN 17 251; analogically, we shall obtain graphs for other materials according to the input parameter of cuttability of them using an abrasive waterjet.
  Ra$_{st}$—trace roughness [μm],
  Ra$_{sk}$—roughness measured actually in the radial direction [μm], Ra$_{rad}$—theoretical carrier roughness in the radial direction [μm],
Ra$_o$—roughness in the neutral plane [μm],
Z1+Z2+Z3+Z4—major deformation zones at the depth of cut and their depth levels:
Hin—depth of initiation zone Z1 [mm],
Ho—depth of elastic deformation zone Z2 [mm],
Hpp—depth of elastic-plastic deformation zone Z3 [mm],
Hlim—depth of plastic deformation zone Z4 and limit depth of cut in the given material and at the given technology determined by Algorithm 1 [mm]

Figure 7:
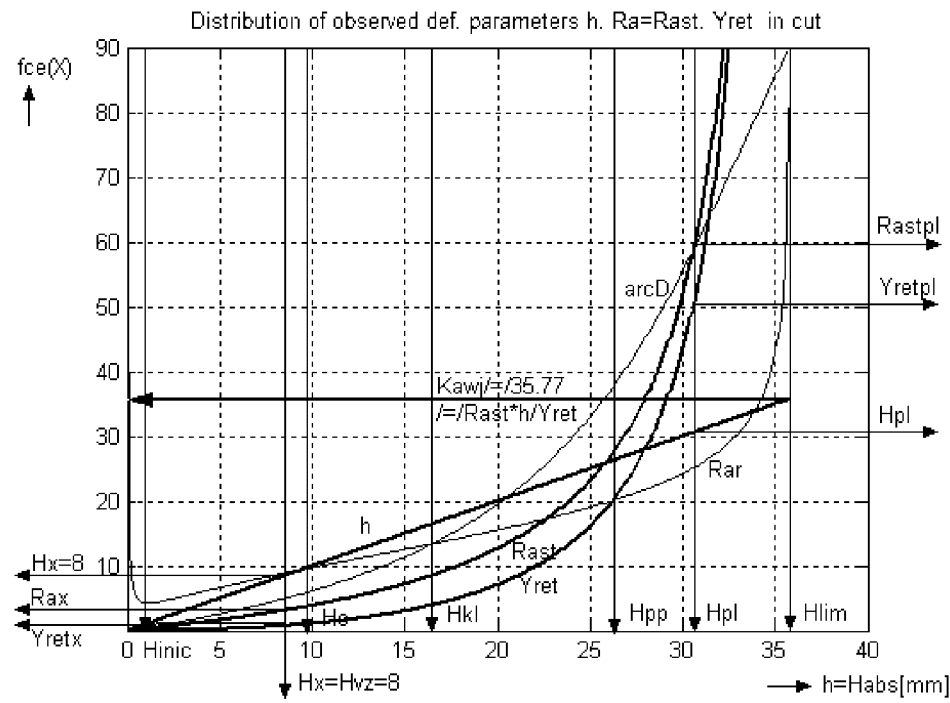

FIG. 7 Prediction of spatial relations between observed instantaneous parameters h, Ra=Rast and Yret and instantaneous depth h=0-Hlim=35.77 mm, at the depth h$_x$=h$_{et}$=8 mm and major deformation limits for material steel ČSN 17 251.

Figure 8:
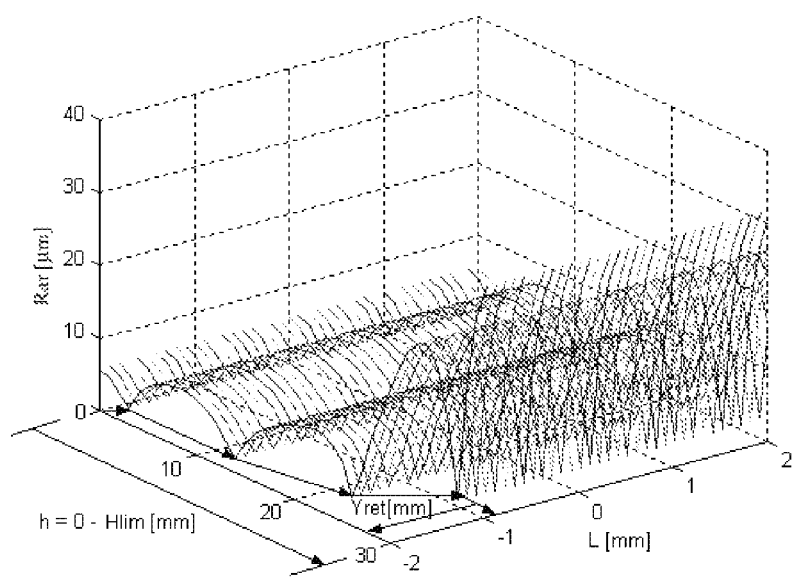

FIG. 8 Predictive representation of depth levels of main deformation limits, representation of carrier waviness and retardation of cut traces in 3D projection at the depth of cut h=0-Hlim [mm] according to equations of Algorithm 1, material steel ČSN 17251.

Figure 9:
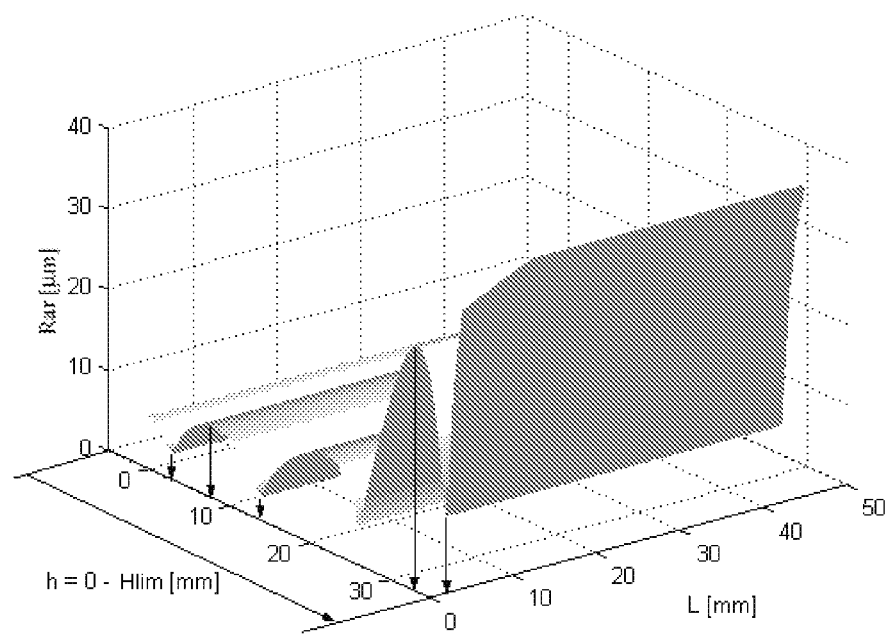

FIG. 9 Predictive representation of depth levels of main deformation limits, representation of carrier waviness and retardation of cut traces in 3D visualization at the total achievable depth of cut h=0-Hlim [mm] according to equations of Algorithm 1, material steel ČSN 17251.

Figure 10:
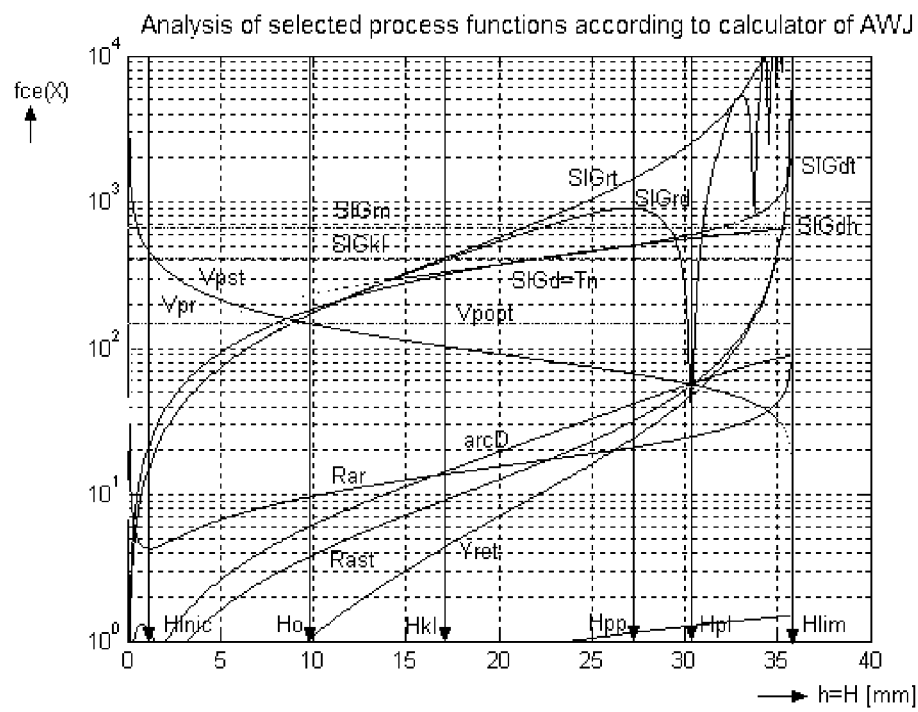

FIG. 10 Predictive representation of depth levels of main deformation limits with a possibility of quantified reading of development of values of observed engineering and technology parameters within the whole depth of cut h=0-Hlim [mm] Depth levels of main deformation limits correspond to 3D visualization for the material ČSN 17251; graphs can be obtained in the same form also for other materials on the display of technology calculator or on the display of PC by means of calculation according to Algorithm 1. This graphical representation enables the check of input tested data, Kawj and Emat=f(Kawj), by substitution of values of Ra, Yret and h from the graph into equations (3) and (4). The graph is, from the point of view of mechanism of cutting, relatively comprehensive, because it also includes, in addition to deformation parameters, material parameters given by Algorithm 1 as a function of Kawj. It is a case of material parameters: tensile strength SIGm [MPa] and yield strength SIGkl [MPa]; furthermore the curves of speed of cutting in the cut trace Vpst [mm/min], in the radial plane Vpr [mm/min] and technologically optimum traverse speed of cutting head Vpopt [mm/min] are represented. Moreover, the angle of curvature of cut trace arcD [°] is represented as well. The cutting resistance of material is represented by the behaviours of functions, namely the function SIGrt [MPa], which declines with increasing depth in the plastic zone of cut to the value of its deformation branch SIGrd [MPa]. The stress function SIGdh [MPa] represents the component of resistance to deepening and the stress functions SIGdt and SIGd=Tn [MPa] represent the developments of mechanical stiffness of disintegration tool of stiff type and that of flexible type of AWJ, respectively.

Figure 11:
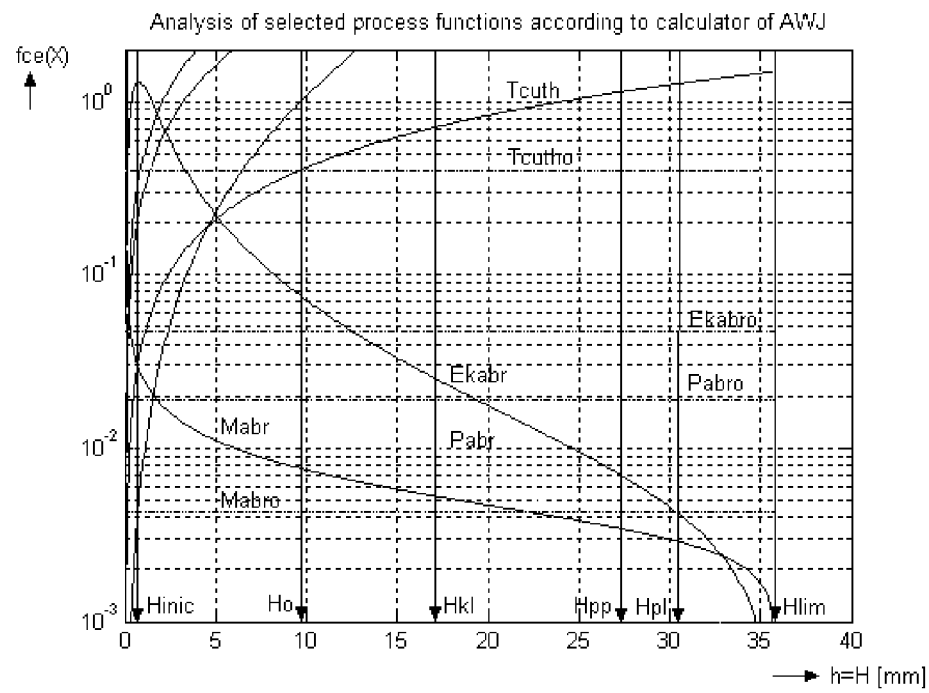

FIG. 11 Predictive representation of depth levels of main deformation limits with a possibility of quantified reading the development of values of observed engineering and technology parameters within the whole depth of cut h=0-Hlim [mm]—it is a detail from the preceding graph in a part y=0.001-2 for low-value-level functions. What is quantified is energy Ekabr [J], performance Pabr [W] of abrasive forces, abrasive mass flow rate Mabr [kg/s] and deformation time Tcuth [s] with their values achieved at the depth level of neutral plane h$_o$=9.67 mm and also at other deformation limits for the presented material steel ČSN 17251.

Figure 12:
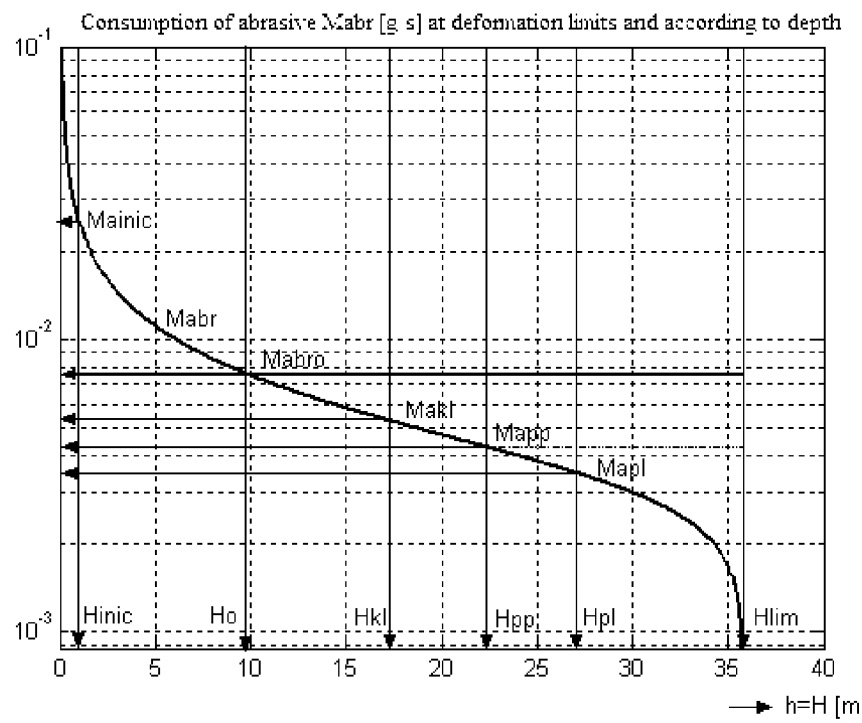

FIG. 12 Graph for the optimum selection of abrasive mass flow rate. Optimum selection of abrasive mass flow rate Mabro=Mabropt=7.6 [g/s] (i.e. 27.36 kg/h), for tested materials, see also Table 2 and Table 3 and representation of theoretical demand for the size of active fraction of mass flow rate Mavph=f(Vpost, Emat, Habs) [g/s] at individual deformation limits and according to the instantaneous depth of cut, generally h=0-Hlim=35.77 mm.

Figure 13:
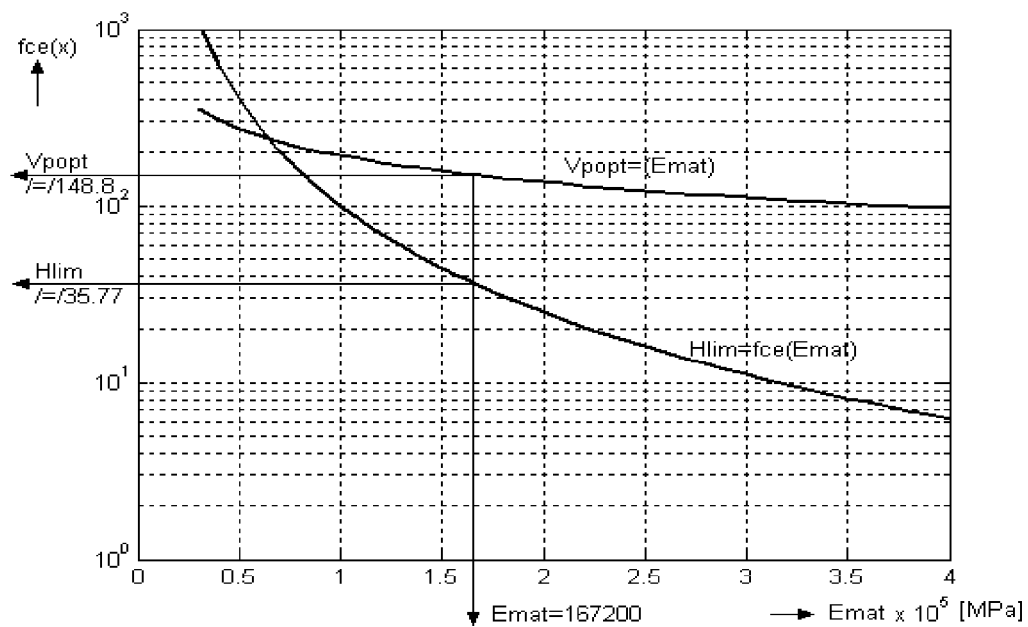

FIG. 13 Graph of dependence of limit depth Hlim [mm] on modulus Emat and on traverse speed Vpopt. Limit depths of cut Hlim [mm] depending on Emat [MPa] at keeping the optimum traverse speed Vpopt [mm/min] for the given material according to the subject matter of the invention. Represented discrete values are true for the presented material steel ČSN 17251 with Young's modulus Emat=167200 [MPa].

Figure 14:
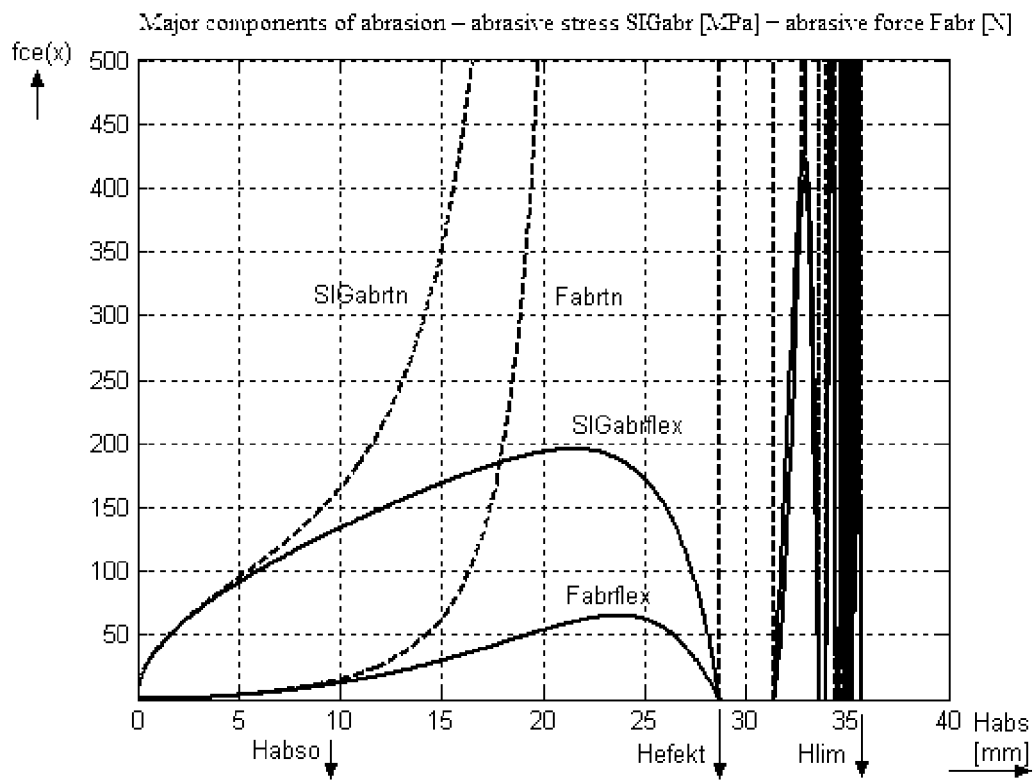

FIG. 14 Major components of mechanism of abrasion at the depth of cut h=0-Hlim [mm] and their theoretical decomposition into components according to the Algorithm corresponding to the flexible (abrasive stress SIGabrflex [MPa] and abrasive force Fabrflex [N]) or theoretically stiff disintegration tool (abrasive stress SIGabrtn [MPa] and abrasive force Fabrflex [N]).

Figure 15:
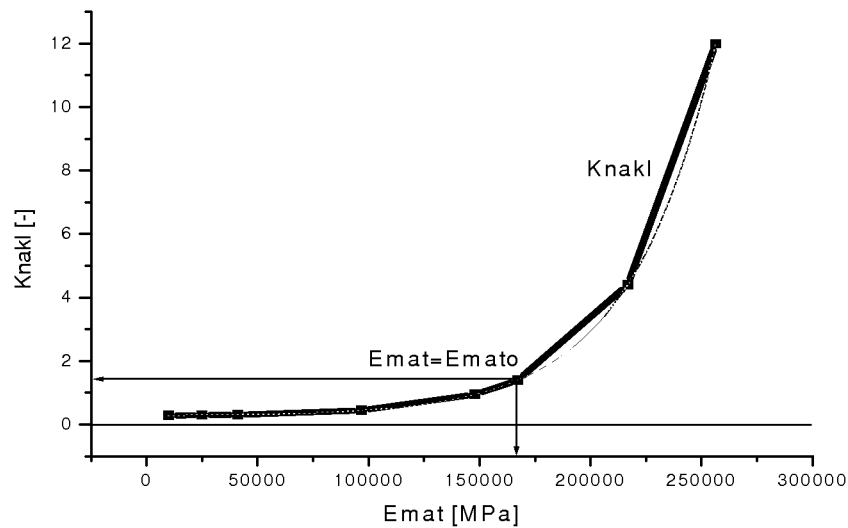

FIG. 15 Determination of cost index Knakl [-] for various materials according to Young's modulus Emat [MPa] for the cut material.

Figure 16:
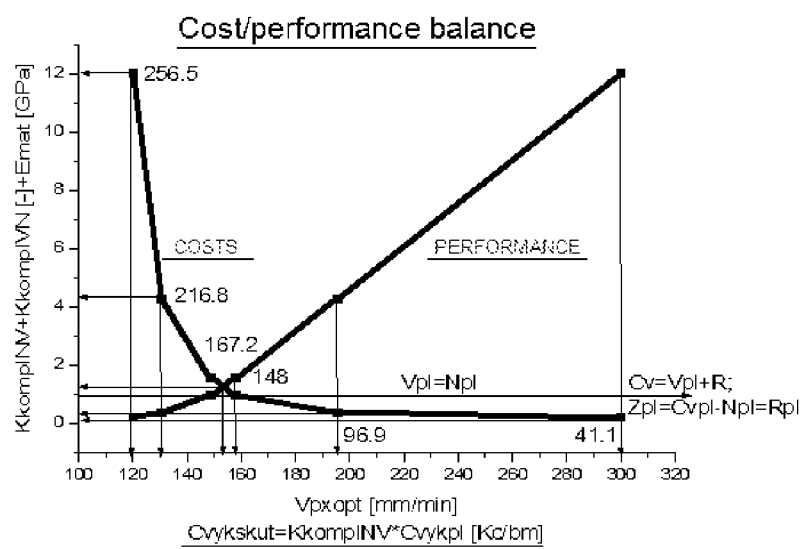

FIG. 16 Graph of balance of cost/performance in relation to corresponding optimum traverse speed of cutting head Vpxopt [mm/min] for tested materials according to Young's modulus Emat=41.1-256.5 [GPa].

Figure 17:
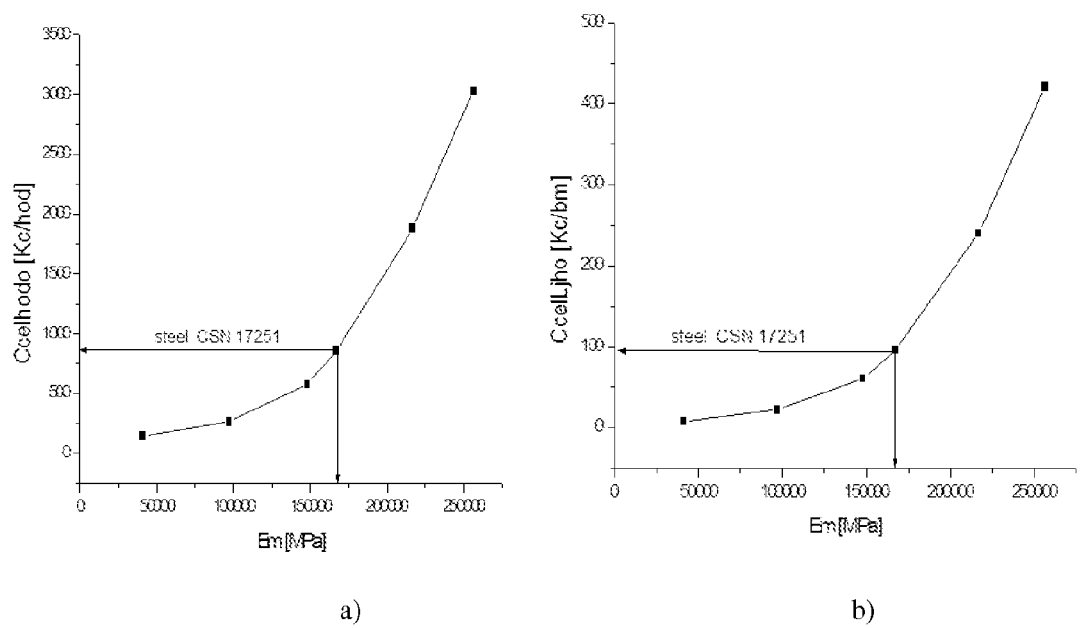

FIG. 17 Prediction of cost relations for cutting from the point of view of energy demand according to Young's modulus [MPa] for materials at the calculated price of 3.50 [CZK/kWh] to the depth of neutral plane h$_o$ [mm] for the given material in units [CZK/CM] a) or [CZK/h] b).

If cutting to rather great depths h>h$_o$ [mm] is performed in operational practice, then the costs of energy, and thus the asking price per kilowatt will grow.

Figure 18:
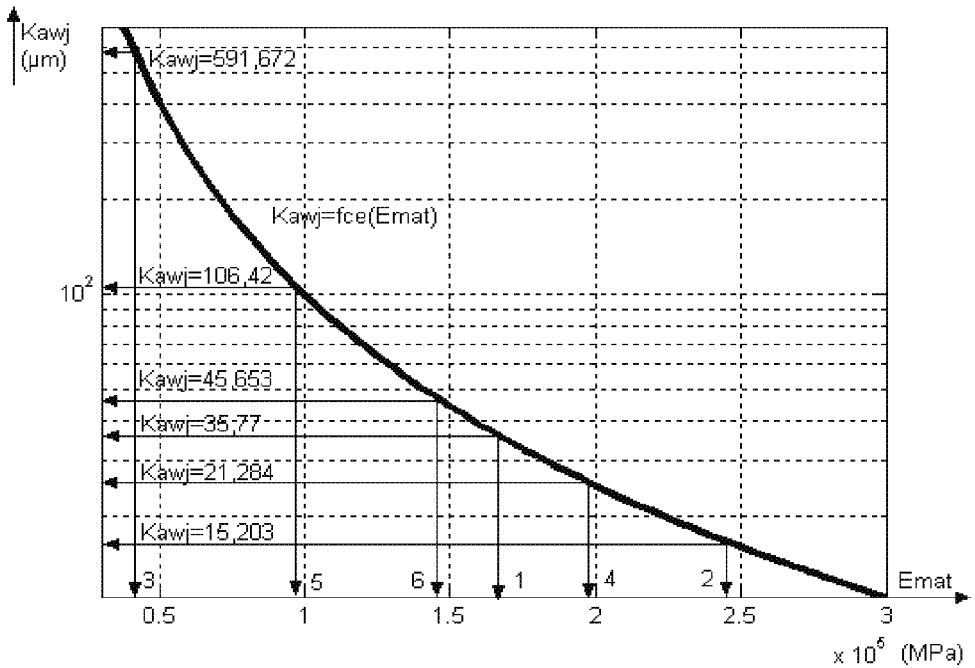

FIG. 18 Graph of calibration dependence, Kawj=f(Emat), according to relation (7) in Algorithm 1.

Figure 19:
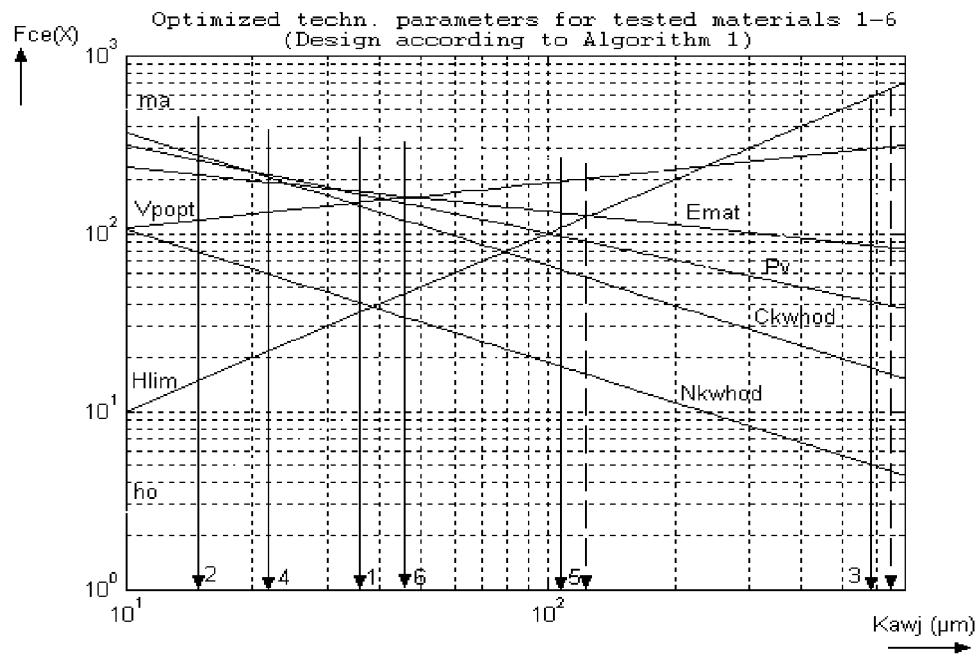

FIG. 19 Design of technology parameters for tested materials 1-6 determined by Algorithm 1 by cuttability Kawj in logarithmic coordinates, where determined values of technology regime correspond to data in Table 3 and FIGS. 6-10. Designation of materials
(x-coordinate): 1—steel ČSN 17 251; 2—steel ČSN 13180; 3—alloy SnPb40; 4—steel ČSN 11140; 5—Cu 99.5; 6—steel 17 618. Optimized parameters calculated on the basis of Kawj(A) by putting into Algorithm 1 in logarithmic coordinates with representation of difference of 10% in Kawj (broken line).

Figure 20:
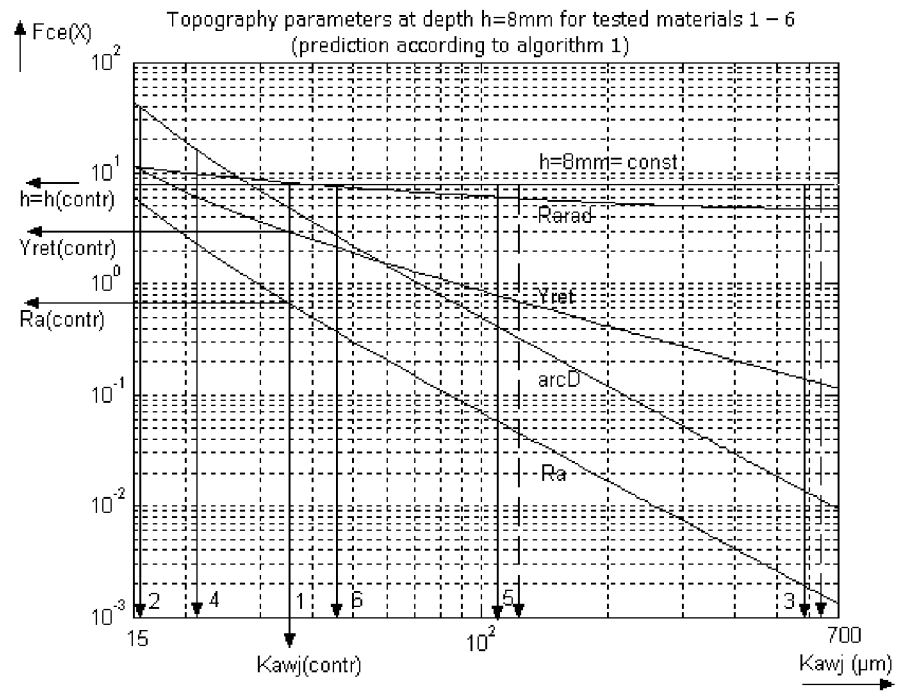

FIG. 20 Topographic parameters at cut depth h=8 mm for tested materials 1-6, calculated using Algorithm 1 on the basis of input value of Kawj (A) in logarithmic coordinates with representation of difference of 10% in Kawj (broken line) and of check values for putting into check calculation according to (3) Kawj(kontr)=Ra(kontr)*h(kontr)/Yret(kontr).

LIST OF TABLES

Table 1 Technology parameters of abrasive waterjet cutting system in the course of verification field operational test.
Table 2 Table showing the composition of numerical results concerning the technology on the calculator display for materials: steels ČSN 17 251, ČSN 13180 and non-metallic alloy SnPb40 (basic version of Algorithm 1: 110 columns of discrete numerical data and 90 graphs).

Table 3 Table showing the composition of numerical results concerning the technology on the calculator display for materials: steel ČSN 11140, copper Cu 99.5 and steel ČSN 17618 (basic version of Algorithm 1: 110 columns of discrete numerical data and 90 graphs).

Table 4 Price relations according to energy costs.

Table 5 Specification of input parameters for Algorithm 1 from the category of technologically given or theoretically given parameters; the constant of cuttability of materials using an abrasive waterjet being considered as the main input parameter searched.

Table 6 Classification of tested materials in the framework of example of implementation into the classes of cuttability of materials using an abrasive waterjet.

Table 7 Comparison table for determination of Kawj value according to methods A, B, C, D.

Table 8 Table of differences in measured values of Kawj from averages according to Table 7.

Table 9 Evaluation of influence of differences in parameter Kawj on main technology parameters and on roughness.

Algorithm 1 is listed at the end of this specification for abrasive waterjet cutting technology.

An Example of Implementation of the Invention

The preparation of measurement and the version of implementation were the same for all materials. For cutting test samples of the length of 30 mm, small timber poles (length 1000 mm and square cross-section 30×30 mm) were used. The poles were cut standardly using the abrasive waterjet cutting technology with parameters as seen in Table 1 to the sample length of 30 mm.

Measurements of deformation parameters $Ra_x$, $h_x$ and $Yret_x$ on cut surfaces of test samples were taken according to a diagram in FIG. 1 at the step of topographical surveying at the depth of cut kh=1 mm According to the version A, the constants of cuttability of all 6 tested materials using an abrasive waterjet Kawj were determined, and by putting Kawj of relevant material into Algorithm 1, optimized technology parameters of abrasive waterjet cutting were calculated in advance.

In the framework of the example of implementation, the following materials were tested:

Material 1: steel ČSN 17 251; Material 2: steel ČSN 13180; Material 3: alloy SnPb40; Material 4: steel ČSN 11140; Material 5: Cu 99.5; Material 6: steel 17 618.

Values of Emat and $V_{LUZ}$ verified by laboratory measurement for these materials were as follows:

Material 1: steel ČSN 17 251 Emat=168500 MPa; $V_{LUZ}$=5543.27 m/s;
Material 2: steel ČSN 13180 Emat=248700 MPa; $V_{LUZ}$=6312.6 m/s;
Material 3: alloy SnPb40 Emat=41710 MPa; $V_{LUZ}$=3461.5 m/s;
Material 4: steel ČSN 11140 Emat=198700 MPa; $V_{LUZ}$=6154 m/s;
Material 5: Cu 99.5 Emat=99400 MPa; $V_{LUZ}$=4587.5 m/s;
Material 6: steel 17 618 Emat=144900 MPa; $V_{LUZ}$=5309.55 m/s.

Input parameters for Algorithm 1 were as follows:

Ckwhod=3.5, lambd=0.7, dazr=0.000188, da=4*dazr, hx=8, Kdvdao=0.329, Roabr=3.4, Roa=Roabr, Rov=1, Roj=1.3, Rao=3.7, Yreto=1.

Outputs of numerical values from Algorithm 1 for the materials 1-6 calculated on the basis of Kawj are provided in Tables 2 and 3. Selected examples of graphical outputs of instantaneous values calculated using equations in Algorithm 1, as exemplified by material 1 (steel ČSN 17 251), are given here in FIGS. 6-16 and in FIG. 17. The technologist (or researcher) can supplement the selection of graphical outputs as needed individually. Individually, interrelations between various functions, which are not there in the presented graphical part of Algorithm 1, can be drawn/modelled, detailed and configured as required.

A set of numerical outputs (see line 14 in Table 2 and Table 3) also contains a technologically important possibility of classifying the tested materials into the classes of cuttability of the materials using an abrasive waterjet Tcut (-), see also FIG. 5. For the softest and relatively easily cuttable material 3 (alloy SnPb40), Tcut=4.614. For the strongest and less easily cuttable material 2 (steel ČSN 13180), Tcut=5.409. The classification of the tested materials 1-6 is presented in a table in Table 6. The procedure for engineering material classification for a need of abrasive waterjet cutting/machining technology is described on the basis of original proposal for the method of classification above. The classification of engineering materials into the classes of cuttability of materials using an abrasive waterjet Tcut has the advantage that for selected representatives of individual classes, standard regimes of main technology parameters for individual classes and their subclasses can be processed. For the standardization of technology regimes, results in Tables 2 and 3 obtained in the framework of the example of implementation can be used as well.

A graph in FIG. 18 shows the dependence of parameter Kawj on Young's modulus Emat for the tested materials 1-6. This calibration dependence, Kawj=f(Emat), enables indicative reading and quick check in practice.

To represent and emphasise differences in technologies according to the cuttability of the tested materials 1-6, a separate graph of selected technology parameters depending on parameter Kawj of individual materials was constructed, see FIG. 19. Similarly, in FIG. 20 there is a constructed graph for topography parameters of surface at the comparison depth h=8 mm Here, the method of checking the determination of parameter Kawj from graphical values according to relation (3), where Kawj(kontr)=Ra(kontr)*h(kontr)/Yret(kontr) (μm) (analogy to the version A of direct measurements on the test cut) is also shown.

For illustration and clarity purposes, only those technology parameters are used for the construction of graph in FIG. 19 that are essential to decision making and to the first opinion of the technologist. They are above all the following parameters optimized by calculation for the selection of technology regime:

traverse speed Vpopt (mm/min),
water pressure before the nozzle Pv [MPa],
abrasive mass flow rate $m_a$ [g/min],
limit/maximum depth of cut Hlim [mm],
hourly consumption of electrical energy for cutting Nkwh [kWh],
current costs of electrical energy for cutting Ckwhod [CZK/h].

These technology parameters are according to relevant equations described by Algorithm 1 as instantaneous, as direct functions in relation to the cuttability parameter Kawj (x-coordinate). Then the values of technology parameters corresponding to the specific material will be read on the y-coordinate of intersections with vertical sections 1 to 6 by means of graph according to Kawj of the specific material. In the framework of the example of implementation, the following themes are described and documented by results:

a) The execution of experiments according to the versions A, B, C, D and final values of parameter Kawj;
b) Evaluation of final values of and found differences in parameter Kawj;

c) Evaluation of the influence of differences in parameter Kawj on the main technology parameters; and on roughness;
d) Overall evaluation of the example of implementation.

Ad a) The execution of experiments according to the versions A, B, C, D and final values of parameter Kawj According to the version A of implementation of the invention (see diagram in FIG. 1), the main input parameter for Algorithm 1 was quantified, i.e. the constant of cuttability of the mentioned materials using an abrasive waterjet Kawj so that the measured values of roughness $Ra_x$ and deviation of cut trace $Yret_x$ at the selected depth of test cuts/samples $h_x=8$ mm were substituted into equation (3). Then the values of Kawj and also the theoretical equivalents of Emat or of $V_{LUZ}$ quantified with advantage additionally according to relation (4) or (14), forming part of the system of equations of Algorithm 1, were for the individual materials as follows:

for steel ČSN 17 251: $h_x=8$ mm; $Ra_x=2.88$ μm; $Yret_x=0.644$ mm;
    then: Kawj=35.77 μm; Emat=167200 MPa; $V_{LUZ}=5461.82$ m/s;
for steel ČSN 13180: $h_x=8$ mm; $Ra_x=11.089$ mm; $Yret_x=5.835$ mm;
    then: Kawj=15.203 μm; Emat=256466 MPa; $V_{LUZ}=6298.06$ m/s;
for alloy SnPb40: $h_x=8$ mm; $Ra_x=0.146$ μm; $Yret_x=0.002$ mm;
    then: Kawj=591.672 μm; Emat=41110 MPa; $V_{LUZ}=3423.29$ m/s;
for steel ČSN 11140: $h_x=8$ mm, $Ra_x=6.04$ μm, $Yret_x=2.27$ mm
    then: Kawj=21.284 μm; Emat=216753 MPa; $V_{LUZ}=5954.93$ m/s;
for Cu 99.5: $h_x=8$ mm, $Ra_x=0.838$ μm, $Yret_x=0.063$ mm
    then: Kawj=106.423 μm; Emat=96935 MPa; $V_{LUZ}=4555.1$ m/s;
for steel 17 618: $h_x=8$ mm, $Ra_x=2.1119$ μm, $Yret_x=0.3701$ mm
    then: Kawj=45.653 μm; Emat=148010 MPa; $V_{LUZ}=5244.5$ m/s.

According to the version B of implementation of the invention (see diagram in FIG. 2), in which we avoid with advantage the necessity of too specialised measurement of parameter of roughness Ra at the reference depth of cut $h_{et}$, we proceed in the following steps:

a) as reference material, steel ČSN 17 251 (material 1) is chosen in this case, and by using Young's modulus Emat=168500 MPa measured in laboratory, the optimum, and in this case also reference traverse speed of cutting head for this material is calculated by substituting into relation (5) $Vpopt_{et}=148.184$ mm/min, and by substituting the laboratory value of Emat into relation (7) the reference value of $Kawj_{et}=35.221$ μm is determined;

b) a sample of the height of 10 mm will be cut through at the calculated reference speed $Vpopt_{et}$, and at a selected reference depth, e.g. $h_{et}=8$ mm, the reference deviation/retardation of the trace of cut from the radial plane of the value of $Yret_{et}=0.651$ mm will be measured (by check calculation we can make sure of the fact that, according to Algorithm 1, for the input value of $Kawj_{et}=35.221$ μm at the depth $h_x=h_{et}=8$ mm, the deviation of trace $Yret_x=0.668$ mm);

c) at the same technology parameters, we shall cut through the samples of the height of 10 mm of the other 5 tested materials and at the depth $h_{et}=8$ mm we shall measure the deviations of cut traces $Yret_x$ and substitute them into relations (6) and (7); thus we shall calculate $Emat_x$ and $Kawj_x$ and additionally/for check also $V_{LUZx}$ from relation (13) for these unknown materials, and with advantage we shall obtain the following test values:

for steel ČSN 13180 (material 2):
$Yret_x=3.09$ mm; $Emat_x=248710$ MPa; $Kawj_x=16.166$ μm; $V_{LUZx}=6288.8$ m/s;
for alloy SnPb40 (material 3):
$Yret_x=0.0024$ mm; $Emat_x=41520$ MPa; $Kawj_x=580.077$ μm; $V_{LUZx}=3462.7$ m/s;
for steel ČSN 11140 (material 4):
$Yret_x=1.723$ mm; $Emat_x=214920$ MPa; $Kawj_x=21.65$ μm; $V_{LUZx}=5990$ m/s;
for copper Cu 99.5 (material 5):
$Yret_x=0.079$ mm; $Emat_x=99451$ MPa; $Kawj_x=101.106$ μm; $V_{LUZx}=4633.1$ m/s;
for steel ČSN 17 618 (material 6):
$Yret_x=0.36$ mm; $Emat_x=145300$ MPa; $Kawj_x=47.363$ μm; $V_{LUZx}=5257.3$ m/s.

We shall put the values of $Kawj_x$ for individual materials into Algorithm 1.

As reference material, e.g. steel ČSN 17 251 (material 1) can be selected; the constant of cuttability Kawj was by the procedure according to the version A determined at the value of 35.77 μm, and thus $Emat_{et}=167200$ MPa, $Yret_{et}=0.644$ mm The values then will change adequately, nevertheless they will still move in the required range of possible errors.

Figure 3:
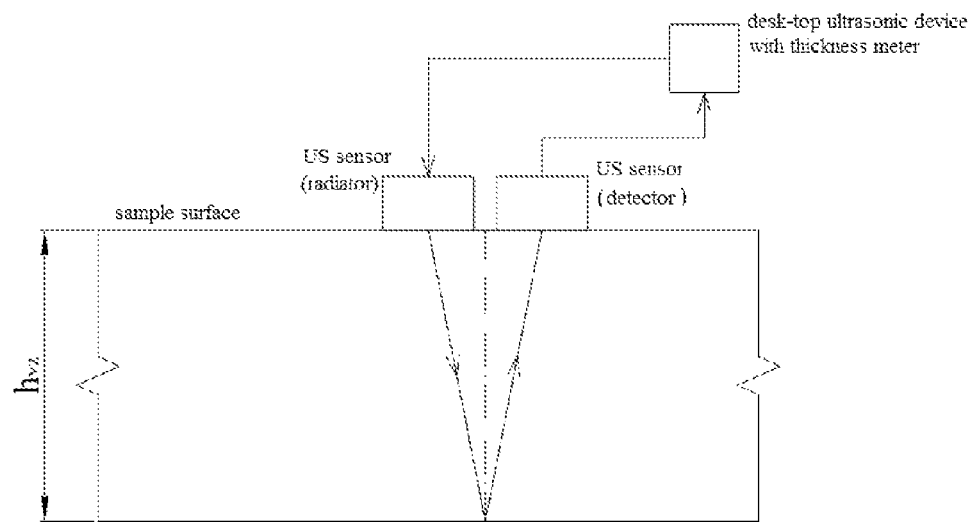

According to the version C of implementation of the invention (see diagram in FIG. 3), in this case we shall avoid, by using the very quick and non-destructive measurement of samples of unknown materials by the desk-top ultrasonic device for measuring the longitudinal ultrasonic wave speed, with advantage especially the otherwise necessary implementation of the test cut, the too specialized measurement of parameter of roughness Ra and also the measurement of lengths. Thus, we proceed more quickly, cheaply and simply in the following steps:

a) samples of the tested materials having dimensions that are available, will be measured according to a diagram in FIG. 3 by the device developed by the inventors or values of longitudinal ultrasonic wave speed $V_{LUZ}$ (m/s) measured on the basis of a contract will be used;

b) by substituting the values into relation (10) we shall calculate with advantage easily the constant of cuttability of the given materials using an abrasive waterjet Kawj and by substituting into relation (9) we shall with advantage calculate easily additionally also the value of Young's modulus Emat for these materials;

c) we shall put the value of constant of cuttability using an abrasive waterjet Kawj as input value into Algorithm 1 and shall obtain optimized input parameters of technology regime, including the model solution for the space-time behaviour and final topography parameters of the cut specifically for each material.

For the materials tested here, the following values are obtained after substituting the laboratory values of $V_{LUZx}$ into relations (10) and (9):

for steel ČSN 17 251 (material 1):
$V_{LUZx}=5543.27$ m/s; $Kawj_x=35.221$ μm; $Emat_x=168499.7$ MPa;
for steel ČSN 13180 (material 2):
$V_{LUZx}=6312.6$ m/s; $Kawj_x=16.166$ μm; $Emat_x=248713.1$ MPa;
for alloy SnPb40 (material 3):
$V_{LUZx}=3461.5$ m/s; $Kawj_x=580.077$ μm; $Emat_x=41519.98$ MPa;
for steel ČSN 11140 (material 4):
$V_{LUZx}=6154$ m/s; $Kawj_x=21.65$ μm; $Emat_x=214917.1$ MPa;
for copper Cu 99.5 (material 5):
$V_{LUZx}=4587.5$ m/s; $Kawj_x=101.106$ μm; $Emat_x=99451.55$ MPa;

for steel ČSN 17 618 (material 6):
$V_{LUZx}$=5309.55 m/s; $Kawj_x$=47.36 μm; $Emat_x$=145304.9 MPa.

According to relation (7) the value of $Kawj_x$ can also be obtained on the basis of value of $Emat_x$ (presented above) acquired (determined) in laboratory.

According to the version D of implementation of the invention, we shall with advantage avoid the implementation of a test cut, the necessity of too specialized measurement of parameter of roughness Ra and also length measurements, and also other measurements, either carried out by the inventors or carried out by the contractor, if reliable data from the manufacturer or from material data sheets and the still functionally non-loaded and non-corroded material are available. Then it is enough to use as a basis the value of initial material parameter, in this case the verified value of Young's modulus Emat and to proceed in the following steps:

a) by substituting the laboratory values of Emat in [MPa] into relation (7) we shall calculate with advantage easily the constant of cuttability of the given materials using an abrasive waterjet Kawj and by substituting into relation (13) we shall also with advantage easily calculate additionally the technical and check important value of longitudinal ultrasonic wave speed $V_{LUZ}$ [m/s];

b) we shall put the value of constant of cuttability using an abrasive waterjet Kawj as input value into Algorithm 1 and shall obtain the optimized input parameters of technology regime, including a model solution for the space-time behaviour and also final topography parameters of the cut specifically for each material;

For the materials 1-6 tested here, the following values are obtained after substituting the values of Emat verified in laboratory into relations (7) and (13):
for steel ČSN 17 251 (material 1):
$Emat_x$=168500 MPa; $Kawj_x$=35.221 μm; $V_{LUZx}$=5523.3 m/s;
for steel ČSN 13180 (material 2):
$Emat_x$=248700 MPa; $Kawj_x$=16.168 μm; $V_{LUZx}$=6288.7 m/s;
for alloy SnPb40 (material 3):
$Emat_x$=41710 MPa; $Kawj_x$=574.804 μm; $V_{LUZx}$=3468 m/s;
for steel ČSN 11140 (material 4):
$Emat_x$=198700 MPa; $Kawj_x$=25.328 μm; $V_{LUZx}$=5835.3 m/s;
for copper Cu 99.5 (material 5):
$Emat_x$=99400 MPa; $Kawj_x$=101.211 μm; $V_{LUZx}$=4632.3 m/s;
for steel ČSN 17 618 (material 6):
$Emat_x$=144900 MPa; $Kawj_x$=47.628 μm; $V_{LUZx}$=5252.4 m/s.

According to relation (10), the value of $Kawj_x$ can also be obtained on the basis of values of $V_{LUZx}$ supplied by the contractor.

Ad b) Evaluation of Final Values and Found Differences in Parameter Kawj

The final values of Kawj from the experiments carried out by procedures according to the versions of implementation of the invention A, B, C, D are summarized for the tested materials 1-6 into Table 7, including the evaluation of percent differences in value of Kawj in individual versions. The highest difference according to the versions of implementation was found in the procedure according to the version D, namely −1.33% from the average. Differences by versions and materials are there in Table 8. The highest difference from the average was found in the values of Kawj for the strongest steel ČSN 13180 (material 2) of the set of steels, namely 3.739% also according to the version D.

Ad c) Evaluation of the Influence of Differences in Parameter Kawj on the Main Technology parameters and on roughness For the high-quality selection/setting of technology parameters according to the mechanical properties and the cuttability of the specific material using the abrasive waterjet, which is the main goal and sense of procedures according to the invention, we need to know how potential differences/errors in Kawj determination, which cannot be excluded totally, will manifest themselves in final values of technology parameters and in final values of cut wall surface quality. The comprehensive evaluation of the influence of the greatest difference in parameter Kawj of 3.739% in steel ČSN 13180 (material 2) on the main technology parameters and on the parameter of roughness in the radial direction Rarad at the depth of cut wall h=8 mm is quantified in Table 9. The differences will show themselves most in the values for the limit depth Hlim (2.101%) and further in the values of consumption and costs of electrical energy (−2.684%) and those of roughness Rarad (−1.034%).

Ad d) Overall Evaluation of the Example of Implementation and Advantages of the Proposed Solution The presented results in the framework of the example of implementation according to points a) to c) document sufficient accuracy (according to the requirements, fluctuations should not exceed ±10%) and push the technical application of the proposed solution on the level of present-day needs of practice as well as the state of the art to the higher level. We repeat that the procedures for the determination of input parameter Kawj to be put into Algorithm 1, including the conclusions from the example of implementation are valid generally for engineering materials. Thin-walled half-finished materials, such as leather, paper, textile, and others can be tested for Kawj using with advantage the methods C) and D); the methods A) and B) can be then used with advantage for loaded layers of the thickness of 10 to 20 cm.

Industrial Application

The solution can be used in all enterprises, plants and research workplaces that are concerned with the cutting of engineering materials using the abrasive waterjet cutting technology.

Tables

TABLE 1

| COLUMN | TECHNOLOGY FACTORS | UNIT | SYMBOL | VALUE |
|---|---|---|---|---|
| 1 | Liquid pressure | MPa | p | 300 |
| 2 | Water orifice diameter | mm | $dv_o$ | 0.247 |
| 3 | Abrasive nozzle diameter | mm | $d_{abro}$ | 0.752 |
| 4 | Abrasive nozzle length | mm | $l_a$ | 76 |
| 5 | Abrasive mass flow rate | g/min | $m_a$ | 250 |
| 6 | Nozzle-surface distance | mm | L | 2 |
| 7 | Traverse speed | mm/min | $v_{popt}$ | 150 |
| 8 | Abrasive size | MESH | — | 80 |
| 9 | Abrasive material | — | — | Barton garnet |

TABLE 2

| COL. | PARAMETER/MATERIAL according to ČSN | UNIT | SYMBOL | 17251 | 13180 | SnPb40 |
|---|---|---|---|---|---|---|
| 1 | Constant of cuttability of material using abrasive waterjet | μm | Kawj | 35.770 | 15.203 | 591.672 |
| 2 | Young's modulus | GPa | Emat | 167.200 | 256.466 | 41.110 |

TABLE 2-continued

| COL. | PARAMETER/MATERIAL according to ČSN | UNIT | SYMBOL | 17251 | 13180 | SnPb40 |
|---|---|---|---|---|---|---|
| 3 | Price of electrical energy | CZK/kW | Ckwhod | 3.500 | 3.500 | 3.500 |
| 4 | Volume fraction of abrasive material in AWJ stream | 1 | lambda | 0.700 | 0.700 | 0.700 |
| 5 | Diameter of abrasive grain | mm | dazr | 0.188 | 0.188 | 0.188 |
| 6 | Selected diameter of abrasive nozzle | mm | da | 0.752 | 0.752 | 0.752 |
| 7 | Selected/required depth of cut | mm | $h_x$ | 8.000 | 8.000 | 8.000 |
| 8 | Selected ratio of diameters of nozzles Dv/Dabr | 1 | Kdvdao | 0.329 | 0.329 | 0.329 |
| 9 | Abrasive density | kg/m$^3$ | Roa | 3.400 | 3.400 | 3.400 |
| 10 | Water density | g/cm$^3$ | Rov | 1.000 | 1.000 | 1.000 |
| 11 | Total AWJ stream density | g/cm$^3$ | Roj | 1.300 | 1.300 | 1.300 |
| 12 | Roughness of trace in neutral plane ($h_o$) | μm | $Ra_o$ | 3.700 | 3.700 | 3.700 |
| 13 | Deviation of trace from normal in neutral plane ($h_o$) | mm | $Yret_o$ | 1.000 | 1.000 | 1.000 |
| 14 | Class of cuttability using AWJ technology | 1 | Tcut | 5.223 | 5.409 | 4.614 |
| 15 | Limit depth of cut | mm | Hlim | 35.770 | 15.203 | 591.67 |
| 16 | Coefficient of cuttability | mm | Kawj | 35.770 | 15.203 | 591.67 |
| 17 | Depth of neutral plane | mm | $h_o$ | 9.668 | 4.109 | 159.91 |
| 18 | Yield stress in neutral plane | MPa | SIGklo | 408.90 | 506.42 | 34.513 |
| 19 | Radial roughness in neutral plane ($h_o$) | μm | Rarado | 9.049 | 7.306 | 18.248 |
| 20 | Total roughness in neutral plane | μm | Raskyo | 9.102 | 7.332 | 18.381 |
| 21 | Angle of trace curvature in neutral plane | grad | arcDo | 5.930 | 13.951 | 0.359 |
| 22 | Optimum traverse speed | mm/min | Vpopt | 148.76 | 120.11 | 300.00 |
| 23 | Optimum pump pressure | MPa | Pvpopt | 171.81 | 212.78 | 85.19 |
| 24 | Calculation equivalent of brittle material density | g/cm$^3$ | ROskd | 2.109 | 2.432 | 1.321 |
| 25 | Calculation equivalent of metal material density | g/cm$^3$ | ROskW | 7.507 | 9.457 | 3.519 |
| 26 | Selected abrasive flow rate | kg/min | Maho | 0.004 | 0.004 | 0.004 |
| 27 | Optimum ratio of diameters of nozzles Dv/Dabr | 1 | Kdvda | 0.269 | 0.333 | 0.133 |
| 28 | Roughness of trace in any plane ($h_x$) | μm | $Ra_x$ | 2.881 | 11.106 | 0.137 |
| 29 | Radial roughness in any plane ($h_x$) | μm | $Ra_{radx}$ | 7.49 | 14.22 | 0.913 |
| 30 | Deviation of trace from normal in any plane ($h_x$) | mm | $Yret_x$ | 0.644 | 5.844 | 0.002 |
| 31 | Angle of trace curvature in any plane ($h_x$) | grad | arcDx | 4.617 | 41.875 | 0.013 |
| 32 | Depth of plasticity zone in cut | mm | hp | 17.885 | 7.602 | 295.836 |
| 33 | Design strength of material | MPa | SIGm | 665.52 | 1570.0 | 40.235 |
| 34 | Total roughness in any plane ($h_x$) | μm | Raskyx | 7.544 | 14.274 | 3.019 |
| 35 | Resistance of trace to force in neutral plane ($h_o$) | N | Fcutsto | 167.20 | 256.47 | 41.111 |
| 36 | Resistance of trace to force in any plane ($h_x$) | N | Fcutstx | 130.18 | 769.81 | 1.523 |
| 37 | Total stress in neutral plane ($h_o$) | MPa | SIGcutsko | 167.20 | 256.47 | 41.111 |
| 38 | Total stress in selected plane ($h_x$) | MPa | SIGcutskx | 138.58 | 499.29 | 6.752 |
| 39 | Roughness of trace in plane of plasticity zone (hp) | μm | Rap | 10.000 | 10.000 | 10.000 |
| 40 | Radial roughness in plane of plasticity zone (hp) | μm | Raradp | 16.740 | 13.516 | 33.759 |
| 41 | Deviation of trace from normal in plane of zone (hp) | mm | Yretp | 5.000 | 5.000 | 5.000 |
| 42 | Deviation of trace in plane of plasticity zone (hp) | grad | arcDp | 16.026 | 37.705 | 0.969 |
| 43 | Total roughness in plane of plasticity zone (hp) | μm | Raskyp | 16.801 | 13.563 | 33.857 |
| 44 | Total stress in plane of plasticity zone (hp) | N | SIGcutskp | 308.63 | 474.43 | 75.73 |
| 45 | Area of contact in neutral plane ($h_o$) | mm$^2$ | Scuto | 1.000 | 1.000 | 1.000 |
| 46 | Area of contact in plane of plasticity zone (hp) | mm$^2$ | Scutp | 1.464 | 1.461 | 1.467 |
| 47 | Grain size constant | 1 | Kzro | 0.001 | 0.001 | 0.001 |
| 48 | Volume of material removal in neutral plane ($h_o$) | mm$^3$ | Udho | 0.026 | 0.011 | 0.432 |
| 49 | Volume of material removal in plane of plasticity zone (hp) | mm$^3$ | Udhp | 0.026 | 0.011 | 0.434 |
| 50 | Area of contact in any plane ($h_x$) | mm$^2$ | Scutx | 0.939 | 1.542 | 0.226 |
| 51 | Volume of material removal in any plane ($h_x$) | mm$^3$ | Udhx | 0.026 | 0.011 | 0.132 |
| 52 | Weight of instantaneous brittle material removal for $h_o$ | mg | Gudhod | 0.055 | 0.027 | 0.571 |
| 53 | Weight of instantaneous brittle material removal for hp | mg | Gudhpd | 0.055 | 0.027 | 0.574 |
| 54 | Weight of instantaneous brittle material removal $h_x$ | mg | Gudhxd | 0.055 | 0.027 | 0.174 |
| 55 | Weight of instantaneous metal material removal $h_o$ | mg | Gudhow | 0.196 | 0.105 | 1.500 |
| 56 | Length of chip in neutral plane ($h_o$) | μm | dhmcmo | 26.107 | 11.098 | 431.765 |
| 57 | Length of chip in plane of plasticity zone (hp) | μm | dhmcmp | 17.887 | 7.604 | 295.838 |
| 58 | Length of chip in any plane ($h_x$) | μm | dhmcmx | 27.775 | 7.210 | 583.747 |
| 59 | Grain size of crushed material in neutral plane ($h_o$) | μm | Dzrrasto | 0.038 | 0.090 | 0.002 |
| 60 | Grain size of crushed material in plane of plasticity zone (hp) | μm | Dzrrastp | 0.056 | 0.132 | 0.003 |
| 61 | Grain size of crushed material in any plane ($h_x$) | μm | Dzrrastx | 0.036 | 0.139 | 0.002 |
| 62 | Weight of instantaneous metal material removal for hp | mg | Gudhpw | 0.197 | 0.105 | 1.500 |
| 63 | Weight of instantaneous metal material removal for $h_x$ | mg | Gudhxw | 0.196 | 0.105 | 0.463 |
| 64 | Stress component SIGy at depth $h_x$ | MPa | SIGyx | 659.43 | 1160.0 | 0.007 |
| 65 | Stress component SIGx at depth $h_x$ | MPa | SIGxx | 6.09 | 408.99 | 40.228 |
| 66 | Normal stress component SIGn at depth $h_x$ | MPa | SIGnx | −653.34 | −747.88 | 40.221 |
| 67 | Shear component Tau at depth $h_x$ | MPa | Taux | −62.23 | −328.53 | 0.534 |
| 68 | Shear component TauV at depth $h_x$ | MPa | TauVx | −62.23 | −328.53 | 0.534 |

TABLE 2-continued

| COL. | PARAMETER/MATERIAL according to ČSN | UNIT | SYMBOL | 17251 | 13180 | SnPb40 |
|---|---|---|---|---|---|---|
| 69 | Stress component SIGy at depth $h_o$ | MPa | SIGyo | 79.84 | 1510.0 | 4.953 |
| 70 | Stress component SIGx at depth $h_o$ | MPa | SIGxo | 585.68 | 53.67 | 35.283 |
| 71 | Normal stress component SIGn at depth $h_o$ | MPa | SIGno | 505.83 | −1460.0 | 30.330 |
| 72 | Shear component Tau at depth $h_o$ | MPa | Tauo | −164.36 | −265.35 | 9.965 |
| 73 | Shear component TauV at depth $h_o$ | MPa | TauVo | −164.36 | −265.35 | 9.965 |
| 74 | Stress component SIGy at depth hp | MPa | SIGyp | 64.935 | 0.060 | 27.335 |
| 75 | Stress component SIGx at depth hp | MPa | SIGxp | 600.6 | 1570.0 | 12.9 |
| 76 | Normal stress component SIGn at depth hp | MPa | SIGnp | 535.7 | 1570.0 | −14.4 |
| 77 | Shear component Tau at depth hp | MPa | Taup | 158.945 | 9.696 | −6.737 |
| 78 | Shear component TauV at depth hp | MPa | TauVp | 154.521 | 0.332 | 3.709 |
| 79 | Penetration time for limit depth of cut Hlim | sec | Tpopt | 1.492 | 1.848 | 0.740 |
| 80 | Penetration time for depth $h_x$ | sec | Tphxopt | 0.334 | 0.973 | 0.010 |
| 81 | Abrasive mass flow rate for depth $h_o$ | kg/s | Mavpopt | 0.008 | 0.009 | 0.003 |
| 82 | Abrasive mass flow rate for depth $h_x$ | kg/s | Mavpoptx | 0.001 | 0.004 | 0.000 |
| 83 | Poisson's ratio at level $h_o$ | 1 | Mio | 0.307 | 0.162 | 2.520 |
| 84 | Mean work done by cutting tool | J | Acelstr | 2.744 | 12.021 | 0.228 |
| 85 | Yield stress at level of neutral plane ($h_o$) | MPa | SIGyieldo | 408.90 | 506.42 | 202.76 |
| 86 | Penetration time for depth $h_o$ | sec | Tphxopto | 0.403 | 0.500 | 0.200 |
| 87 | El. energy consumption per hour of cutting | kWh | Nstrhod | 24.496 | 86.635 | 4.111 |
| 88 | Price of el. energy per hour of cutting | CZK/h | Ccutxhod | 85.735 | 303.222 | 14.387 |
| 89 | Number of metres per hour in relation to cut depth $h_o$ | m/h | Lhxcuthod | 8.926 | 7.207 | 18.000 |
| 90 | Number of metres per shift in relation to cut depth $h_o$ | m/sm | Lhxcutsm | 62.479 | 50.447 | 126.00 |
| 91 | Number of metres per year in relation to cut depth $h_o$ | km/year | Lhxcutrok | 17.494 | 14.100 | 35.300 |
| 92 | Costs per cut metre at cut depth $h_o$ | CZK/m | CcelLhj | 96.056 | 420.749 | 7.993 |
| 93 | Costs per cut per shift at cut depth $h_o$ | th.CZK/shift | Ccelxsm | 6.001 | 21.200 | 1.010 |
| 94 | Costs per cut per year at cut depth $h_o$ | th.CZK/year | Ccelxrok | 1680.0 | 5940.0 | 282.0 |
| 95 | Costs per cut per hour at cut depth $h_o$ | CZK/h | Ccelxhod | 857.3 | 3030.0 | 143.9 |
| 96 | Ratio of diameters of nozzles Dv/Dabr - selection optimization | 1 | Kdvdak | 0.269 | 0.333 | 0.198 |
| 97 | Abrasive nozzle diameter - selection optimization | mm | damm | 0.890 | 0.999 | 0.610 |
| 98 | Water orifice diameter - selection optimization | mm | dvmm | 0.240 | 0.333 | 0.081 |
| 99 | Abrasive stress at level of depth $h_o$ | MPa | SIGabro | 237.09 | 293.64 | 117.57 |
| 100 | Area of abrasion in radial direction at depth $h_o$ | mm² | Sraskho | 0.088 | 0.030 | 2.939 |
| 101 | Abrasive force in radial direction at depth $h_o$ | N | FabrskVo | 20.868 | 8.944 | 369.06 |
| 102 | Area of abrasion in trace at depth $h_o$ | mm² | Sraho | 0.036 | 0.015 | 0.592 |
| 103 | Abrasive force in radial direction at depth $h_o$ | N | FabrskVo | 20.868 | 8.944 | 369.06 |
| 104 | Abrasive force in trace at depth $h_o$ | N | FabrVo | 8.483 | 4.514 | 74.290 |
| 105 | Abrasive mass flow rate per hour/metals | kg/h | Mahodk | 27.360 | 58.813 | 21.885 |
| 106 | Abrasive mass flow rate per hour/nonmetals | kg/h | Mahodn | 12.617 | 15.896 | 5.915 |
| 107 | Cost indicator according to material type | 1 | Knaklm | 1.398 | 11.990 | 0.312 |
| 108 | Cost indicator according to change in technology | 1 | Knkawj | 1.398 | 11.990 | 0.312 |
| 109 | Indicator of ratio of price of cut to cost base | 1 | KcelVN | 1.000 | 0.665 | 0.360 |
| 110 | Indicator of price compensation in relation to base | 1 | Kckomp | 1.000 | 1.504 | 2.774 |

TABLE 3

| COL. | PARAMETER/MATERIAL according to ČSN | UNIT | SYMBOL | 11140 | Cu 99.5 | 17618 |
|---|---|---|---|---|---|---|
| 1 | Constant of cuttability of material using abrasive waterjet | μm | Kawj | 21.284 | 106.423 | 45.653 |
| 2 | Young's modulus | GPa | Emat | 216.753 | 96.935 | 148.010 |
| 3 | Price of electrical energy | CZK/kW | Ckwhod | 3.500 | 3.500 | 3.500 |
| 4 | Volume fraction of abrasive material in AWJ stream | 1 | lambda | 0.700 | 0.700 | 0.700 |
| 5 | Diameter of abrasive grain | mm | dazr | 0.188 | 0.188 | 0.188 |
| 6 | Selected diameter of abrasive nozzle | mm | da | 0.752 | 0.752 | 0.752 |
| 7 | Selected/required depth of cut | mm | $h_x$ | 8.000 | 8.000 | 8.000 |
| 8 | Selected ratio of diameters of nozzles Dv/Dabr | 1 | Kdvdao | 0.329 | 0.329 | 0.329 |
| 9 | Abrasive density | kg/m³ | Roa | 3.400 | 3.400 | 3.400 |
| 10 | Water density | g/cm³ | Rov | 1.000 | 1.000 | 1.000 |
| 11 | Total AWJ stream density | g/cm³ | Roj | 1.300 | 1.300 | 1.300 |
| 12 | Roughness of trace in neutral plane ($h_o$) | μm | $Ra_o$ | 3.700 | 3.700 | 3.700 |
| 13 | Deviation of trace from normal in neutral plane ($h_o$) | mm | $Yret_o$ | 1.000 | 1.000 | 1.000 |
| 14 | Class of cuttability using AWJ technology | 1 | Tcut | 5.336 | 4.987 | 5.170 |
| 15 | Limit depth of cut | mm | Hlim | 21.284 | 106.42 | 45.653 |
| 16 | Coefficient of cuttability | mm | Kawj | 21.284 | 106.42 | 45.653 |
| 17 | Depth of neutral plane | mm | $h_o$ | 5.753 | 28.763 | 12.339 |
| 18 | Yield stress in neutral plane | MPa | SIGklo | 465.57 | 98.76 | 384.71 |
| 19 | Radial roughness in neutral plane ($h_o$) | μm | Rarado | 7.947 | 11.884 | 9.618 |
| 20 | Total roughness in neutral plane | μm | Raskyo | 7.984 | 11.973 | 9.679 |
| 21 | Angle of trace curvature in neutral plane | grad | arcDo | 9.965 | 1.993 | 4.646 |

TABLE 3-continued

| COL. | PARAMETER/MATERIAL according to ČSN | UNIT | SYMBOL | 11140 | Cu 99.5 | 17618 |
|---|---|---|---|---|---|---|
| 22 | Optimum traverse speed | mm/min | Vpopt | 130.65 | 195.37 | 158.11 |
| 23 | Optimum pump pressure | MPa | Pvpopt | 195.62 | 130.82 | 161.64 |
| 24 | Calculation equivalent of brittle material density | g/cm$^3$ | ROskd | 2.300 | 1.759 | 2.025 |
| 25 | Calculation equivalent of metal material density | g/cm$^3$ | ROskW | 8.636 | 5.592 | 7.028 |
| 26 | Selected abrasive flow rate | kg/min | Maho | 0.004 | 0.004 | 0.004 |
| 27 | Optimum ratio of diameters of nozzles Dv/Dabr | 1 | Kdvda | 0.306 | 0.205 | 0.253 |
| 28 | Roughness of trace in any plane ($h_x$) | μm | $Ra_x$ | 6.022 | 0.813 | 2.125 |
| 29 | Radial roughness in any plane ($h_x$) | μm | $Ra_{radx}$ | 11.052 | 3.305 | 6.236 |
| 30 | Deviation of trace from normal in any plane ($h_x$) | mm | $Yret_x$ | 2.263 | 0.061 | 0.372 |
| 31 | Angle of trace curvature in any plane ($h_x$) | grad | arcDx | 16.218 | 0.438 | 2.668 |
| 32 | Depth of plasticity zone in cut | mm | hp | 10.642 | 53.212 | 22.827 |
| 33 | Design strength of material | MPa | SIGm | 1110.0 | 224.00 | 521.45 |
| 34 | Total roughness in any plane ($h_x$) | μm | Raskyx | 11.095 | 3.635 | 6.315 |
| 35 | Resistance of trace to force in neutral plane ($h_o$) | N | Fcutsto | 216.75 | 96.94 | 148.00 |
| 36 | Resistance of trace to force in any plane ($h_x$) | N | Fcutstx | 352.78 | 21.29 | 84 98 |
| 37 | Total stress in neutral plane ($h_o$) | MPa | SIGcutsko | 216.75 | 96.94 | 148.00 |
| 38 | Total stress in selected plane ($h_x$) | MPa | SIGcutskx | 301.22 | 29.430 | 96.563 |
| 39 | Roughness of trace in plane of plasticity zone (hp) | μm | Rap | 10.000 | 10.000 | 10.000 |
| 40 | Radial roughness in plane of plasticity zone (hp) | μm | Raradp | 14.703 | 21.985 | 17.793 |
| 41 | Deviation of trace from normal in plane of zone (hp) | mm | Yretp | 5.000 | 5.000 | 5.000 |
| 42 | Deviation of trace in plane of plasticity zone (hp) | grad | arcDp | 26.932 | 5.387 | 12.556 |
| 43 | Total roughness in plane of plasticity zone (hp) | μm | Raskyp | 14.755 | 22.064 | 17.858 |
| 44 | Total stress in plane of plasticity zone (hp) | N | SIGcutskp | 400.60 | 178.63 | 273.06 |
| 45 | Area of contact in neutral plane ($h_o$) | mm$^2$ | Scuto | 1.000 | 1.000 | 1.000 |
| 46 | Area of contact in plane of plasticity zone (hp) | mm$^2$ | Scutp | 1.462 | 1.467 | 1.465 |
| 47 | Grain size constant | 1 | Kzro | 0.001 | 0.001 | 0.001 |
| 48 | Volume of material removal in neutral plane ($h_o$) | mm$^3$ | Udho | 0.016 | 0.078 | 0.033 |
| 49 | Volume of material removal in plane of plasticity zone (hp) | mm$^3$ | Udhp | 0.016 | 0.078 | 0.033 |
| 50 | Area of contact in any plane ($h_x$) | mm$^2$ | Scutx | 1.171 | 0.724 | 0.880 |
| 51 | Volume of material removal in any plane ($h_x$) | mm$^3$ | Udhx | 0.016 | 0.071 | 0.033 |
| 52 | Weight of instantaneous brittle material removal for $h_o$ | mg | Gudhod | 0.036 | 0.137 | 0.675 |
| 53 | Weight of instantaneous brittle material removal for hp | mg | Gudhpd | 0.036 | 0.137 | 0.068 |
| 54 | Weight of instantaneous brittle material removal $h_x$ | mg | Gudhxd | 0.036 | 0.125 | 0.067 |
| 55 | Weight of instantaneous metal material removal $h_o$ | mg | Gudhow | 0.134 | 0.434 | 0.234 |
| 56 | Length of chip in neutral plane ($h_o$) | μm | dhmcmo | 15.536 | 77.664 | 33.319 |
| 57 | Length of chip in plane of plasticity zone (hp) | μm | dhmcmp | 10.644 | 53.214 | 22.829 |
| 58 | Length of chip in any plane ($h_x$) | μm | dhmcmx | 13.288 | 98.437 | 37.660 |
| 59 | Grain size of crushed material in neutral plane ($h_o$) | μm | Dzrrasto | 0.064 | 0.013 | 0.030 |
| 60 | Grain size of crushed material in plane of plasticity zone (hp) | μm | Dzrrastp | 0.094 | 0.019 | 0.044 |
| 61 | Grain size of crushed material in any plane ($h_x$) | μm | Dzrrastx | 0.075 | 0.010 | 0.027 |
| 62 | Weight of instantaneous metal material removal for hp | mg | Gudhpw | 0.134 | 0.436 | 0.235 |
| 63 | Weight of instantaneous metal material removal for $h_x$ | mg | Gudhxw | 0.134 | 0.398 | 0.233 |
| 64 | Stress component SIGy at depth $h_x$ | MPa | SIGyx | 266.96 | 40.21 | 108.57 |
| 65 | Stress component SIGx at depth $h_x$ | MPa | SIGxx | 851.50 | 183.48 | 412.88 |
| 66 | Normal stress component SIGn at depth $h_x$ | MPa | SIGnx | 584.55 | 143.28 | 304.31 |
| 67 | Shear component Tau at depth $h_x$ | MPa | Taux | 249.18 | 55.01 | −123.56 |
| 68 | Shear component TauV at depth $h_x$ | MPa | TauVx | 249.18 | 55.01 | −123.56 |
| 69 | Stress component SIGy at depth $h_o$ | MPa | SIGyo | 295.81 | 186.13 | 519.15 |
| 70 | Stress component SIGx at depth $h_o$ | MPa | SIGxo | 822.65 | 37.560 | 2.303 |
| 71 | Normal stress component SIGn at depth $h_o$ | MPa | SIGno | 526.84 | −148.573 | −516.85 |
| 72 | Shear component Tau at depth $h_o$ | MPa | Tauo | 232.36 | 55.534 | −34.273 |
| 73 | Shear component TauV at depth $h_o$ | MPa | TauVo | 232.36 | 55.534 | −34.273 |
| 74 | Stress component SIGy at depth hp | MPa | SIGyp | 1060.0 | 137.00 | 0.052 |
| 75 | Stress component SIGx at depth hp | MPa | SIGxp | 57.507 | 87.150 | 521.40 |
| 76 | Normal stress component SIGn at depth hp | MPa | SIGnp | −1000.0 | −49.392 | 521.35 |
| 77 | Shear component Tau at depth hp | MPa | Taup | 221.606 | 24.087 | −5.181 |
| 78 | Shear component TauV at depth hp | MPa | TauVp | 52.628 | 48.270 | −0.022 |
| 79 | Penetration time for limit depth of cut Hlim | sec | Tpopt | 1.699 | 1.136 | 1.404 |
| 80 | Penetration time for depth $h_x$ | sec | Tphxopt | 0.639 | 0.085 | 0.246 |
| 81 | Abrasive mass flow rate for depth $h_o$ | kg/s | Mavpopt | 8.000 | 5.200 | 6.600 |
| 82 | Abrasive mass flow rate for depth $h_x$ | kg/s | Mavpoptx | 2.600 | 0.223 | 0.807 |
| 83 | Poisson's ratio at level $h_o$ | 1 | Mio | 0.208 | 0.381 | 0.369 |
| 84 | Mean work done by cutting tool | J | Acelstr | 6.855 | 0.640 | 1.739 |
| 85 | Yield stress at level of neutral plane ($h_o$) | MPa | SIGyieldo | 465.57 | 311.34 | 384.71 |
| 86 | Penetration time for depth $h_o$ | sec | Tphxopto | 0.459 | 0.307 | 0.380 |
| 87 | El. energy consumption per hour of cutting | kWh | Nstrhod | 53.739 | 7.502 | 16.500 |
| 88 | Price of el. energy per hour of cutting | CZK/h | Ccutxhod | 188.09 | 26.258 | 57.751 |
| 89 | Number of metres per hour in relation to cut depth $h_o$ | m/h | Lhxcuthod | 7.839 | 11.722 | 9.487 |

TABLE 3-continued

| COL. | PARAMETER/MATERIAL according to ČSN | UNIT | SYMBOL | 11140 | Cu 99.5 | 17618 |
|---|---|---|---|---|---|---|
| 90 | Number of metres per shift in relation to cut depth $h_o$ | m/sm | Lhxcutsm | 54.874 | 82.056 | 66.408 |
| 91 | Number of metres per year in relation to cut depth $h_o$ | km/year | Lhxcutrok | 15.400 | 23.000 | 18.600 |
| 92 | Costs per cut metre at cut depth $h_o$ | CZK/m | CcelLhj | 239.933 | 22.400 | 60.875 |
| 93 | Costs per cut per shift at cut depth $h_o$ | th.CZK/shift | Ccelxsm | 13.200 | 1.840 | 4.040 |
| 94 | Costs per cut per year at cut depth $h_o$ | th.CZK/year | Ccelxrok | 3690.0 | 515.0 | 1130.0 |
| 95 | Costs per cut per hour at cut depth $h_o$ | CZK/h | Ccelxhod | 1880.0 | 263.00 | 577.51 |
| 96 | Ratio of diameters of nozzles Dv/Dabr - selection optimization | 1 | Kdvdak | 0.306 | 0.205 | 0.253 |
| 97 | Abrasive nozzle diameter - selection optimization | mm | damm | 0.955 | 0.769 | 0.862 |
| 98 | Water orifice diameter - selection optimization | mm | dvmm | 0.293 | 0.157 | 0.218 |
| 99 | Abrasive stress at level of depth $h_o$ | MPa | SIGabro | 269.95 | 180.53 | 223.07 |
| 100 | Area of abrasion in radial direction at depth $h_o$ | mm$^2$ | Sraskho | 0.046 | 0.344 | 0.119 |
| 101 | Abrasive force in radial direction at depth $h_o$ | N | FabrskVo | 12.436 | 63.257 | 26.69 |
| 102 | Area of abrasion in trace at depth $h_o$ | mm$^2$ | Sraho | 0.021 | 0.106 | 0.046 |
| 103 | Abrasive force in radial direction at depth $h_o$ | N | FabrskVo | 12.436 | 63.257 | 26.691 |
| 104 | Abrasive force in trace at depth $h_o$ | N | FabrVo | 5.763 | 19.548 | 10.203 |
| 105 | Abrasive mass flow rate per hour/metals | kg/h | Mahodk | 53.706 | 34.778 | 23.760 |
| 106 | Abrasive mass flow rate per hour/nonmetals | kg/h | Mahodn | 14.515 | 9.399 | 11.812 |
| 107 | Cost indicator according to material type | 1 | Knaklm | 4.406 | 0.449 | 0.952 |
| 108 | Cost indicator according to change in technology | 1 | Knkawj | 4.406 | 0.449 | 0.952 |
| 109 | Indicator of ratio of price of cut to cost base | 1 | KcelVN | 0.766 | 1.097 | 1.157 |
| 110 | Indicator of price compensation in relation to base | 1 | Kckomp | 1.306 | 0.911 | 0.864 |

TABLE 4

| COL. | UNIT | PARAM. | ČSN17251 | ČSN 13180 | SnPb40 | ČSN 11140 | Cu 99.5 | ČSN 17618 |
|---|---|---|---|---|---|---|---|---|
| 1 | µm | Kawj | 35.77 | 15.203 | 591.672 | 21.284 | 106.423 | 45.653 |
| 2 | MPa | Emat | 167200 | 256466 | 41110 | 216753 | 96935 | 148010 |
| 3 | mm | $h_o$ | 9.67 | 4.11 | 159.91 | 5.75 | 28.76 | 12.34 |
| 4 | CZK/CM | CcelLhj | 96.055 | 420.749 | 7.992 | 239.932 | 22.399 | 60.874 |
| 5 | CZK/h | Ccelhod | 857.348 | 3.03E+03 | 143.8672 | 1.88E+03 | 2.63E+02 | 577.506 |

TABLE 5

| | Input parameters | unit | symbol | value | note |
|---|---|---|---|---|---|
| 1 | Price of el. energy | CZK/kWh | Ckwhod | 3.5 | Update by price |
| 2 | Volume fraction of abrasive in AWJ stream | 1 | lambda | 0.7 | Update by abrasive material |
| 3 | Abrasive grain diameter | mm | dazr | 1.88E-01 | Update by abrasive material used |
| 4 | Selected diameter of abrasive nozzle | mm | da = 4 * dazr | 7.52E-01 | Update by abrasive material used |
| 5 | Selected/required depth of cut | mm | $h_x$ | 8 | Update by customer's demand |
| 6 | Constant for calculation of nozzle diameters Dv/Dabr | 1 | Kdvdao | 0.329 | Default value |
| 7 | Abrasive density | g/cm$^3$ | Roa | 3.4 | Update by abrasive material |
| 8 | Water density | g/cm$^3$ | Rov | 1 | Default value |
| 9 | Total density of AWJ stream | g/cm$^3$ | Roj | 1.3 | Update by abrasive type |
| 10 | Roughness of trace in neutral plane (ho)/theor. given const./ | µm | $Ra_o$ | 3.7 | Default values |
| 11 | Retardation of trace in neutral plane (ho)/theor. given const./ | mm | $Yret_o$ | 1 | Default value |

TABLE 6

| UNIT | SYMBOL | ČSN17251 | ČSN 13 180 | alloy SnPb40 |
|---|---|---|---|---|
| µm | Kawj | 35.770 | 15.203 | 591.67 |
| GPa | Emat | 167.200 | 256.466 | 41.110 |
| /—/ | Tcut | 5.223 | 5.409 | 4.614 |
| /—/ | classif. group | steels | steels | alloys, cast irons, non-ferrous metals |

| UNIT | SYMBOL | ČSN 11140 | Cu 99.5 | ČSN 17618 |
|---|---|---|---|---|
| µm | Kawj | 21.284 | 106.423 | 45.653 |
| GPa | Emat | 216.753 | 96.935 | 148.010 |
| /—/ | Tcut | 5.336 | 4.987 | 5.170 |
| /—/ | classif. group | steels | alloys, cast irons, non-ferrous metals | steels |

TABLE 7

| Material no. | Material | Kawj (A) (µm) | Kawj (B) (µm) | Kawj (C) (µm) | Kawj (D) (µm) | average (µm) |
|---|---|---|---|---|---|---|
| 1 | steel ČSN 17 251 | 35.77 | 35.221 | 34.467 | 35.221 | 35.171 |
| 2 | steel ČSN 13180 | 15.203 | 16.166 | 14.804 | 16.168 | 15.585 |
| 3 | alloy SnPb40 | 591.672 | 580.077 | 632.4 | 574.804 | 579.429 |
| 4 | steel ČSN 11140 | 21.284 | 25.317 | 24.41 | 25.328 | 24.085 |

TABLE 7-continued

| Material no. | Material | Kawj (A) (μm) | Kawj (B) (μm) | Kawj (C) (μm) | Kawj (D) (μm) | average (μm) |
|---|---|---|---|---|---|---|
| 5 | Cu 99.5 | 106.423 | 101.106 | 117.292 | 101.211 | 106.509 |
| 6 | steel 17 618 | 45.653 | 47.363 | 44.633 | 47.628 | 46.319 |
|  | average | 136 | 134.208 | 144.667 | 133.393 | 134.516 |
|  | diff. from average (%) | 1.104 | −0.229 | 7.547 | −0.835 | 0 |

TABLE 8

| Material no. | Material | Kawj (A) diff. from average (%) | Kawj (B) diff. from average (%) | Kawj (C) diff. from average (%) | Kawj (D) diff. from average (%) |
|---|---|---|---|---|---|
| 1 | steel ČSN 17 251 | 1.702 | 0.142 | −2.002 | 0.142 |
| 2 | steel ČSN 13180 | −2.453 | 3.726 | −5.013 | 3.739 |
| 3 | alloy SnPb40 | 2.113 | 0.112 | 9.142 | −0.798 |
| 4 | steel ČSN11140 | −11.631 | 5.114 | 1.348 | 5.160 |
| 5 | Cu 99.5 | −0.080 | −5.072 | 10.125 | −4.974 |
| 6 | steel 17 618 | −1.437 | 2.255 | −3.639 | 2.827 |

TABLE 9

| Steel ČSN 13180(mat.2) Physical unit | Kawj (μm) | Vpopt (mm/min) | Pv (MPa) | $m_a$ (g/min) | Hlim (mm) | Nkwhod (kWh) | Ckwhod (CZK/h) | $h_o$ (mm) | $R_{arad}$ (h = 8 mm) (μm) |
|---|---|---|---|---|---|---|---|---|---|
| Kawj(A) | 16.168 | 121.973 | 314.444 | 434.237 | 16.168 | 79.958 | 279.852 | 4.37 | 11.008 |
| Kawj(str) | 15.835 | 121.34 | 316.022 | 436.684 | 15.835 | 82.163 | 287.57 | 4.28 | 11.123 |
| differ. (phys. unit) | 0.333 | 0.633 | −1.578 | −2.447 | 0.333 | −2.205 | −7.718 | 0.089 | −0.115 |
| differ. (%) | 2.101 | 0.521 | −0.499 | −0.56 | 2.101 | −2.684 | −2.684 | 2.101 | −1.03389 |

Note:
Kawj can be Determined from Several Functional Relations:
Kawj=value according to Kawj=$Ra_x * h_x / Yret_x$, [m] or $Emat_x = (10^{24} * Yret_x/(Yret_{et} * Kawj_{et}^2))^{0.25}$, [MPa], $Kawj_x = 10^2/Emat_x^2$, [μm] or according to $Kawj_x = (10^4/V_{LUZ})^6$, [m] or $Kawj_x = 10^2/Emat^2$, [μm].

Algorithm 1, An Alogirthm for Abrasive Waterjet Cutting Technology:
Kawj=input data determined by methods A, B, C, D
Emat=10^6/1./Kawj.^0.5,
Ckwhod=according to price
Imbd=according to abrasive material
dazr=according to abrasive material
da=4.*dazr, according to abrasive material
hx=as required by customer
Kdvdao=0.329,
Roabr=according to abrasive material; Roa=Roabr,
Rov=1,
Roj=according to abrasive material
Rao=3.7,
Yreto=1,
Tcut=log 10(Emat),
Hlim=10.^12/1./Emat.^2
Kcut=10.^12/1./Emat.^2;Kplmat=10.^12/1./Emat.^2;
 Kawj=Kcut,
ho=Hlim/1./Rao, SIGm=1190.31.*20/1./Kcut,
h=0.01:0.1:Hlim;Hrel=h/1./Kplmat;Hekvp=h/1./Kplmat.*100;Hrelp=Hekvp;
Ra=(−10)*(1-Kplmat/1./(Kplmat-h));Kpl=Ra.*h;figure;plot(h,Ra,h,Kpl);grid
Eretz=Emat.*(Kpl/1./Kcut).^0.5;Eret=Emat.*(Kcut/1./Kpl).^0.5;figure;plot(h,Eretz,h,Eret,h, Emat);grid $V_{LUZ}$=(Emat.*10.^6).^(⅓),
Yret=Kpl/1./Kplmat;tan D=Yret/1./h;tgD=tan D;EPSyretV=10.^3.*Yret/1./Emat;Indho=log 10 (5 .41)/1./log 10(ho);figure;plot(h,Ra,h,Yret,h,h);grid,figure;plot (h,Ra,h,Kpl,h,Yret,h,Rao,h,Kplma t,h, Yreto);grid
SIGrz=Eretz.^0.5.*20/1./Kplmat;SIGrzx=SIGrz.*cos(a tan (tgD));SIGret=Eret.^0.5;SIGklo=E mat.^0.5,figure;plot(h, SIGrz,h,SIGrzx,h,SIGret,h,SIGklo);grid  SIGrzPlimE-PSrz=1001;EPSrz=SIGrz/1./Emat;EPSret=SIGret/1./ Emat;EPSklo=SIGklo/1./Em at;figure;plot(h,EPSrz,h, EPSret,h,EPSklo);grid;SIGrz=Eretz.^0.5.*20/1./Kplmat;
SIGeretz=Er etz.^0.5;SIGeretzx=Eretz.^0.5.*cos(a tan (tgD));SIGrzx=SIGrz.*cos(a tan(tgD));SIGret= Eret.^0 .5;SIGklo=Emat.^0.5,SIGrz=Eretz.^0.5.*20/1./ Kplmat;SIGeretz=Eretz.^0.5;SIGeretzx=Eretz. ^0.5.*cos(a tan(tgD));SIGrzx=SIGrz.*cos(a tan(tgD)); SIGret=Eret.^0.5;x=Kplmat;Kxy=SIGm/1./x;
Plim=Kxy.*h;Plim=SIGm/1./Kplmat.*h;figure;plot(h,SI-Grz,h,SIGrzx,h,SIGret,h,SIGklo, h,Plim,h,SIGeretz,h, SIGeretzx,h,SIGm);grid
fceRasklog=1001;SIGpr=Eret/1./Emat;
Rarado=Rao.*10.^3.*(Emat).^0.5/1./Emat;Rarad= Rao .*10.^3.*(Eretz).^0.5/1./Emat;Rasklog=(10.^(((log 10(h)).^2+(log 10(SIGpr)).^2).^0.5)+Rarad. ^2).^0.5; Raskyo=10.^log 10((log 10(ho)).^2+(log 10(1/1./ Yreto)).^2+Rarado.^2).^0.5,Rasky=1 0.^log 10((log 10(h)).^2+(log 10(1/1./Yret)).^2+Rarad.^2).^0.5;
Rarado=Rao.*10.^3.*(Emat).^0 .5/1./Emat;
Rarad=Rao.*10.^3.*(Eretz).^0.5/1./Emat;Rasklog=(10.^ (((log 10(h)).^2+(log 10(SI Gpr)).^2).^0.5)+Rarad.^2).^0.5;
Rarado=(Rao.*10.^3.*(Emat).^0.5/1./Emat);Rasklog= (10.^(((log 10(h)).^2+(log 10(Emat/1./Eret)).^2). ^0.5)+ Rarad.^2).^0.5;Rasklogo=(10.^(((log 10(ho)).^2+(log 10(Emat/1./Emat)).^2).^0.5)+Rarado.^2).^0.5;Rarad= (Rao.*10.^3.*(Eretz).^0.5/1./Emat)         ;Raradye= 3.7.*10.^3.*Yret.^0.25.*Emat.^0.5;Rasklogye=(10.^(((log 10(h)).^2+(log 10(SIGpr)).^2).^0.5)+Raradye.^2).^0.5; Rasky=10.^log 10((log 10(h)).^2+(log 10(1/1./Yret)).^2+ Rarad.^2).^0.5;Raradye=3.7.*10.^3.*Yret.^0.25.* Emat.^-0.5;Raske=10.^ log 10((log 10(h)).^2+ (log 10(Eret/1./ Emat)).^2+(Rarad.^2).^0.5;Rasky=10.^ log 10((log 10(h)).^2+(log 10(1/1./Yret)).^2+Rarad.^2).^0.5;figure; plot(h,Ra,h,Rao,h,Rarad,h,Rar ado,h,Rasky,h,Raskyo);

grid,figure;plot(h,Raske,h,Rasky);grid,figure;plot(h,Rarad,h,Rasklog, h,Rasklogye,h,Raradye);grid
arcDo=a tan(tan(Yreto/1./ho)).*180/1./3.14, arcD=a tan(tan(Yret/1./h)).*180/1./3.14;figure;plot (h, arcDo,h, arcD,h,Yreto,h,Yret,h,Rao,h,h,h,Ra,h,Rarad,h,Rarado,h,Rasky,h,Raskyo);grid
Vpopt=(10.^-3.*Rao).^0.5.*10.^6/1./Emat.^0.5, Vpostopt=Vpopt;Vcutrast=(10.^-3.*Rao).^0.5.*10.^6/1./SIGrz;x=Kplmat;Kxy=SIGm/1./x; Plim=1(xy.*h/1./Rarado;SIGrasky=10.^-3.*Rasky.*Emat/1./Rao;
Vcutrasky=(10.^-3.*Raskyo).^0.5.*10.^6/1./SIGrasky;
SIGrzrast=10.^-3.*Ra.*Emat/1./(Rao);SIGrzrarad=10.^-3.*Rarad.*Emat/1./Rao;SIGrzrasklog=10.^-3.*Rasklog.*Emat/1./(Rao);SIGrzrasklogo=10.^-3.*Rasklogo.*Emat/1./(Rao);Vpregulrast=(10.^-3.*Rao).^0.5.*10.^6/1./SIGrzrast;Vpregulsigrast=(10.^-3.*Rao).^0.5.*10.^6/1./SIGrz;Vpregulrarad=(10.^-3.*Rao).^0.5.*10.^6/1./SIGrzrarad;Vpregulrasklog=(10.^-3.*Rao).^0.5.*10.^6/1./SIGrzrasklog ;figure;plot(h,Vpopt,h,Vcutrast,h,Vcutrasky);grid,figure;plot(h,Vpregulrarad,h,V pregulrasklog,h,Vpopt,h,Vpregulrast);grid
Pvpopt=Imbd.^-1.*Rov/1./Roabr.*(10.^-3.*Rao).^0.5.*10.^6/1./Vpopt,Pvpcut=Imbd.^-1.*Rov/1./Roabr.*(10.^-3.*Rao).^0.5.*10.^6/1./Vcutrast;Pvpcutx=Pvpcut.*cos(a tan(tgD));figure;plot(h,Pvpopt,h,Pvpc ut,h,Pvpcutx,h,Vpopt,h,Vcutrast,h,Vcutrasky);grid
ROskd=0.5.*(Emat/1./0.55688/1./4000).^0.33333,
ROskW=(10.^6/1.(10.^12/1./Emat.^2)/1./16).^0.27,
Maho=Imbd.*Rao.^-1.*Kdvdao.*ROskW.*10.^-3.*Vpopt.*60.^-1.*(Kcut/1./ho),Mahcut=Imbd.*Rao.^-1.*Kdvdao.*ROskW.*10.^-3.*Vcutrast.*60.^-1.*(Kcut/1./ho);figure;plot(h,Maho,h,Mahcut);grid
Kdvda=2.*Rao.*10.^3.*60.*Maho/11 (Imbd.*ROskW.*Vpostopt.*Rarado),
Kplmat=Kcut;Kplmat=Hlim;Rax=(-10).*(1-Kplmat/1./(Kplmat-hx)),Emi=0:10000:400000;Kmi=10.^12/1./Emi.^2;Vopti=(10.^-3.*Rao).^0.5.*10.^6.*Emi.^-0.5;figure;plot(Emi, Kmi,Emi,Vopti);grid
Raradx=Rarado.*hx.*ho.^-1,
Yretx=Rax.*hx/1./Kcut,
arcDx=a tan(tan(Yretx/1./hx)).*180/1./3.14
hp=Kcut/1./2
SIGm=1190.31.*20/1./Kcut,
Raskyx=10.^ log 10((log 10(hx)).^2+(log 10(1/1./Yretx)).^2+Raradx.^2).^0.5
Fcutsto=10.^-3.*Rao.*Emat/1./(Rao)
Fcutstx=10.^-3.*Rax.*Emat/1./(Rao)
SIGcutsko=10.^-3.*Raskyo.*Emat/1./(Raskyo)
SIGcutskx=10.^-3.*Raskyx.*Emat/1./(Raskyo)
Rap=(-10).*(1-Kplmat/1./(Kplmat-hp))
Raradp=Rarado.*hp.*ho.^-1,
Yretp=Rap*hp/1./Kcut,
arcDp=a tan(tan(Yretp/1./1./hp)).*180/1./3.14,
Raskyp=10.^ log 10((log 10(hp)).^2+(log 10(1/1./Yretp)).^2+Raradp.^2).^0.5
Fcutstp=10.^-3.*Rap.*Emat/1./(Rao);
SIGcutskp=10.^-3.*Raskyp.*Emat/1./(Raskyo)
Scuto=Fcutsto/1./SIGcutsko
Scutp=Fcutstp/1./SIGcutskp
Kzro=0.001,dhmcmo=Kzro.*(10.^3.*Kcut.*(Rao/1./(Rao.*10.^3.*ho)+1)-(Rao.*10.^3.*ho)/1./Rao);
dho=dhmcmo;Udho=10.^-3.*Scuto.*dho
dhmcmp=Kzro.*(10.^3.*Kcut.*(Rap/1./(Rap.*10.^3.*hp)+1)-(Rap.*10.^3.*hp)/1./Rap);
dhp=dhmcmp;Udhp=10.^-3.*Scutp.*dhp
Scutx=Fcutstx/1./SIGcutskx dhmcmx=Kzro.*(10.^3.*Kcut.*(Rax/1./(Rax.*10.^3.*hx)+1)-(Rax.*10.^3.*hx)/1./Rax);dhx=dhmcmx;Udhx=10.^-3.*Scutx.*dhx
Gudhod=10.^-3.*Udho.*ROskd
Gudhpd=10.^-3.*Udhp.*ROskd
Gudhxd=10.^-3.*Udhx.*ROskd
Gudhow=10.^-3.*Udho.*ROskW
dhmcmo=1(zro.*(10.^3.*Kcut.*(Rao/1./(Rao.*10.^3.*ho)+1)-(Rao.*10.^3.*ho)/1./Rao)
dhmcmp=Kzro.*(10.^3.*Kcut.*(Rap/1./(Rap.*10.^3.*hp)+1)-(Rap.*10.^3.*hp)/1./Rap)
dhmcmx=Kzro.*(10.^3.*Kcut.*(Rax/1./(Rax.*10.^3.*hx)+1)-(Rax.*10.^3.*hx)/1./Rax)
Dzrrasto=dho.^-1,Dzrrastp=dhp.^-1,Dzrrastx=dhx.^-1
dhmcmraskh=Kzro.*(10.^3.*Kcut.*(Rasky/1./(Rasky.*10.^3.*h)+1)–(Rasky.*10.^3.*h)/1./Rasky);
dskh=dhmcmraskh;Dzrraskh=dskh.^-1;figure;plot(h,Dzrrasto,h,Dzrrastp,h,Dzrrastx,h,Dzrraskh,(Kplmat-h),Dzrraskh);grid
dhmcmradh=1(zro.*(10.^3.*Kcut.*(Rarad/1./(Rarad.*10.^3.*h)+1)–(Rarad.*10.^3.*h)/1./Rarad);
dradh=dhmcmradh;Dzrradh=dradh.^-1;figure;plot(h,dhmcmo,h,dhmcmp,h,dhmcmx,h,dradh,(Kplmat-h),dradh);grid,figure;plot(h,Dzrrasto,h,Dzrrastp,h,Dzrrastx,h,Dzrradh,(Kplmat-h),Dzrradh);grid
dhmcmrasth=1(zro.*(10.^3.*Kcut.*(Ra/1./(Ra.*10.^3.*h)+1)-(Ra.*10.^3.*h)/1./Ra);dsth=dhmcmrasth;
Dzrrasth=dsth.^-1;figure;plot(h,dhmcmo,h,dhmcmp,h,dhmcmx,h,dsth);grid,figure;plot(h,Dzrrasto,h,Dzrrastp,h ,Dzrrastx,h,Dzrrasth,(Kplmat-h),Dzrrasth);grid,figure;plot(h,Dzrrasto,h,Dzrrasth, (Kplmat-h),Dzrrasth,h,Dzrraskh,(Kplmat-h),Dzrraskh,h,Dzrradh,(Kplmat-h),Dzrradh);grid
Gudhpw=10.^-3.*Udhp.*ROskW
Gudhxw=10.^-3.*Udhx.*ROskW
SIGyx=SIGm-SIGm.*(cos(arcDx)).^2,
SIGxx=SIGm-SIGm.*(sin(arcDx)).^2
SIGnx=SIGxx-SIGyx
Taux=(SIGxx-SIGyx)/1./2.*sin(2.*arcDx)
TauVx=(SIGxx-SIGyx)/1./2.*sin(2.*arcDx)
SIGyo=SIGm-SIGm.*(cos(arcDo)).^2
SIGxo=SIGm-SIGm.*(sin(arcDo)).^2
SIGno=SIGxo-SIGyo
Tauo=(SIGxo-SIGyo)/1./2.*sin(2.*arcDo)
TauVo=(SIGxo-SIGyo)/1./2.*sin(2.*arcDo)
SIGyp=SIGm-SIGm.*(cos(arcDp)).^2
SIGxp=SIGm-SIGm.*(sin(arcDp)).^2
SIGnp=SIGxp-SIGyp
Taup=(SIGxp-SIGyp)/1./2.*sin(2.*arcDp)
TauVp=(SIGxo-SIGyp)/1./2.*sin(2.*arcDp)
Tpopt=Hlim/1/(ho.*Vpostopt.*60.^-1)
Tphxopt=hx/1./(ho.*Vpostopt.*60.^-1)
Mavpopt=Rao.^-1.Imbd.*Kdvda.*ROskW.*10.^-3.*Vpostopt.*60.^-1.*(Kcut/1 lho),
Mavpoptx=Mavpopt.*Tphxopt,Mio=0.5.*Emat.^0.5/1./SIGm
Mio=0.5.*((Emat.^0.5/1./SIGm).^2).^0.5;Astrobj=(((1-2.*Mio)/1./(6.*Emat).*(SIGm+SIGm).^2).^2).^0.5;Atstr=(1+Mio)/1./(3.*Emat).*(SIGm.^2+SIGm.^2-SIGm.*SIGm);Acelstr=1.5.*(Astrobj+Atstr),
SIGeret=Eret.^0.5;SIGyield=SIGeret;
SIGyieldo=Emat.^0.5,Mixao=0.5.*Emat.^0.5/1./SIGm;
Mixa=0.5.*((Emat.*(Kplmat/1./(Ra.*h/1./Yret))).^0.5).^0.5/1./(1190.31.*20/1./(Ra.*h/1./Yret)));Mixa=0.5.*SIGeret/1./SIGm;Mixao=0.5.*SIGyieldo/1./SIGm;
SIGmXao=SIGyieldo+SIGyieldo.*Mio/1./Mixao;
SIGmXa=SIGeret+SIGeret.*Mio/1./Mixa;MiXa=0.5.*

(1-SIGeret/1./SIGmXa);MiXao=0.5.*(1-SIGyieldo/1./
SIGmXao),figure;plot(h,SIGmXa,h,SIGmXao,h,SIGm,h,
SIGeret,h,SIGyieldo);grid,figure;plot(h,Mixa,h,Mio,h,
MiXa,h,MiXao);grid Tphxopto=ho/1./(ho.*Vpostopt.*60.^-1),
Tpoptho=Tphxopto;Ncelstr=Acelstr/1./Tphxopto,figure;
plot(h,Astrobj,h,Atstr,h,Acelstr);grid Tphcut=h/1./(ho.*Vcutrast.*60.^-1);Ncelstrcut=Acelstr/1./
Tphcut;figure;plot(h,Tphxopto,h,Tphcut,h,Ncelstr,h,
Ncelstrcut,h,Ace lstr);grid Fcutst=10.^-3.*Ra.*Emat/1./(Rao);SIGcutsk=10.^-
3.*Rasky.*Emat/1./(Raskyo);Scut=Fcutst/1./SIGcutsk;
figure;plot(h,Fcutst,h,SIGcutsk,h,Scut,   h,Fcutsto,h,
SIGcutsko,h,Scuto);grid Kzro=0.001,dhmcmcut=Kzro.*(10.^3.*Kcut.*(Ra/1./
(Rao.*10.^3.*ho)+1)-(Rao.*10.^3.*ho)/1./Rao);
dhcut=dhmcmcut;Udhcut=10.^-3.*Scut.*dhcut;figure;
plot(h,dhmcmo,h,dhmcmcut,h,Udho,h,Udhcut,h,Scut,h,
Scuto);grid Xdhmcmo=ho/1./(10.^-3.*dhmcmo),Xdhmcmx=hx/1./
(10.^-3.*dhmcmx),Xdhmcmcut=h/1./(10.^-3.*dhmcm-
cut);figure;plot(h,Xdhmcmo,h,Xdhmcmcut);grid Nstrhod=10.^-3.*Ncelstr.*3600,Ncelstrcuthod=10.^-
3.*Ncelstrcut.*3600;figure;plot(h,Nstrhod,h,Ncelstr-
cuthod);grid Ccutxhod=Nstrhod.*Ckwhod,
Cskcutxhod=Ncelstrcuthod.*Ckwhod;
Cskcutxsm=Ncelstrcuth       od.*Ckwhod.*7;
Cskcutxrok=Ncelstrcuthod.*Ckwhod.*7.*280;

Vpostopt=Vpostopt,Lhxcuthod=10.^-3.*Vpostopt.*60,Lhx-
cutsm=10.^-3.*Vpostopt.*60.*7,Lhxcutrok=10.^-
3.*Vpostopt.*60.*7.*280, CcelLhj=10.*Ccutxhod/1./Lhxcuthod,
CskcelLhj=10.*Cskcutxhod/1./Lhxcuthod;figure;plot(h,
CcelLhj,h,CskcelLhj);grid,figure;plot(h,Nstrhod,h,Ncel-
strcuthod,h,Ccutxhod,h,Cskcutxhod,h    ,Lhxcuthod,h,
CcelLhj);grid GudhoD=10.^-3.*Udho.*ROskd,GudhoW=10.^-
3.*Udho.*ROskW,GudcuthoD=10.^-3.*Udhcut.*ROskd;
Gudcuthod=GudcuthoD;GudcuthoW=10.^-
3.*Udhcut.*ROskW;Gudcuthow=GudcuthoW;figure;plot
(h,GudhoD,h,GudhoW,h,Gudcutho    D,h,GudcuthoW);
grid GhxkgWhod=Xdhmcmx.*Gudhxw.*Lhxcuthod.*10.^
3.*10^-3,GcutkgWhod=Xdhmc
mcut.*GudcuthoW.*Lhxcuthod.*10.^3.*10^-3;

GhxkgD
hod=Xdhmcmx.*Gudhxd.*Lhxcuthod.*10.^3.*10^-3,
GcutkgDhod=Xdhmcmcut.*GudcuthoD.*Lhxcu-
thod.*10.^3.*10^-3;

GhxkgWsm=Xdhmcmx.*Gudhxw.*Lhxcuthod.*10.^
3.*7.*10^-3,GcutkgWsm=GcutkgWhod.*7;
GhxkgDsm=Xdhmcmx.*Gudhxd.*Lhxcuthod.*10.^
3.*7.*10^-3,GcutkgDsm=GudcuthoD.*7;
GhxkgWrok=Xdhmcmx.*Gudhxw.*Lhxcuthod.*10.^
3.*7.*280.*10^-3,GcutkgWrok=GcutkgWsm.*280;
GcuttunaWrok=GcutkgWsm.*280.*10^-3;
GhxkgDrok=Xdhmcmx.*Gudhxd.*Lhxcuthod.*10.^
3.*7.*280.*10^-3,GcutkgDrok=GcutkgWsm.*280;
GcuttunaDrok=GcutkgWsm.*280.*10^-3;
GhokgWhod=Xdhmcmo.*Gudhow.*Lhxcuthod.*10.^
3.*10^-3,
GhcutkgWhod=Xdhmcmcut.*Gudcuthow.*Lhxcu-
thod.*10.^3.*10^-3;figure;plot(h,GhokgWhod,h,Ghcut-
kgWhod);grid GhokgD
hod=Xdhmcmo.*Gudhod.*Lhxcuthod.*10.^3.*10^-3,
GhcutkgDhod=Xdhmcmcut.*Gudcuthod.*Lhxcu-
thod.*10.^3.*10^-3;figure;plot(h,GhokgDhod,h,Ghcut-
kgDhod);grid GhokgWsm=Xdhmcmo.*Gudhow.*Lhxcuthod.*10.^3.*7.
*10^-3,
GhcutkgWsm=Xdhmcmcut.*Gudcuthow.*Lhxcuthod.
*10.^3.*7.*10^-3;figure;plot(h,GhokgWsm,h,Ghcutkg-
Wsm);grid GhokgDsm=Xdhmcmo.*Gudhod.*Lhxcuthod.*10.^3.*7.
*10^-3,
GhcutkgDsm=Xdhmcmcut.*Gudcuthod.*Lhxcuthod.
*10.^3.*7.*10^-3;figure;plot(h,GhokgDsm,h,Ghcut-
kgDsm);grid GhokgWrok=Xdhmcmo.*Gudhow.*Lhxcuthod.*10.^3.
*7.*280.*10^-3,GhotunaWrok=10.^-3.*GhokgWrok;
GhcutkgWrok=Xdhmcmcut.*Gudcuthow.*Lhxcuthod.
*10.^3.*7.*280.*10^-3;figure;GhcuttunaWrok=10.^-
3.*GhcutkgWrok;plot(h,GhokgWrok,h,GhcutkgWrok,h,
GhotunaWrok,h,GhcuttunaWrok);grid GhokgDrok=Xdhmcmo.*Gudhod.*Lhxcuthod.*10.^3.*7.
*280.*10^-3,
GhcutkgDrok=Xdhmcmcut.*Gudcuthod.*Lhxcuthod.
*10.^3.*7.*280.*10^-3;GhotunaDrok=10.^-
3.*GhokgDrok,GhcuttunaDrok=10.^-3.*GhcutkgDrok;
figure;plot(h,GhokgDrok,h,    GhcutkgDrok,h,Gho-
tunaDrok,h,GhcuttunaDrok) ;grid Mavpoptk=Imbd.*Kdvda.*ROskW.*10.^-
3.*Vpostopt.*60.^-1.*(Kcut/1./ho);
Mavpoptcut=Imbd.*Kdvda.*ROskW.*10.^-3.*Vcu-
trast.*60.^-1.*(Kcut/1./h);figure;plot(h,Mavpoptk,h,
Mavpoptcut);grid Mavpopthodk=Mavpoptk.*3600
Mavpopthod=Mavpopt.*3600,Kko-
mplNVr=0.01404.*2.718.^(-Emat/1./-38120.35969)+
0.27047.*2.718.^(-Emat/1./1.81394E90), KkomplVNr=
(0.01404.*2.718.^(-Emat/1./-38120.35969)+
0.27047.*2.718.^(-Emat/111.81394E90)).^-1, Ccelxsm=10.*Nstrhod.*Ckwhod.*7,
Ccelstrcutsm=10.*Ncels trcuthod.*Ckwhod.*7;figure;plo
t(h,Cc elx sm,h,Ccelstrcutsm);grid Ccelxrok=10.*Nstrhod.*Ckwhod.*7.*280,
Ccelstrcutrok=10.*Ncelstrcuthod.*Ckwhod.*7.*28 0;fig-
ure;plot(h,Ccelxrok,h,Ccelstrcutrok);grid Ccelxhod=10.*Nstrhod.*Ckwhod,Ccels
trcuthod=10.*Ncelstrcuthod.*Ckwhod;figure;plot(h,C
celxhod,h,Ccelstrcuthod);grid CcelhtunaDrok=10.^3.*Ccelxrok/1./GhcutkgDrok;
CcelhotunaDrok=10.^3.*Ccelxrok/1./Gho kgDrok,figure;
plot(h,CcelhtunaDrok,h,CcelhotunaDrok);grid CcelhtunaWrok=10.^3.*Ccelxrok/1./GhcutkgWrok;
CcelhotunaWrok=10.^3.*Ccelxrok/1./G  hokgWrok,fig-
ure;plot(h,CcelhtunaWrok,h,CcelhotunaWrok);grid,fig-
ure;plot(h,CcelhtunaWro       k,h,CcelhotunaWrok,h,
CcelhtunaDrok,h,CcelhotunaDrok);grid,figure;plot
(CcelhtunaWrok, G hcutkgWrok.*10.^-3);grid ROskdkontr=Gudhxd/1./(10.^-3.*Udhx)
RoskWkontr=Gudhxw/1./(10.^-3.*Udhx)
Vpostoptk=(10.^-3.*Rao).^0.5.*10.^6/1./Emat.^0.5,UZkpli=
(Emat.*10.^6).^0.3333,UZkpli=(Eret.*10.^6).^0.33 33;fig-
ure;plot(h,UZkpl,h,UZkpli);grid Pvpoptk=Imbd.^-1.*Rov/1./Roabr.*(10.^-
3.*Rao).^0.5.*10.^6/1./Vpostopt,
Mavpoptk=Rao.^-1.*1    mbd.*Kdvda.*ROskW.*10.^-
3.*Vpostopt.*60.^-1.*(Kcut/1./ho)

Kdvdak=2.*Rao.*10.^3.*60.*Maho/11 (lmbd.*ROskW.*Vpostopt.*Rarado),
PRODUKTnanox=1001;CcuttunaWrok=Ccelxrok/1./GhcuttunaWrok;CcuttunaDrok=Ccelxrok/1./GhcuttunaDrok;figure;plot(CcuttunaWrok,GhcuttunaWrok, CcuttunaDrok,GhcuttunaDr ok,CcuttunaDrok,h);grid
va=(2*Pvpopt.*1000/1./(Roj.*1000))^0.5,
Ckh=4.*Mavpopt/1./(3.14.*Roa.*1000.*va.*da.^2),
da=10.*4.*Mavpopt/1./(Ckh.*3.14.*Roa.*1000.*va).^0.5; damm=10.*10.^3.*(4.*Mavpopt/1./(Ckh.*3.14.*Roa.*1000.*va).^0.5),
dv=da.*Kdvda;dvmm=damm.*Kdvda,
fceVteorHteorVhlHhl=1001;Sp=1;HlimHL=Kcut;hv=0:1:Kcut;VpHL=((Ckh.*Sp.*3.14.*0. 00025.* (2.*1300.*3000000.^3.*2.178.^(−5.*0.6.*1)).^0.5.*(1−0.5.^2)).*(8.*hy.*10.^−3.* (3000000.*7800.*0.5.^2.*2.178.^(−2.*0.6.*1)+ 600.*10.^6.*1300)).^−1.^0.67−0.0001;hteor=Ra.^−1.*Kplmat.*(((10.^−3.*Rao).^0.5.*10.^6/1./Vcutrast).^2/1./Emat).^2;figure;plot(hv,VpHL.*1000.*60);grid,figure; plot(hteor,Vcutrast);grid,figure;plot(hv, VpHL.*1000.*60,hteor,Vcutrast);grid
Ckhm=0.74414.*(0.04133+1.93305.*2.718^−Emat/ 1113119.96742)+0.25291.*2.718^−Emat/ 11322550.21047))
E=10000:10000:700000;Ckhe=0.74414.*(0.04133+ 1.93305.*2.718^−E/1113119.96742)+0.25291.*2.718.^(−E/11322550.21047));
damme=10.^3.*10.^4.*Mavpopt/1./(Ckhe.*3.14.*Roa.*1000.*va).^0.5;dvmme=Kdvdak.*damme;figure;plot(E,Ckhe,E,damme,E,dvmme);grid
dammh=10.^3.*10.^4.*Mavpoptcut/1./(Ckh.*3.14.*Roa.*1000.*va).^0.5;dvmmh=Kdvdak.*dammh;figure;plot(h,dammh,h,dvmmh);grid
OKfceMacut=1001;Mavpopthinvxy=100.*(2.*Rao.^2.*1 mbd.*Kdvda.*ROskW.*10.^−3.*Vpostopt.*60.^−1).*(ho/1.*Kcut+h/1./Kcut)/1./cos(a tan(tgD)).^1;Mavpopthinvho=100.*(2.*Rao.^2.*1 mbd.*K dvda.*ROskW.*10.^−3.*Vpostopt.*60.^−1).*(ho/1./Kcut+ho/1./Kcut);figure; plot(Mavpopthinvxy,h,Mavpopthinvho,h);grid
ROZBORxABRAZE=2222;SIGrzo=Emat.^0.5; SIGabr=SIGrzx-Pvpcut;SIGabro=SIGrzo-Pvpoptk, SIGabrXY=SIGabr/1./cos(a tan(tgD)).^Kplmat; Srah=Ra.*h.*10.^−3;Sraskh=Rasky.*h.*10.^−3; Fabr=SIGabr.*Srah;Fabrxy=Fabr/1./cos(a tan(tgD)); FabrXY=Fabr/1./cos(a tan(tgD)). AKplmat;SIGcutabrsk=SIGcutsk-Pvpcut; SIGcutabrsko=SIGcutsko-Pvpoptk,SIGabrskV=(SIGcutabrsk.^2+SIGabr.^2).^0.5;SIGabrskVo=(SIGcutabrsko.^2+SIGa bro.^2).^0.5,Sraskh=Rasky.*h.*10.^−3; Sraskho=Raskyo.*ho.*10.^−3, FabrskV=SIGabrskV.*Sraskh; FabrskVo=SIGabrskVo.*Sraskho, Fabrsk=SIGabr.*Sraskh;Fa brskXY=Fabrsk/1./cos(a tan(tgD)).^Kplmat;Fabrskx=Fabrsk.*cos(a tan(tgD)); Srah=10.^−3.*Ra.*h;Sraho=10.^−3.*Rao.*ho, FabrV=SIGabrskV.*Srah; FabrskVo=SIGabrskVo.*Sraskho,FabrVo= SIGabrskVo .*Sraho,RqhodsklogV=log 10(5.41)/ 1./log 10(ho).*Rao.*((log(h).^2+log((h.*tgD).^−1).^0.25).^2).^0.333; RqhodsklogxxxV=RqhodsklogV.*cos(a tan(tgD)).^ (3.*Indho.^−1);SIGrzqhoxV=10.^−3.*Emat.*2.*RqhodsklogxxxV/1./Rao; SIGrzqhoxVVV=SIGrzqhoxV.*(20/1./Kplmat).^0.5;figure;plot(h,SIGabr,h,SIGabrskV,h,FabrskV,h,Sraskh,h,SIGabr,h,FabrVo,h,Yret);grid,figure;p lot(h,SIGabr,h,SIGabrXY,h,FabrskXY,h,Fabrskx,h,SIGrzqhoxVVV,h, Sraskh,h,Sraskh/1./h);g rid
PRODUKTnano=1001;CcuttunaWrok=Ccelxrok/1./GhcuttunaWrok;CcuttunaDrok=Ccelxrok/1./GhcuttunaDrok; figure;plot(CcuttunaWrok, GhcuttunaWrok,CcuttunaDrok,GhcuttunaDro k,CcuttunaDrok,h);grid
fceNOVAxSIGrzqhoxVB=1001;EPSyretV=10.^3.*Yret/1./Emat;Indho=log 10(5.41)/1./logl 0(ho);Yreto=1; Rarado=Rao.*10.^3.*(Emat).^0.5/1./Emat;Kcut=Kplmat; SIGm=1190.31.*20/1./Kcut,SIGret=Eret.^0.5;Yret=Kpl/1./Kcut;tgD=tan(Yret/1./h);arcD=a tan(tgD).*180/1./ 3.14; x=Kplmat;Kxy=SIGm/1./x; Plim=Kxy.*h; EPSyretV=10.^3.*Yret/1./Emat;Indho=log 10 (5.41)/1./ log 10(ho);Rqhodsklog=log 10(5.41)/1./log 10(ho).*Rao.*((log(h).^2+log((h.*tgD).^−1).^0.25).^2). ^0.333/1./cos(a tan(tgD));RqhodsklogV=log 10(5.41)/1./ log 10(ho).*Rao.*((log(h) .^2+log((h.*tgD).^−1).^0.25). ^2).^0.333;RqhodsklogxxxV=RqhodsklogV.*cos(a tan (tgD)).^(3.*Indho.^−1);
Rqhodsklogxxx=Rqhodsklog.*cos(a tan(tgD)).^ (3.*Indho.^−1);SIGrzqhoxV=10.^−3.*Emat.*2.*RqhodsklogxxxV/1./Rao; SIGrzqhoxV=10.^−3.*Emat.*RqhodsklogxxxV/1./ Rarado;EPSelrzq=SIGrzqhoxV/1./Emat; SIGrzqEPSabsH=100 1;EPSelrzq=SIGrzqhoxV/1./Emat; Khel=ho/1./0.006;Kekvhpel=27/1./0.006;Kyretel=Yreto/ 1./0.006;RqhodsklogVB=log 10(5.41)/1./log 10(ho).*Rao.*((log(h).^2+log((h.*tgD).^−1).^0.25).^2). ^0.5;RqhodsklogxxxVB=RqhodsklogVB.*cos(a tan (tgD)).^(3.*Indho.^−1);SIGrzqhoxVB=10.^− 3.*Emat.*2.*RqhodsklogxxxVB/1./Raskyo;Kekvhel=27/ 1./0.006;figure;plot(EPSyretV,SIGrz qhoxVB,EPSyretV, SIGrzqhoxV);grid,figure;plot(h,SIGrzqhoxVB,h, SIGrzqhoxV);grid
komplMOHRxrozkladHabsHrelp=1001;SIGind=SIGm; SIGy=SIGind-SIGind.*(cos(a tan(tgD))).^2; SIGx=SIGind-SIGind.*(sin(a tan(tgD))).^2;SIGn=SIGx-SIGy;Tau=(SIGx-SIGy)/112.*sin(2.*a tan(tgD).*180/1./ 3.14;TauV=(SIGx-SIGy)/1./2.*sin(2.*arcD); Yretn=Yret.*cos(a tan(tgD));arcD=a tan(tgD).*180/ 113.14;SIGy=SI Gind-SIGind.*(cos(a tan(tgD))).^2; SIGx=SIGind-SIGind.*(sin(a tan(tgD))).^2; SIGn=SIGind.*(cos(a tan(tgD))).^2+SIGind.*(sin(a tan (tgD))).^2; SIGn=SIGx-SIGy;Yretn=Yret.*cos(a tan (tgD));Tau=(SIGx-SIGy)/1./2.*sin(2.*a tan(tgD).*180/1./ 3.14);TauV=(SIGx-SIGy)/1./2.*sin(2.*arcD);arcD=a tan (tgD).*180/1./3.14;arcDr=a tan(tgD);SIGy=SIGind-SIGind.*(cos(a tan(tgD))).^2;SIGx=SIGind-SIGind.* (sin(a tan(tgD))).^2;SIGn=SIGind.*(cos(a tan(tgD))).^2+ SIGind.*(sin(a tan(tgD))).^2; SIGn=SIGx-SIGy; Yretn=Yret.*cos(a tan(tgD));EPSelrzq=SIGrzqhoxV/1./ Emat;Khel=ho/1./0.006;Kekvhp el=27/1./0.006; Kyretel=Yreto/1./0.006;figure;plot(EPSelrzq.*Kekvhpel, SIGrzqhoxVB,Hrelp, SIGy,Hrelp,SIGx,Hrelp,SIGn, Hrelp,h,Hrelp,Tau,Hrelp,TauV,Hrelp,arcD,Hrelp,Yret, Hrelp,SI GrzqhoxVB);grid,figure;plot(EPSelrzq.*Khel, SIGrzqhoxVB,h,SIGy,h,SIGx,h,SIGn,h,h,h,Tau ,h, TauV, h, arcD,h,Yret,h,SIGrzqhoxVB);grid
komplMOHRxrozkladEPSyretV=1001;figure;plot(EPSelrzq,SIGrzqhoxVB,EPSyretV, SIGy ,EPSyretV,SIGx, EPSyretV,SIGn,EPSyretV,h,EPSyretV,Tau,EPSyretV, TauV,EPSyretV,arcD, EPSyretV,Yret,EPSyretV, SIGrzqhoxVB);grid
Tplicut=h/1./(ho.*Vcutrast.*60.^−1);Tphcuto=ho/1./ (ho.*Vpostopt.*60.^−1);Tphcuth=Tphcuto.*h/1./ho;figure;plot(h,Tphcut,h,Tphcuto,h,Tphcuth);grid ROZBORxEcutFabrxPvpxSIGiliefekt=1001;
Fcutrask=SIGcutsk.*Srah;Fcutrzra=SIGrz.*S rah;
Sraho=10.^-3.*Rao.*ho;Fcutrasko=SIGcutsko.*Sraho;
Fcutrzrao=SIGrzo.*Sraho;SIGrzo=Emat.^0.5;Pvpc
uto=Pvpopt;figure;plot(h,SIGcutsk,h,SIGcutsko,h,SIGrz,
h,SIGrzo,h,SIGrzx,h,Fcutrask,h,Fcut rzra,h,Fcutrasko,h,
Sraskh,h,Sraskho,h,Pvpcut,h,Pvpcutx,h,Pvpcuto,h,Yret,
h,SIGabrskV,h,SIG rzqhoxVB,h,Ra,h,Rarad,h,Rasky,h,
arcD));grid NOVAfceSIGefxEPSyretV=1001;SIGef=Kplmat/1./20.*
(Plim*SIGrzqhoxVB).^0.5;EPSele f=SIGef/1./Emat;
EPSelefh=ho/1.10.006.*EPSelef;figure;plot(EPSelefh,
SIGef,h,SIGef,h,Plim) ;grid KOMPLAWJREZxABRxTplicutxTUH=2222;Tphcut=h/1./
(ho.*Vcutrast.*60.^1);Hrelp=h/1./Kplmat.*100;SIGrz=
(Eretz).^0.5.*20/1./Kplmat;SIGrzx=SIGrz.*cos(a tan
(tgD)) ;Khel=ho/1./0.006;Kyretel=Yreto/1./0.006;
EPSelrzx=SIGrzx/1./Emat;SIGabr=SIGrzx-Pvpcut;
SIGabrXY=SIGabr/1./cos(a tan(tgD)).^Kplmat;
Srah=Ra.*h.*10.^-3;Sraskh=Rasky.*h.*10.^-3;
Fabr=SIGabr.*Srah;Fabrxy=Fabr/1./cos(a tan(tgD));
FabrXY=Fabr/1./cos(a tan(tgD)). AKplm
at;Fabrsk=SIGabr.*Sraskh;FabrskXY=Fabrsk/1./cos(a
tan(tgD)).^Kplmat;EPSelrzqVB=SIGrz qhoxVB/1./Emat;
Khel=ho/1./0.006;EPSelrzqVBh=EPSelrzqVB.*Khel;
Kekvhpel=27/1./0.006;EPSelrzqVB
ekvp=EPSelrzqVB.*Kekvhpel;Kyretel=Yreto/1./0.006;
EPSelrzqVB yret=EPSelr zqVB.*Kyretel;figure;plot
(EPSelrzqVB,SIGrzqhoxVB,EPSyretV,SIGrzqhoxVB,
EPSyretV,P vpopt,EPSyretV,Pvpcut,EPSyretV,Pvpcutx,
EPSyretV,Vpopt,EPSyretV,Vcutrast,EPSyretV,V
cutrasky,EPSyretV,SIGrzx,EPSyretV,SIGrz,EPSyretV,
Mavpopthinvxy,EPSyretV,Mavpopthi nvho,EPSyretV,
arcD,EPSyretV,Yret,EPSyretV,Ra,EPSyretV,Rarad,
EPSyretV,Rasky,EPSyret V,SIGabr,EPSyretV,Fabr,
EPSyretV,Fabrsk,EPSyretV,Plim,EPSyretV,Yret,
EPSyretV,SIGabr XY, EPSyretV,FabrXY);grid ABRAZEslozky=1001;SIGabrskV;FabrskXY=Fabrsk/1./
cos(a tan(tgD)).^Kplmat;Fabrsk=SI Gabr.*Sraskh;
Fabrskx=Fabrsk.*cos(a tan(tgD));figure;plot(h,SIGabr,h,
SIGabrXY,h,Fabrskx,h ,FabrskXY);grid SIGrzqEPSxllekvp=1001;SIGkl=Eret.^0.5;
SIGklo=Emat.^0.5;EPSelrzqVB=SIGrzqhoxVB/1./Emat;
Kekvhpel=27/1./0.006;figure;plot(EPSelrzq.*Kekvhel,SI-
GrzqhoxVB,Hekvp,SIGrz,He kvp,SIGyield,Hekvp,
SIGret,Hekvp,SIGyieldo,Hekvp,SIGrzqhoxVB,Hekvp,
SIGrzqhoxVV,H ekvp,Plim,Hekvp,Yret);grid SIGrzqEPSxYret=1001;EPSelrzqVB=SIGrzqhoxVB/1./
Emat;Kyretel=Yreto/1./0.006;figure; plot
(EPSelrzqVB.*Kyretel,SIGrzqhoxV,Yret,SIGrz,Yret,SI-
Gret,Yret,SIGklo,Yret,SIGrzqhox VB, Yret,
SIGrzqhoxVV,Yret,Plim,Yret,Yret,Yret, SIGyield,Yret,
SIGyieldo);grid SIGrzqEPSabsH=1001;EPSelrzqVB=SIGrzqhoxVB/1./
Emat;Khel=ho/1./0.006;figure;plot(E PSelrzqVB.*Khel,
SIGrzqhoxV,h,SIGrz,h,SIGret,h,SIGklo,h,SIGrzqhoxVB,
h,SIGrzqhoxVV, h,Plim,h,Yret,h,SIGyield,h,SIGyieldo);
grid SIGrzqEPSretV=1001;EPSelrzqVB=SIGrzqhoxVB/1./
Emat;Kyretel=Yreto/1.10.006;figure;p lot(EPSelrzqVB,
SIGrzqhoxVB,EPSyretV,SIGrz,EPSyretV,SIGret,
EPSyretV,SIGklo,EPSyret V,SIGrzqhoxVB,EPSyretV,
SIGrzqhoxVV,EPSyretV,Plim,EPSyretV,Yret,EPSyretV,
SIGyiel d,EPSyretV, SIGyieldo);grid,
SIGrz=Eretz.^0.5.*20/1./Kplmat;SIGrzx=SIGrz.*cos(a tan
(tgD));EPSelr=SIGrz/1./Emat;Khel=ho/1./0.006;
Kyretel=Yreto/1.10.006;Kekvhel=27/1./0.006;figure;plot
(EPSelr.*Khel,SIGrz,h, SIGrz,h,SIGrzx,h,Plim,h,Yret);
grid,figure;plot(EPSelr,SIGrz,EPSyretV,SIGrz,EPSyretV,
SIGr zx,EPSyretV,Plim,EPSyretV,Yret);grid,figure;plot
(EPSelr.*Kyretel,SIGrz,Yret,SIGrz,Yret,SI Grzx,Yret,
Plim,Yret,Yret);grid,figure;plot(EPSelr.*Kekvhel,SIGrz,
Hekvp,SIGrz,Hekvp, SIGr zx,Hekvp,Plim,Hekvp,Yret,
Hekvp, SIGyield,Hekvp,SIGyieldo);grid,figure;plot
(EPSelrzqVB. *Khel,SIGrzqhoxVB,h,SIGyield,h,
SIGyieldo,h,SIGkl,h,SIGklo,h,SIGrzqhoxVB,h,SIGrz,h,
SI Grzx);grid KOMPLAWJREZxABRxHabsxVxTcutTUHxMOD=3333;
Hrelp=h/1./Kplmat.*100;SIGrz=(Eretz).^0.5.*20/1./Kpl-
mat;SIGrzx=SIGrz.*cos(a tan(tgD));Khel=ho/1.10.006;
Kyretel=Yreto/1./0.006;EPSelrzx=SIGrzx/1./Emat;
SIGabr=SIGrzx-Pvpcut;Srah=Ra.*h.*10.^-3;
Sraskh=Rasky.*h.*10.^-3;Fabr=SIGabr.*Srah;
Fabrxy=Fabr/1./cos(a tan(tgD));Fabrsk=SIGabr.*Sraskh;
EPSelrzqVB=S IGrzqhoxVB/1./Emat;Khel=ho/1.10.006;
EPSelrzqVBh=EPSelrzqVB.*Khel;Kekvhpel=
27/1./0 .006;EPSelrzqVB ekvp=EPSelrzqVB.*Kekvhpel;
Kyretel=Yreto/1./0.006;EPSelrzqVBh=EPSe
lrzqVB.*Khel;figure;plot(EPSelrzqVBh,SIGrzqhoxVB,
h,SIGrzqhoxVB,h,Pvpopt,h,Pvpcut,h, Pvpcutx,h,Vpopt,
h,Vcutrast,h,Vcutrasky,h,Sraskh,h,Ra,h,Rarad,h,Rasky,h,
SIGabr,h,Fabr,h,Fa brsk,h,Yret,h,SIGabrXY,h,FabrXY,h,
Eretz,h,Eret,h,Emat,h,Emat.^-1,h,Eret.^-1,h,Eretz.^-1,h,
Tphcut);grid fceVdefhxVdefoxVpopto=1001;
EPSyretV=10.^3.*Ra.*h.*Kplmat.^-1/1./Emat;
EPSyretV=10.^3.*Yret/1./Emat;
EPSyretVo=10.^3.*Rao.*ho.*Kplmat.^1/1./Emat,
Vdefho=ho/1./(EPSyretVo.*Tpoptho.*ho.^-1);Vdefh=ho/
1./(EPSyretV.*Tpoptho.*h.^-1);Tdefh=Vdefh.^-1;figure;
plot(Hekvp,Vdefho,Hekvp,Vdefh,Hekvp,Tdefh,Hekvp,
Yret);grid, fceHLADxSIGrzqhoxVB=1001;SIGrzqhoxVB=
10.^-3.*Emat.*2.*((log 10(5.41)/1./log 10(ho).*Rao.*
((log(h).^2+log((Yret).^-1).^0.25).^2).^0.5).*cos(a tan
(Yret/1./h)).^(3.*Indho.^-1))/1.1(10.^log 10((log
10(ho)).^2+(log 10(1/1./Yreto)).^2+Rarado.^2).^0.5);fig-
ure;plot(h,SIGrz qhoxVB);grid fceHLADkomplMOHRxrozkladHabsHrelp=1001;
SIGind=SIGm;SIGy=SIGind-SIGind.*(cos(a tan(Yret/1./
h))).^2;SIGn=SIGind-SIGind.*(sin(a tan(Yret/1./h))).^2;
SIGn=SIGx-SIGy;Tau=(SIGx-SIGy)/1./2.*sin(2.*a tan
(Yret/1./h).*180/1./3.14);TauV=(SIGx-SIGy)/1./2.*sin
(2.*Yret/1./h);Yretn=Yret.*cos(a tan(Yret/1./h));arcD=a
tan(Yret/1./h).*180/1./3.14;SIGy=SIGind-SIGind.*
(cos(a tan(Yret/1./h))).^2;SIGx=SIGind-SIGind.*(sin(a
tan(Yret/1./h))).^2;SIGn=SIGind.*(cos(a tan(Yret/
1./h))).^2+SIGind.*(sin(a tan(Yret/1./h))).^2;SIGn=SIGx-
SIGy;Yretn=Yret.*cos(a tan(Yret/1./h));Tau=(SIGx-
SIGy)/1./2.*sin(2.*a tan(Yret/1./h).*180/1./3.14);TauV=
(SIGx-SIGy)/1./2.*sin(2.*Yret/1./h);arcD=a tan(Yret/1./
h).*180/1./3.14;arcDr=a tan(Yret/1./h);SIGy=SIGind-
SIGind.*(cos(a tan(Yret/1./h))).^2;SIGx=SIGind-
SIGind.*(sin(a tan(Yret/1./h))).^2;SIGn=SIGind.*(cos(a
tan(Yret/1./h))).^2+SIGind.*(sin(a tan(Yret/1./h))).^2;
SIGn=SIGx-SIGy;Yretn=Yret.*cos(a tan(Yret/1./h));
EPSelrzq=SIGrzqhoxV/1./Emat;Khel=ho/1./0.006;Ke
kvhpel=27/1.10.006;Kyretel=Yreto/1./0.006;figure;plot
(EPSelrzq.*Kekvhpel,SIGrzqhoxVB,H relp,SIGy,Hrelp,
SIGx,Hrelp,SIGn,Hrelp,h,Hrelp,Tau,Hrelp,TauV,Hrelp,
arcD,Hrelp,Yret,Hrel p,SIGrzqhoxVB);grid;figure;plot
(EPSelrzq.*Kekvhpel,h,SIGy,h,SIGx,h,SIGn,
h,h,h ,Tau,h,TauV,h, arcD,h,Yret,h,SIGrzqhoxVB);grid
komplDIAGRAMxSIGrqEPSxHabsEPSyretV=1001;
RqhodsklogVx=RqhodsklogV.*cos(a tan(Yret/1./h));

SIGrq=RqhodsklogV.*Kplmat.^2/1./20;
SIGrqx=RqhodsklogVx.*Kplmat.^2/1./20;Vpqx=(10.^-3.*Rao).^0.5.*10.^6/11 SIGrqx;Vpq=(10.^-3.*Rao).^0.5.*10.^6/11 SIGrq;figure;plot(h,Vpq,h,Vpqx);grid,figure;plot(h,SIGrq,h,SIGrqx,h,Vdefho,h,Vdefh,h,Tdef h,h,Yret,h,RqhodsklogV,h,RqhodsklogVx,h,arcD,h, cos(a tan(Yret/1./h)));grid,figure;plot(Hekvp,RqhodsklogV,Hekvp,RqhodsklogVx);grid,
EPSelrq=SIGrq/1./Emat;EPSmelo=SIGm/1./E mat, Kmelo=ho/1./EPSmelo;figure;plot(EPSelrq,SIGrq, EPSelrq.*Kmelo,SIGrq,h,SIGrq,h,SIG rqx,h,Plim);grid, figure;plot(EPSelrq,SIGrq,EPSyretV,SIGrq,EPSyretV, SIGrqx,EPSyretV,Pli m);grid,figure;plot (EPSelrq.*Kmelo,SIGrq,h,SIGrq,h,SIGrqx,h,Plim,h, RqhodsklogV,h,Rqhod sklogVx,h,Vdefho,h,Vdefh,h, Tdefh,h,Yret,h,arcD,h, cos(a tan(Yret/1./h)),h,Vpq,h, Vpregulrara d,h,Vpregulras t,h,Vpqx,h,Vpregulrasklog); grid,figure;plot(EPSelrq.*Kmelo,SIGrq,EPSelrq,S IGrq, EPSyretV,SIGrq,EPSyretV,SIGrqx,EPSyretV,Plim, EPSyretV,RqhodsklogV,EPSyretV, RqhodsklogVx, EPSyretV,Vdefho,EPSyretV,Vdefh,EPSyretV,Tdefh, EPSyretV,Yret,EPSyret V, arcD,EPSyretV, cos(a tan(Yret/1./h)),EPSyretV,Vpq,EPSyretV,Vpregulrarad,EPSyretV, Vpr egulrast,EPSyretV, Vpqx,EPSyretV,Vpregulrasklog); grid
RqbodsklogV=log 10(5.41)/1./log 10(ho).*Rao.* ((log(h).^2+log((h.*tgD).^-1).^0.25).^2).^0.333; RqhodsklogVx=RqhodsklogV.*cos(a tan(Yret/1./h)); RqhodsklogVxy=R qhodsklogV/1./cos(a tan(Yret/1./h)); SIGrq=RqhodsklogV.*Kplmat.^2/1./20;SIGrqx=Rqhodsk logVx.*Kplmat.^2/1./20;RqhodsklogVB=log 10(5.41)/1./ log 10(ho).*Rao.*((log(h).^2+log((h. *tgD).^-1).^0.25).^2).^0.5;
RqhodsklogxxxVB=RqhodsklogVB.*cos(a tan(tgD)).^(3.*Indho.^1);SIGrzqhoxVB=10.^-3.*Emat.*2.*RqhodsklogxxxVB/1./Raskyo;figure;plot(h, Rarad,h,Rasklog,h,Rasklogye,h,Rara dye,h, RqhodsklogVxy,h,RqhodsklogV,h,RqhodsklogVx);grid
fceSIGrqHabs=1001;Yreto=1;Rarado=Rao.*10.^3.* (Emat).^0.5/1./Emat;Kcut=Kplmat;SIG m=1190.31.*20/ 1./Kcut,SIGret=Eret.^0.5;Yret=Kpl/1./Kcut;tgD=tan (Yret/1./h);arcD=a tan(tg D).*180/1./3.14;x=Kplmat; Kxy=SIGm/1./x; Plim=1(xy.*h;EPSyretV=10.^3.*Yret/ 1./Emat;Indho=log 10(5.41)/1./log 10(ho); Rqhodsklog=log 10(5.41)/1./log 10(ho).*Rao.* ((log(h).^2+log((h.*tgD).^-1).^0.25).^2).^0.333/1./cos(a tan(tgD));RqhodsklogV=log 10(5.41)/1./log 10(ho).*Rao.*((log(h) .^2+log((h.*tgD).^-1).^0.25). ^2).^0.333;RqhodsklogxxxV=RqhodsklogV.*cos(a tan (tgD)).^(3.*Indho.^-1); Rqhodsklogxxx=Rqhodsklog.*cos(a tan(tgD)).^(3.*Indho.^-1);SIGrzqhoxV=10.^-3.*Emat.*2.*RqhodsklogxxxV/1./Rao; SIGrzqhoxVV=10.^-3.*Emat.*RqhodsklogxxxV/1./Rarado;EPSelrzq=SIGrzqhoxV/1./Emat; SIGrzqEPSabsH=100 1;EPSelrzq=SIGrzqhoxV/1./Emat; Khel=ho/1./0.006;Kekvhpel=27/1.10.006;Kyretel=Yreto/ 1./0.006;
KOMPLAWJREZxABRxHabsxTUH=2222;SIGrz= (Eretz).^0.5.*20/1./Kplmat;SIGrzx=SI Grz.*cos(a tan (tgD));Khel=ho/1./0.006;EPSelrzx=SIGrzx/1./Emat; SIGabr=SIGrzx-Pvpcut;SIGabrXY=SIGabr/1./cos(a tan (tgD)).^Kplmat;Srah=Ra.*h.*10.^-3; Sraskh=Rasky.*h.*10.^-3;Fabr=SIGabr.*Srah; FabrXY=Fabr/1./cos(a tan(tgD)).^Kplmat; Fabrsk=SIGabr.*Sraskh;EPS elrzqVB=SIGrzqhoxVB/1./ Emat;Khel=ho/1./0.006;
EPSelrzqVBh=EPSelrzqVB.*Khel;figure; plot(EPSelrzqVBh,SIGrzqhoxVB,h,SIGrzqhoxVB,h,Pvpopt,h, Pvpcut,h,Pvpcutx,h,Vpopt,h,V cutrast,h,Vcutrasky,h,SI-Grzx,h,SIGrz,h,Mavpopthinvxy,h,arcD,h,Yret,h,Ra,h, Rarad,h,Rasky, h,SIGabr,h,SIGabrXY,h,Fabr,h,FabrXY,h, Fabrsk,h,Plim,h,Yret,h,Sraskh);grid
ROZBORxABRAZE=1001;SIGcutabrsk=SIGcutsk-Pvpcut;SIGabrskV=(SIGcutabrsk.^2+SIGabr.^2).^0.5; Sraskh=Rasky.*h.*10.^-3;FabrskV=SIGabrskV.*Sraskh; figure;plot(h,SIGabr,h,Fabrsk,h,SIGabrskV,h,FabrskV,h, Sras kh,h,SIGabr,h,Fabr,h,Fabrsk,h,Yret);grid figure;plot (EPSelrzqVBh,SIGrzqhoxVB,h,SIGrzqhoxVB,h,Plim); grid,figure;plot(EPSel rzq,SIGrzqhoxVB,EPSyretV, SIGrzqhoxVB,EPSyretV,Plim);grid
KOMPLAWJREZxHrelpxTUH=2222;Hrelp=h/1./Kpl-mat.*100;SIGrz=(Eretz).^0.5.*20/1./Kplmat; SIGrzx=SIGrz.*cos(a tan(tgD));Khel=ho/1./0.006; Kyretel=Yreto/1./0.006;EPSelrzx=SIGrzx/1./Emat; SIGabr=SIGrzx-Pvpcut;Srah=Ra.*h.*10.^-3; Sraskh=Rasky.*h.*10.^-3;Fabr=SIGabr.*Srah; Fabrxy=Fabr/1./cos(a tan(tgD));SIGabrXY=SIGabr/1./ cos(a tan(tgD)).^Kplmat;FabrXY=Fabr/1./ cos(a tan(tgD)).^Kplmat;Fabrsk=SIGabr.*Sraskh; EPSelrzqVB=SIGr zqhoxVB/1./Emat;Khel=ho/1./0.006; EPSelrzqVBh=EPSelrzqVB.*Khel;Kekvhpel=27/1./0.006;EPSelrzqVBekvp=EPSelrzqVB.*Kekvhpel; Kyretel=Yreto/1.10.006;EPSelrzqVB yret=EPSelrzqVB.*Kyretel;figure;plot(EPSelrzqVByret,SI-GrzqhoxVB,Hrelp,SIGrzqhoxVB,Hrelp,Pvpo pt,Hrelp, Pvpcut,Hrelp,Pvpcutx,Hrelp,Vpopt,Hrelp,Vcutrast, Hrelp,Vcutrasky,Hrelp,SIGrzx,Hr elp,SIGrz,Hrelp, Mavpopthinvxy,Hrelp,Mavpopthinvho,Hrelp,arcD,Hrelp, Yret,Hrelp,Ra,Hrel p,Rarad,Hrelp,Rasky,Hrelp,SIGabr, Hrelp,Fabr,Hrelp,Fabrsk,Hrelp,Plim,Hrelp,Yret,Hrelp,SI GabrXY,Hrelp,FabrXY);grid
KOMPLAWJREZxYretxTUH=2222;Hrelp=h/1./Kpl-mat.*100;SIGrz=(Eretz).^0.5.*20/1./K plmat; SIGrzx=SIGrz.*cos(a tan(tgD));Khel=ho/1./0.006; Kyretel=Yreto/1.10.006;EPSelrzx=SI Grzx/1./Emat; SIGabr=SIGrzx-Pvpcut;Srah=Ra.*h.*10.^-3; Sraskh=Rasky.*h.*10.^-3;Fabr=SIGabr.*Srah; Fabrxy=Fabr/1./cos(a tan(tgD));Fabrsk=SIGabr.*Sraskh; EPSelrzqVB=S IGrzqhoxVB/1./Emat;Khel=ho/1./0.006; EPSelrzqVBh=EPSelrzqVB.*Khel;Kekvhpel= 27/1./0 .006;EPSelrzqVB ekvp=EPSelrzqVB.*Kekvhpel; Kyretel=Yreto/1./0.006;EPSelrzqVB yret=EP SelrzqVB.*Kyretel;figure;plot(EPSelrzqVByret,SI-GrzqhoxVB,Yret,SIGrzqhoxVB,Yret,Pvpo pt,Yret, Pvpcut,Yret,Pvpcutx,Yret,Vpopt,Yret,Vcutrast,Yret, Vcutrasky,Yret,SIGrzx,Yret,SIGr z,Yret,Mavpopthinvxy, Yret,Mavpopthinvho,Yret,arcD,Yret,Yret,Yret,Ra,Yret, Rarad,Yret,Ra sky,Yret,SIGabr,Yret,Fabr,Yret,Fabrsk, Yret,Plim,Yret,Yret,Yret,SIGabrXY,Yret,FabrXY);grid
KOMPLAWJREZxEPSyretVxTUH=2222;Hrelp=h/1./Kpl-mat.*100;SIGrz=(Eretz).^0.5.*2 0/1./Kplmat; SIGrzx=SIGrz.*cos(a tan(tgD));Khel=ho/1./0.006; Kyretel=Yreto/1./0.006;EPSelr zx=SIGrzx/1./Emat; SIGabr=SIGrzx-Pvpcut;Srah=Ra.*h.*10.^-3; Sraskh=Rasky.*h.*10.^-3;Fabr=SIGabr.*Srah; Fabrxy=Fabr/1./cos(a tan(tgD));Fabrsk=SIGabr.*Sraskh; EPSelrzqVB=S IGrzqhoxVB/1./Emat;Khel=ho/1./0.006; EPSelrzqVBh=EPSelrzqVB.*Khel;Kekvhpel= 27/1./0 .006;EPSelrzqVB ekvp=EPSelrzqVB.*Kekvhpel; Kyretel=Yreto/1./0.006;EPSelrzqVB yret=EP SelrzqVB.*Kyretel;figure;plot(EPSelrzqVB,SI-GrzqhoxVB,EPSyretV,SIGrzqhoxVB,EPSyret V,Pvpopt, EPSyretV,Pvpcut,EPSyretV,Pvpcutx,EPSyretV,Vpopt, EPSyretV,Vcutrast,EPSyret V,Vcutrasky,EPSyretV, SIGrzx,EPSyretV,SIGrz,EPSyretV,Mavpopthinvxy, EPSyretV,Mavpo pthinvho,EPSyretV,arcD,EPSyretV, Yret,EPSyretV,Ra,EPSyretV,Rarad,EPSyretV,Rasky,EPS yretV,SIGabr,EPSyretV,Fabr,EPSyretV,Fabrsk,EPSyretV, Plim,EPSyretV,Yret,EPSyretV,SIG abrXY,EPSyretV,FabrXY);grid Rqhodsklog V=log 10(5.41)/1./log 10(ho).*Rao.* ((log(h).^2+log((h.*tgD).^-1).^0.25).^2).^0.333; RqhodsklogxxxV=RqhodsklogV.*cos(a tan(tgD)).^ (3.*Indho.^-1);SIGrzqhoxV=10.^-3.*Emat.*2.*RqhodsklogxxxV/1./Rao; SIGrzqhoxVVV=SIGrzqhoxV.*(20/1./Kplmat).^0.5;

SIGrzqhoxV=10.^-3.*Emat.*2.*RqhodsklogxxxV/1./Rao;

fceNOVAxSIGrzqhoxVB=1001;RqhodsklogVB=log 10(5.41)/1./log 10(ho).*Rao.*((log(h).^2+log((h.*tgD).^-1).^0.25).^2).^0.5; RqhodsklogxxxVB=RqhodsklogVB.*cos(a tan(tgD)).^ (3.*Indho.^-1);SIGrzqhoxVB=10.^-3.*Emat.*2.*RqhodsklogxxxVB/1./Raskyo;Kekvhel=27/ 1./0.006;figure;plot(EPSyretV,SIGrz qhoxVB,EPSyretV, SIGrzqhoxV);grid,figure;plot(h,SIGrzqhoxVB,h, SIGrzqhoxV);grid ROZBORxEcutFabrxPvpxSIGiliefekt=1001; Fcutrask=SIGcutsk.*Srah;Fcutrzra=SIGrz.*S rah; Sraho=10.^-3.*Rao.*ho;Fcutrasko=SIGcutsko.*Sraho; Fcutrzrao=SIGrzo.*Sraho;SIGrzo=Emat.^0.5;Pvpc uto=Pvpopt;figure;plot(h,SIGcutsk,h,SIGcutsko,h,SIGrz, h,SIGrzo,h,SIGrzx,h,Fcutrask,h,Fcut rzra,h,Fcutrasko,h, Sraskh,h,Sraskho,h,Pvpcut,h,Pvpcutx,h,Pvpcuto,h,Yret, h,SIGabrskV,h,SIG rzqhoxVB,h,Ra,h,Rarad,h,Rasky,h, arcD);grid fceTUHOST=1001;figure;plot(h,SIGabr,h,Fabr,h,SIGabrXY,h,FabrXY);grid SIGrzqEPSretVVV=1001;EPSelrzq=SIGrzqhoxV.*(20/1./ Kplmat).^0.5/1./Emat;Kyretel=Yr eto/1./0.006; SIGeloV=Emat.^0.5.*(20/1./Kplmat).^0.5;Kxy=SIGm/1./ Kplmat; Plim=Kxy.*h;Kxyo=SIGm/1./ho; Plimo=Kxyo.*h;Kxyel=SIGeloV/1./ho;Plimel=Kxyel.*h; Kxyelo=Emat.^0.5/1./ho;Plimelo=K xyelo.*h;figure;plot (EPSelrzq,SIGrzqhoxV,EPSyretV,SIGrzqhoxV.*(20/1./ Kplmat).^0.5,EPS yretV,Plim,EPSyretV,SIGyield.*(20/1./ Kplmat).^0.5,EPSyretV,SIGyieldo.*(20/1./Kplmat).^0 .5,EPSyretV,Plimo);grid, SIGrzqHabsVVV=1001;EPSelrzq=SIGrzqhoxV.* (20/1./Kplmat).^0.5/1./Emat;Kyretel=Yret o/1./0.006; SIGeloV=Emat.^0.5.*(20/1./Kplmat).^0.5;Kxy=SIGm/1./ Kplmat; Plim=Kxy.*h;Kxyo=SIGm/1./ho; Plimo=Kxyo.*h;Kxyel=SIGeloV/1./ho;Plimel=Kxyel.*h; Kxyelo=Emat.^0.5/1./ho;Plimelo=K xyelo.*h;figure;plot (h,SIGrzqhoxV.*(20/1./Kplmat).^0.5,h,Plim,h,SIGyield.* (20/1./Kplmat).^0.5,h,Plimo,h,Plimel,h,Plimelo);grid, SIGrzqhoxVVV=SIGrzqhoxV.*(20/1./Kplmat).^0.5; EmatX=30000:5000:300000;Vpostoptk= (10.^-3.*Rao).^0.5.*10.^6/1./EmatX.^0.5; KawjEx=10.^12/1./EmatX.^2;figure;plot(EmatX,Vpostop tk);grid,figure;plot(EmatX,Kawj Ex)grid KawjX=10:50:700;Vpostoptk=(10.^-3.*Rao).^0.5.*10.^6/1./ (10.^6/1./KawjX.^0.5).^0.5;figure;plot(KawjX, Vpostoptk);grid KawjX=10:5:700;EmatX=10.^6/1./KawjX.^0.5; VpostoptkX=(10.^-3.*Rao).^0.5.*10.^6/1./(10.^6/1./ KawjX.^0.5).^0.5;figure;plot(KawjX,VpostoptkX);grid, May poptkX=Imbd.*Kdvda.*ROskW.*10.^-3.*VpostoptkX.*60.^-1.*(Kcut/1./ho); MavpoptkhodX=3600.*MavpoptkX;PvpoptkX=Imbd.^-1.*Rov/1./Roabr.*(10.^-3.*Rao).^0.5.*10.^6/1./ VpostoptkX;figure;plot(KawjX, Vpos toptkX,KawjX, PvpoptkX,KawjX ,MavpoptkhodX,KawjX,KawjX, KawjX,EmatX/1./1000);grid, KawjX=10:5:700;VpostoptkX,(10.^-3.*Rao).^0.5.*10.^6/1./ (10.^6/1./KawjX.^0.5).^0.5;figure;plot(KawjX, VpostoptkX);grid,May poptkX=60.*Imbd.*Kdvda.*ROskW.*10.^-3.*VpostoptkX.*60.^-1.*(Kcut/1./ho); MavpoptkhodX=3600.*MavpoptkX; MavpoptkminX=60.*MavpoptkX;Pvpop tkX=Imbd.^-1.*Rov/1./Roabr.*(10.^-3.*Rao).^0.5.*10.^6/1./ VpostoptkX;Kdvdakx=2.*Rao.*10.^3.*60.*Maho/1./ (Imbd.*ROskW. *VpostoptkX.*Rarado);HraXo=KawjX/ 1./Rao;dammx=20.*(4.*MavpoptkX/1./(Ckh.*3.14.* Roa.*1000.*va).^0.5);dvmmx=dammX.*2.*Kdvda;figure;plot(KawjX,VpostoptkX,KawjX,P vpoptkX,KawjX, MavpoptkminX,KawjX, KawjX,KawjX,EmatX/1./1000, KawjX,HraXo,Kawj X,dammX,KawjX,dvmmX);grid, techKOMPLEXxPV=1001;KawjX=10:5:700;VpostoptkX= (10.^-3.*Rao).^0.5.*10.^6/1./(10.^6/1./KawjX.^0.5).^0.5; figure;plot(KawjX,VpostoptkX);grid,May poptkX=60.*Imbd.*Kdvda.*ROskW.*10.^-3.*VpostoptkX.*60.^-1.*(Kcut/1./ho); MavpoptkhodX=3600.*MavpoptkX; MavpoptkminX=60.*MavpoptkX;Pvpop tkX=1.5.* (Imbd.^-1.*Rov/1./Roabr.*(10.^-3.*Rao).^0.5.*10.^6/1./ VpostoptkX);Kdvdakx=2.*Rao.*10.^3.*60.*Maho/1./ (Imbd.*ROskW .*VpostoptkX.*Rarado);HraXo=KawjX/ 1./Rao;dammx=20.*(4.*MavpoptkX/1./(Ckh.*3.14.* Roa.*1000.*va).^0.5);dvmmx=dammX.*2.*Kdvda; Cstrkwhod=Nstrhod.*Ckwhod;Ccelstrkw hod=Ncels tr.*Ckwhod;figure;plot(KawjX,Vpos toptkX,KawjX, PvpoptkX, KawjX,Mavpoptkm in X,KawjX,EmatX/1./ 1000, KawjX,HraXo,KawjX,dammX, KawjX,dvmmX, KawjX, Ckwhod) ;grid,figure;plot(KawjX,Nstrhod, KawjX,Ncelstr,KawjX,Cs trkwhod,KawjX, Ccelstrkwhod);grid, fceRasklogN=1001;Rar=Ra-log 10(Ra/1./Rao); Raradr=Rarad-log 10(Rarad/1./Rarado);

fceSIGzatN=1001;SIGraradr=10.^-3.*Raradr.*Emat/1./ (Rarado);SIGraradrx=SIGraradr.*cos(a tan(tan D));figure;plot(h,SIGraradr ,h,SIGraradrx,h,SIGrz,h,SIGrzx); grid newPraceXvykonXcenaXhodXKawj=1001; KawjX=10:5:700;EmatX=10.^6/1./KawjX.^0.5; Ckwhod=3.5;Tpopt=Hlim/1/(ho.*Vpostopt.*60.^-1), TpoptX=Hlim/1/(ho.*VpostoptkX.*60.^-1);figure;plot (KawjX,TpoptX);grid,AstrobjX=(((1-2.*Mio)/1./ (6.*EmatX).*(SIGm+SIGm).^2).^2).^0.5;AtstrX=(1+ Mio)/1./(3.*EmatX).*(SIGm .^2+SIGm.^2-SIGm.*SIGm);AcelstrX=1.5.*(AstrobjX+AtstrX); Ncelstr=Acelstr/1./Tphxopto,NstrhodX=AstrobjX/1./ TpoptX;NstrobjX=NstrhodX; CstrobjX=NstrhodX.*Ckwhod;NtstrX=AtstrX/1./ TpoptX;CtstrX=NtstrX.*Ckwhod;NcelstrX=AcelstrX/1./ TpoptX;CcelstrX=NcelstrX.*Ckwhod; Cstrhod=Nstrhod.*Ckwhod,PwREGX=1.5.*(83.982 6+108.524.*2.718^-KawjX/1113.68504)+ 104.30582.*2.718^-KawjX/11132.7153)); NstrhodXREG=25.63546.*2.718^-KawjX/1151.31997)+ 325.32423.*2.718^-KawjX/119.29095)+ 4.14871.*2.718^-KawjX/11-1.37731E84); CstrhodXREG=NstrhodXREG.*Ckwhod;figure;plot (KawjX,NstrhodXREG,Ka wjX,C strhodXREG);grid, figure;plot(KawjX,65.*Nstrobj X.^-1,KawjX,65.*Cstrobj X.^1);grid, figure;plot(KawjX,KawjX,KawjX, VpostoptkX,KawjX,PvpoptkX,KawjX,MavpoptkminX, Ka wjX,EmatX/1./1000,KawjX,HraXo, KawjX, 65.*NstrobjX.^-1,KawjX,65.*C strobjX.^-1);grid, ROskWX=(10.^6/1.(10.^12/1(10.^6/1./KawjX.^0.5).^2)/1./16).^0.27;VpostoptkX=(10.^-3.*Rao).^0.5.*10.^6/1./(10.^6/1./KawjX.^0.5).^0.5;
MavpoptkX=Imbd.*Kdvda.*ROskWX.*1 0.^-3.*Vpostopt.*60.^-1.*(KawjX/1./ho);
MavpoptkXvX=Imbd.*Kdvda.*ROskWX.*10.^-3.*VpostoptkX.*60.^-1.*(Kawj/1./ho);
newMaKawj=1001;vMavpoptkXX=MavpoptkXvX;
vMavpoptkgrminXXbREG=10.*1.3655.*0.4516.*0.7.*0.269.*ROskWX.*10.^-3.*148.758.*60^-1.*(9.6676/35.77).*1000.*60;figure;plot(KawjX,Mavpoptk,KawjX,vMavpoptkXX.*1000.*60,KawjX,vMavpoptkgrminXXbREG);grid, figure;plot(KawjX,1.5.*PvpoptkX);grid, NstrobjX=NstrhodX;
FIGkompl=1001;figure;plot(KawjX,KawjX,KawjX,VpostoptkX,KawjX,PvpoptkX,KawjX,v MavpoptkgrminXXbREG,KawjX,EmatX/1./1000,KawjX,HraXo,KawjX,65.*Nstrobj X.^1,KawjX,65.*Cstrobj X.^-1);grid,
FIGkompltopo=1001;KawjX=10:5:700;hX=8,RaX=(-10)*(1-KawjX/1./(KawjX-hX));KplX=RaX.*hX;
EretzX=EmatX.*(KplX/1./KawjX).^0.5;
RaradX=Rao.*10.^3.*(EretzX) .^0.5/1./EmatX;
YretX=KplX/1./KawjX;Rasky=10.^log 10((log 10(hX)).^2+(log 10(1/1./YretX)) .^2+RaradX.^2).^0.5;
arcDX=a tan(tan(YretX/1./hX)).*180/1./3.14;
FcePoychKawjX=1001;KawjX=10:5:700;hX=8;RaX=(-10)*(1-KawjX/1./(KawjX-8));KplX=RaX.*hX;
EretzX=EmatX.*(KplX/1./KawjX).^0.5;
RaradX=Rao.*10.^3.*(EretzX). ^0.5/1./EmatX;
YretX=KplX/1./KawjX;arcDX=a tan(tan(YretX/1./hX)).*180/1./3.14;RaskyX=10.^log 10((log 10(hX)).^2+(log 10(1/1./YretX)).^2+RaradX.^2).^0.5;figure;plot(KawjX,hX,K awjX,RaX,KawjX,RaskyX, KawjX,YretX, KawjX, arcDX);grid,
ROskWX=(10.^6/1(10.^12/1/(10.^6/1./KawjX.^0.5).^2)/1./16).^0.27;VpostoptkX=(10.^-3.*Rao).^0.5.*10.^6/1./(10.^6/1./KawjX.^0.5).^0.5;
MavpoptkX=Imbd.*Kdvda.*ROskWX.*1 0.^-3.*Vpostopt.*60.^-1.*(KawjX/1./ho);
MavpoptkXvX=Imbd.*Kdvda.*ROskWX.*10.^-3.*VpostoptkX.*60.^-1.*(Kawj/1./ho);
MaKawj=1001;vMavpoptkXX=MavpoptkXvX;vMavpoptkgrminXXbREG=10.*1.3655.*0.4516.*0.7.*0.269.*ROskWX.*10.^-3.*148.758.*60^-1.*(9.6676/35.77).*1000.*60;figure;plot(KawjX,Mavpoptk,KawjX,vMavpoptkXX.*1000.*60,KawjX,vMavpoptkgrminXXbREG);grid,

The invention claimed is:

1. A method of abrasive waterjet cutting of a material, comprising:
   providing a computer;
   programming the computer with an algorithm, the algorithm being an alogorithm from which parameters of abrasive waterjet cutting may be calculated;
   determining parameters of the abrasive waterjet cutting of the material by the computer programmed with the algorithm, wherein a constant of cuttability of the material using an abrasive waterjet Kawj [µm] is determined from a longitudinal ultrasonic wave speed $V_{LUZ}$ [m/s] through the material according to equation:
   $Kawj_x=(10^4/V_{LUZ})^6$, [µm] or from a Young's modulus Emat [MPa] of the material according to equation: $Kawj_x=10^{12}/Emat^2$, [µm];
   substituting an obtained value of the constant of cuttability of the material using an abrasive waterjet Kawj into the algorithm;
   providing hydroabrazive equipment adapted for abrasive waterjet cutting;
   setting the hydroabrazive equipment according to the determined parameters;
   inserting the material into the hydroabrazive equipment;
   starting the hydroabrazive equipment; and
   cutting the material with the hydroabrazive equipment.

2. A method of abrasive waterjet cutting of a material of a class of cuttable materials, comprising:
   providing a computer;
   determining Tcut, using the computer, from a constant of cuttability of materials using an abrasive waterjet Kawj or from a Young's modulus Emat [MPa] according to equation: $Tcut=\log(10^6/Kawj^{0.5})$ [-] or $Tcut=\log(Emat)$ [-],
   wherein knowledge of the class of cuttability of materials using an abrasive waterjet Tcut provides information regarding basic properties of the material for performing abrasive waterjet cutting;
   providing an abrasive waterjet;
   setting the abrasive waterjet according to the determined Tcut;
   starting the abrasive waterjet; and
   cutting the material with the abrasive waterjet.

* * * * *